(12) United States Patent
Hwang et al.

(10) Patent No.: US 9,437,827 B2
(45) Date of Patent: Sep. 6, 2016

(54) HETEROCYCLIC COMPOUND AND ORGANIC LIGHT-EMITTING DEVICE INCLUDING THE SAME

(71) Applicant: SAMSUNG DISPLAY CO., LTD., Yongin, Gyeonggi-Do (KR)

(72) Inventors: Seok-Hwan Hwang, Yongin (KR); Young-Kook Kim, Yongin (KR); Jun-Ha Park, Yongin (KR); Hye-Jin Jung, Yongin (KR); Jin-O Lim, Yongin (KR); Eun-Young Lee, Yongin (KR); Sang-Hyun Han, Yongin (KR); Eun-Jae Jeong, Yongin (KR); Soo-Yon Kim, Yongin (KR); Jong-Hyuk Lee, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 215 days.

(21) Appl. No.: 14/220,695

(22) Filed: Mar. 20, 2014

(65) Prior Publication Data

US 2015/0001493 A1 Jan. 1, 2015

(30) Foreign Application Priority Data

Jun. 26, 2013 (KR) .................. 10-2013-0073959

(51) Int. Cl.
| | |
|---|---|
| *H01L 51/00* | (2006.01) |
| *H01L 51/50* | (2006.01) |
| *C09K 11/06* | (2006.01) |

(52) U.S. Cl.
CPC ........... *H01L 51/0072* (2013.01); *C09K 11/06* (2013.01); *H01L 51/50* (2013.01); *C09K 2211/1466* (2013.01); *H01L 51/506* (2013.01); *H01L 51/5016* (2013.01); *H01L 51/5072* (2013.01)

(58) Field of Classification Search
None
See application file for complete search history.

(56) References Cited

U.S. PATENT DOCUMENTS

| | | | |
|---|---|---|---|
| 7,429,372 B2 | 9/2008 | Pez et al. | |
| 2013/0056720 A1 | 3/2013 | Kim et al. | |

FOREIGN PATENT DOCUMENTS

| | | |
|---|---|---|
| JP | 4794919 B2 | 8/2011 |
| KR | 10-2011-0122051 A | 11/2011 |

OTHER PUBLICATIONS

Machine English translation of JP 2006-325046 A. Dec. 15, 2015.*

(Continued)

*Primary Examiner* — J. L. Yang
(74) *Attorney, Agent, or Firm* — Lee & Morse, P.C.

(57) ABSTRACT

A heterocyclic compound represented by Formula 1 below and an organic light-emitting device including the same, <Formula 1>

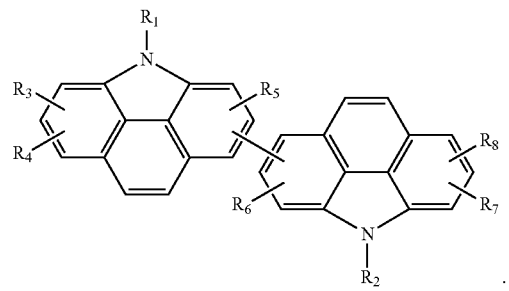

20 Claims, 1 Drawing Sheet

(56) References Cited

OTHER PUBLICATIONS

M.A. Baldo, et al.; "Highly efficient phosphorescent emission from organic electroluminescent devices"; Nature, vol. 395, Sep. 10, 1998, pp. 151-154.

M.A. Baldo, et al.; "Very high-efficiency green organic light-emitting devices based on electrophosphorescence"; Appl. Phys. Letters, vol. 75, No. 1, Jul. 5, 1999; pp. 4-6.

Chihaya Adachi, et al.; "High-efficiency organic electro-phosphorescent devices with tris (2-phenylpyridine) iridium doped into electron-transporting materials"; Appl. Phys. Letters, vol. 77, No. 6, Aug. 7, 2000, pp. 904-906.

Raymond C. Kwong, et al. "High operational stability of electrophosphorescent devices"; Appl. Phys. Letters, vol. 81, No. 1, Jul. 1, 2002, pp. 162-164.

"A novel conjugated polymer based on 4H-benzo[def]carbazole backbone for OLED" Fall Assembly and Symposium, vol. 34, No. 2, 2009.

www.sigmaaldrich.com/catalog/product/aldrich/ph007423?lang=ko&region=KRSIGMA-ALDRICH webpage; Jul. 23, 2013.

\* cited by examiner

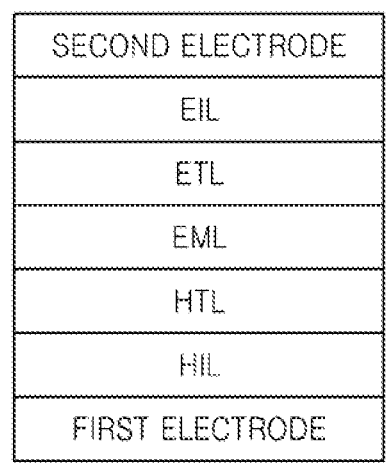

HETEROCYCLIC COMPOUND AND ORGANIC LIGHT-EMITTING DEVICE INCLUDING THE SAME

CROSS-REFERENCE TO RELATED APPLICATION

Korean Patent Application No. 10-2013-0073959, filed on Jun. 26, 2013, in the Korean Intellectual Property Office, and entitled: "Heterocyclic Compound and Organic Light-Emitting Device Including The Same," is incorporated by reference herein in its entirety.

BACKGROUND

1. Field

Embodiments relate to a heterocyclic compound and an organic light-emitting device including the same.

2. Description of the Related Art

Organic light-emitting devices (OLEDs), which are self-emitting devices, have advantages such as wide viewing angles, excellent contrast, quick response, high brightness, excellent driving voltage characteristics, and can provide multicolored images.

SUMMARY

Embodiments are directed to a heterocyclic compound and an organic light-emitting device including the same.

The embodiments may be realized by providing a heterocyclic compound represented by Formula 1, below:

<Formula 1>

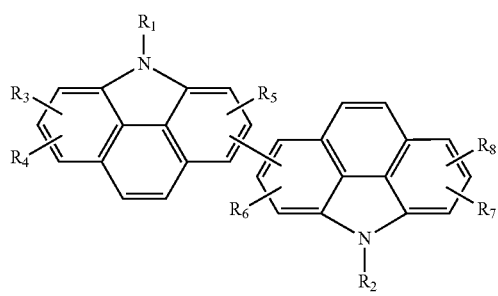

wherein, in Formula 1, $R_1$ to $R_8$ are each independently a hydrogen atom, a deuterium atom, a substituted or unsubstituted C1-C60 alkyl group, a substituted or unsubstituted C3-C60 cycloalkyl group, a substituted or unsubstituted C2-C60 heteroaryl group, a substituted or unsubstituted C6-C60 aryl group, or a substituted or unsubstituted C6-C60 condensed polycyclic group.

$R_1$ and $R_2$ in Formula 1 may each independently be a substituted or unsubstituted C1-C20 alkyl group, or a group represented by one of Formulae 2a to 2e, below:

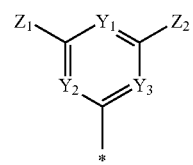 2a

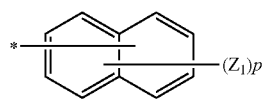 2b

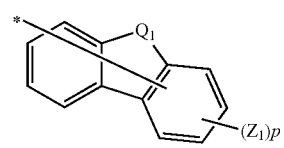 2c

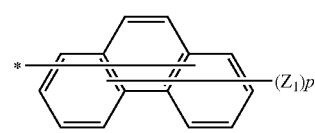 2d

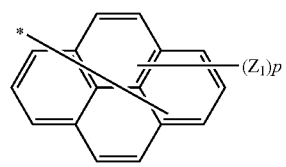 2e wherein, in Formulae 2a to 2e, $Y_1$, $Y_2$, and $Y_3$ may each independently be CH or N; $Q_1$ may be a linker represented by $-CR_{50}R_{51}-$ or $-NR_{52}-$; $Z_1$, $Z_2$, $R_{50}$, $R_{51}$, and $R_{52}$ may each independently be a hydrogen atom, a deuterium atom, a substituted or unsubstituted C1-C20 alkyl group, a substituted or unsubstituted C6-C20 aryl group, a substituted or unsubstituted C3-C20 heteroaryl group, a substituted or unsubstituted C6-C20 condensed polycyclic group, an amino group substituted with a C6-C20 aryl group or a C3-C20 heteroaryl group, a halogen group, a cyano group, a nitro group, a hydroxy group, or a carboxyl group; p may be an integer from 1 to 9; and * indicates a binding site.

$R_3$, $R_4$, $R_7$, and $R_8$ in Formula 1 may each independently be a hydrogen atom, a deuterium atom, or

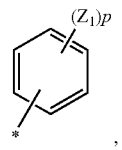

wherein $Z_1$ may be a hydrogen atom, a deuterium atom, a substituted or unsubstituted C1-C20 alkyl group, a substituted or unsubstituted C6-C20 aryl group, a substituted or unsubstituted C3-C20 heteroaryl group, a substituted or unsubstituted C6-C20 condensed polycyclic group, an amino group substituted with a C6-C20 aryl group or a C3-C20 heteroaryl group, a halogen group, a cyano group, a nitro group, a hydroxy group, or a carboxyl group; p may be an integer from 1 to 5; and * indicates a binding site.

$R_5$ and $R_6$ in Formula 1 may each independently be a hydrogen atom or a deuterium atom.

1$R_3$, $R_4$, $R_5$, $R_6$, $R_7$, and $R_8$ in Formula 1 may each independently be a hydrogen atom or a deuterium atom.

The heterocyclic compound represented by Formula 1 may be one of the following compounds:

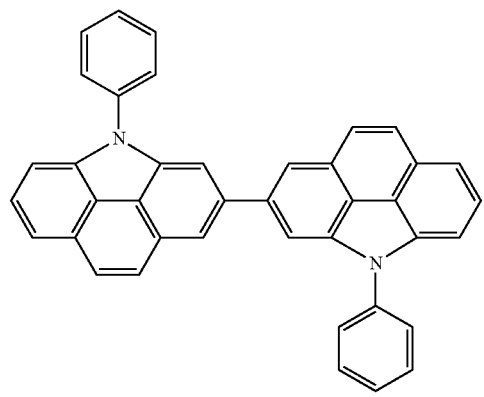

4

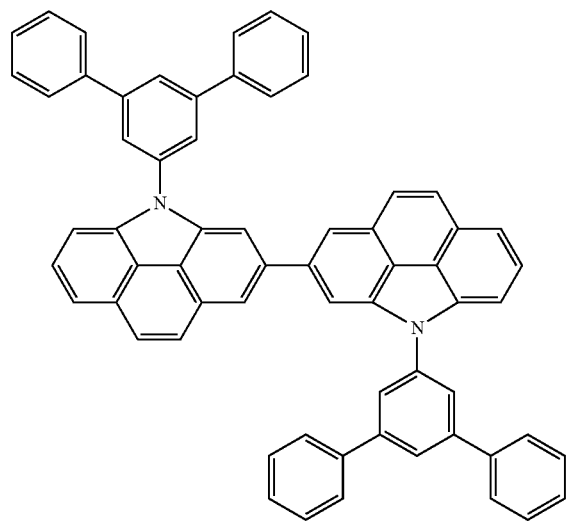

12

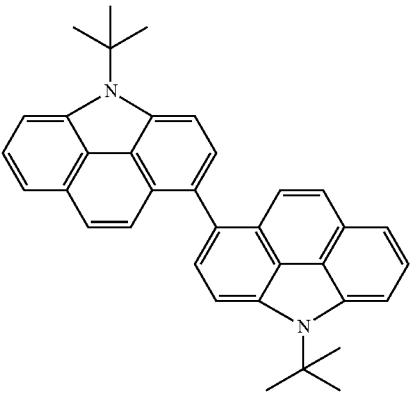

18

-continued

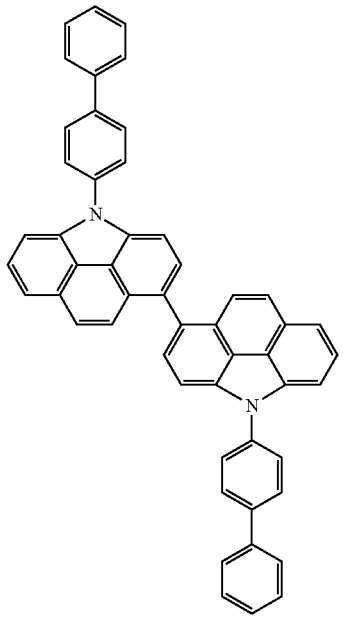

24

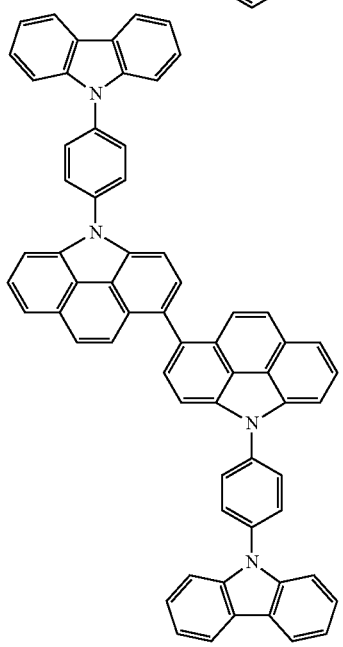

30

-continued

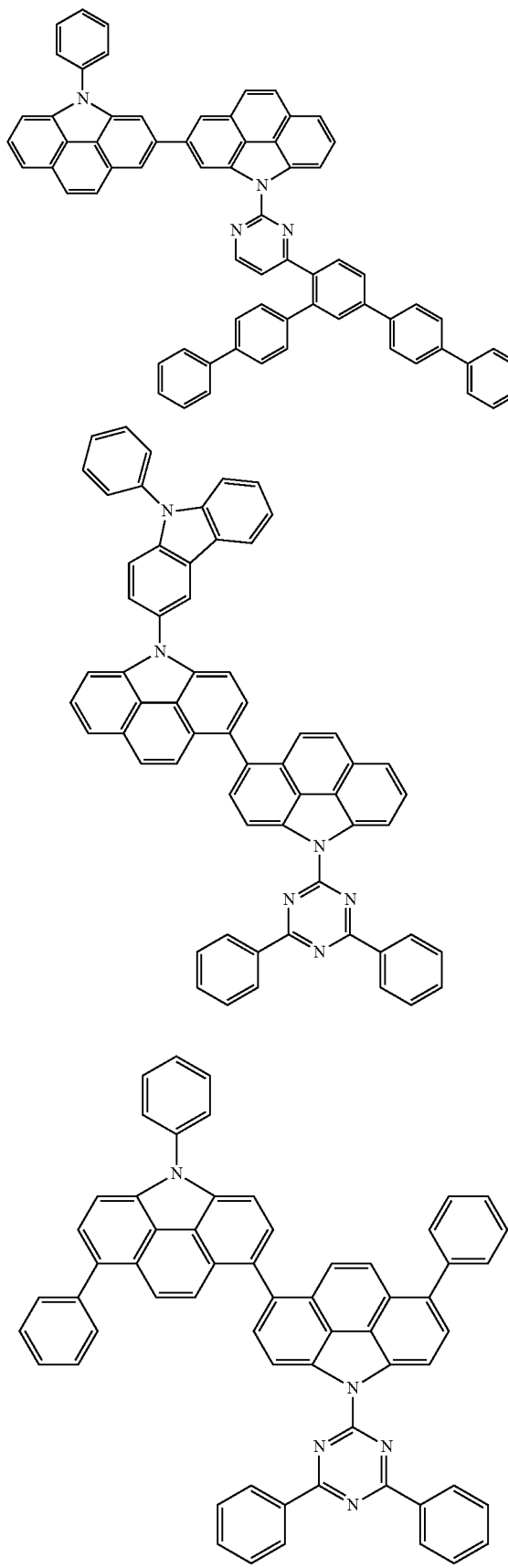

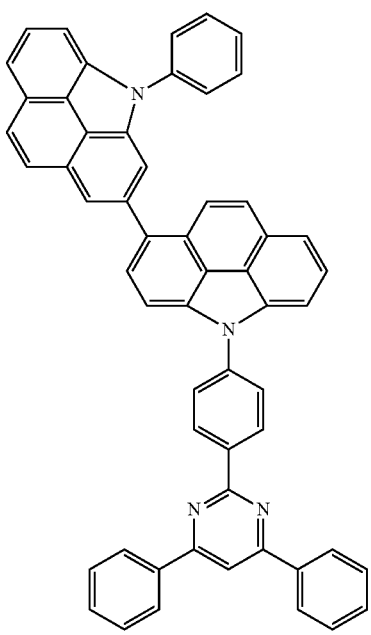

The embodiments may also be realized by providing an organic light-emitting device including a first electrode; a second electrode; and an organic layer between the first electrode and the second electrode, wherein the organic layer includes the heterocyclic compound according to an embodiment.

The organic layer may be an emission layer or an electron transport layer.

The organic layer may include an emission layer, and may further include at least one of an electron injection layer, an electron transport layer, a functional layer having both electron injection and transport capabilities, a hole injection layer, a hole transport layer, or a functional layer having both hole injection and transport capabilities, and the emission layer may include an anthracene-based compound, an arylamine-based compound, or a styryl-based compound.

The organic layer may include an emission layer, and may further include at least one of an electron injection layer, an electron transport layer, a functional layer having both electron injection and transport capabilities, a hole injection layer, a hole transport layer, or a functional layer having both hole injection and transport capabilities, and the emission layer may include red, green, blue, and white emission layers, one of which includes a phosphorescent compound.

The organic layer may include at least one of the hole injection layer, the hole transport layer, and the functional layer having both hole injection and hole transport capabilities, and the at least one of the hole injection layer, the hole transport layer, and the functional layer having both hole injection and hole transport capabilities may include a charge-generating material.

The charge-generating material may be a p-type dopant.
The p-type dopant may be a quinone derivative.
The p-type dopant may be a metal oxide.
The p-type dopant may be a cyano group-containing compound.

The organic layer may include an electron transport layer, the electron transport layer further including a metal-containing material.

The metal-containing material may be a Li complex.

The metal-containing material may include one of lithium quinolate (LiQ) or Compound 203 below:

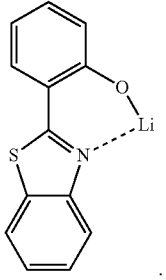

Compound 203

The organic layer may be formed of the heterocyclic compound by a wet process.

The embodiments may also be realized by providing a flat panel display device comprising the organic light-emitting device according to an embodiment, wherein the first electrode of the organic light-emitting device is electrically connected to a source electrode or a drain electrode of a thin-film transistor.

BRIEF DESCRIPTION OF THE DRAWING

Features will be apparent to those of skill in the art by describing in detail exemplary embodiments with reference to the attached drawing in which:

FIG. 1 illustrates a schematic view of a structure of an organic light-emitting device according to an embodiment.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing FIGURE, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the term "and/or" includes any and all combinations of one or more of the associated listed items. Expressions such as "at least one of," when preceding a list of elements, modify the entire list of elements and do not modify the individual elements of the list.

An embodiment provides a heterocyclic compound represented by Formula 1, below:

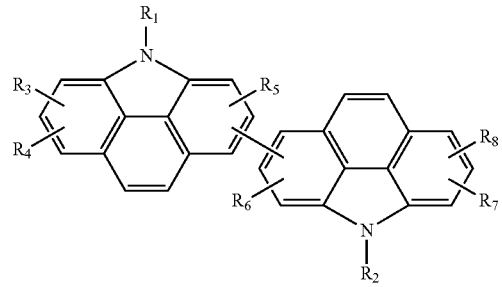

<Formula 1>

In Formula 1, $R_1$ to $R_8$ may each independently be a hydrogen atom, a deuterium atom, a substituted or unsubstituted C1-C60 alkyl group, a substituted or unsubstituted C3-C60 cycloalkyl group, a substituted or unsubstituted C2-C60 heteroaryl group, a substituted or unsubstituted C6-C60 aryl group, or a substituted or unsubstituted C6-C60 condensed polycyclic group.

In an implementation, the heterocyclic compound of Formula 1 above may serve as a light-emitting material or an electron transporting material for organic light-emitting devices. The heterocyclic compound of Formula 1 may have a high glass transition temperature (Tg) or melting point due to introduction of the heterocyclic group. Thus, the heterocyclic compound may have high heat resistance against Joule heat generated in an organic layer, between organic layers, or between an organic layer and a metal electrode when light emission occurs, and may have high durability in high-temperature environments. An organic light-emitting device manufactured using the heterocyclic compound of Formula 1 may have high durability when stored or operated.

Substituents of the compound of Formula 1 will be described in greater detail below.

In an implementation, $R_1$ and $R_2$ in Formula 1 above may each independently be a substituted or unsubstituted C1-C20 alkyl group, or a group represented by one of Formulae 2a to 2e, below.

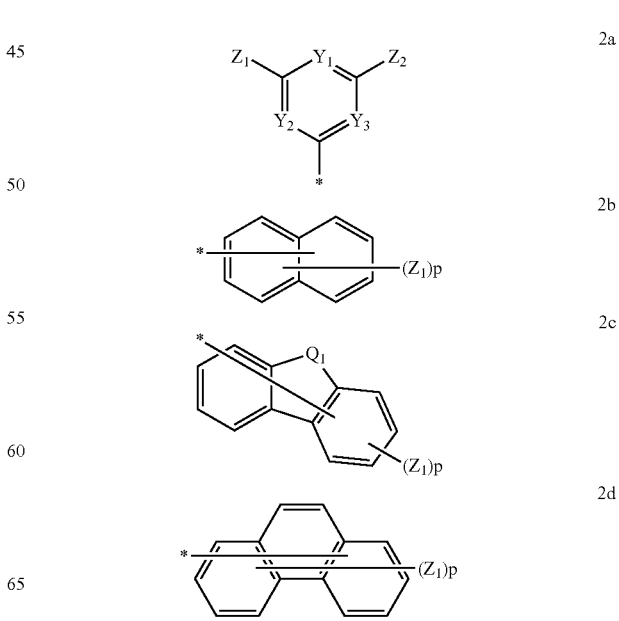

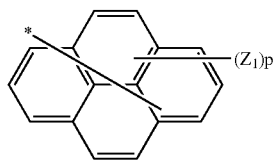

In Formulae 2a to 2e above, $Y_1$, $Y_2$, and $Y_3$ may each independently be CH or N;

$Q_1$ may be a linker represented by —$CR_{50}R_{51}$— or —$NR_{52}$—;

$Z_1$, $Z_2$, $R_{50}$, $R_{51}$, and $R_{52}$ may each independently be a hydrogen atom, a deuterium atom, a substituted or unsubstituted C1-C20 alkyl group, a substituted or unsubstituted C6-C20 aryl group, a substituted or unsubstituted C3-C20 heteroaryl group, a substituted or unsubstituted C6-C20 condensed polycyclic group, an amino group substituted with a C6-C20 aryl group or a C3-C20 heteroaryl group, a halogen group, a cyano group, a nitro group, a hydroxy group, or a carboxyl group;

p may be an integer from 1 to 9; and * indicates a binding site.

In an implementation, $R_3$ and $R_4$ in Formula 1 above may each independently be a hydrogen atom, a deuterium atom, or

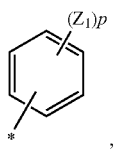

in which $Z_1$ may be the same as defined above, p may be an integer from 1 to 5, and * indicates a binding site.

In an implementation, $R_5$ and $R_6$ in Formula 1 may each independently be a hydrogen atom or a deuterium atom.

In an implementation, $R_3$, $R_4$, $R_5$, and $R_6$ in Formula 1 may each independently be a hydrogen atom or a deuterium atom.

Hereinafter, substituents described with reference to the formulae will now be described in detail. In this regard, the numbers of carbons in substituents are presented only for illustrative purposes and do not limit the characteristics of the substituents.

The unsubstituted C1-C60 alkyl group used herein may be linear or branched. Examples of the alkyl group may include a methyl group, an ethyl group, a propyl group, an isobutyl group, a sec-butyl group, a pentyl group, an iso-amyl group, a hexyl group, a heptyl group, an octyl group, a nonanyl group, and a dodecyl group. In an implementation, at least one hydrogen atom of the alkyl group may be substituted with a deuterium atom, a halogen atom, a hydroxyl group, a nitro group, a cyano group, an amino group, an amidino group, a hydrazine group, a hydrazone group, a carboxyl group or a salt thereof, a sulfonic acid group or a salt thereof, a phosphoric acid group or a salt thereof, a C1-C10 alkyl group, a C1-C10 alkoxy group, a C2-C10 alkenyl group, a C2-C10 alkynyl group, a C6-C16 aryl group, an alkylsilyl group, an arylsilyl group, or a C3-C16 heteroaryl group.

The unsubstituted C2-C60 alkenyl group indicates an unsaturated alkyl groups having at least one carbon-carbon double bond in a center or at a terminal of the alkyl group. Examples of the alkenyl group may include an ethenyl group, a propenyl group, and a butenyl group. In an implementation, at least one hydrogen atom in the unsubstituted alkenyl group may be substituted with a substituent described above in conjunction with the alkyl group.

The unsubstituted C2-C60 alkynyl group indicates an alkyl group having at least one carbon-carbon triple bond in the center or at a terminal of the alkyl group. Examples of the unsubstituted C2-C20 alkynyl group may include acetylene, propyne, phenylacetylene, naphthylacetylene, isopropylacetylene, t-butylacetylene, and diphenylacetylene. In an implementation, at least one hydrogen atom in the alkynyl group may be substituted with a substituent described above in conjunction with the alkyl group.

The unsubstituted C3-C60 cycloalkyl group indicates a C3-C60 cyclic alkyl group wherein at least one hydrogen atom in the cycloalkyl group may be substituted with a substituent described above in conduction with the C1-C60 alkyl group.

The unsubstituted C1-C60 alkoxy group indicates a group having a structure of —OA wherein A is an unsubstituted C1-C60 alkyl group as described above. Examples of the unsubstituted C1-C60 alkoxy group may include a methoxy group, an ethoxy group, a propoxy group, an isopropyloxy group, a butoxy group, and a pentoxy group. In an implementation, at least one hydrogen atom of the alkoxy group may be substituted with a substituent such as those described above in conjunction with the alkyl group.

The unsubstituted C6-C60 aryl group indicates a carbocyclic aromatic system containing at least one ring. In an implementation, at least two rings may be fused to each other or linked to each other by a single bond. The term 'aryl' refers to an aromatic system, such as phenyl, naphthyl, or anthracenyl. In an implementation, at least one hydrogen atom in the aryl group may be substituted with a substituent described above in conjunction with the unsubstituted C1-C60 alkyl group.

Examples of the substituted or unsubstituted C6-C60 aryl group may include a phenyl group, a C1-C10 alkylphenyl group (for example, an ethylphenyl group), a biphenyl group, a C1-C10 alkyl biphenyl group, a C1-C10 alkoxy-biphenyl group, a o-, m-, and p-toryl group, an o-, m-, and p-cumenyl group, a mesityl group, a phenoxyphenyl group, a ($\alpha,\alpha$-dimethylbenzene)phenyl group, a (N,N'-dimethyl) aminophenyl group, a (N,N'-diphenyl)aminophenyl group, a pentalenyl group, an indenyl group, a naphthyl group, a C1-C10 alkylnaphthyl group (for example, a methylnaphthyl group), a C1-C10 alkoxynaphthyl group (for example, a methoxynaphthyl group), an anthracenyl group, an azulenyl group, an acenaphthylenyl group, a phenalenyl group, a fluorenyl group, an anthraquinolyl group, a methylanthryl group, a phenanthryl group, a triphenylene group, a pyrenyl group, a chrycenyl group, an ethyl-chrysenyl group, a picenyl group, a perylenyl group, a pentaphenyl group, a pentacenyl group, a tetraphenylenyl group, a hexaphenyl group, a hexacenyl group, a rubicenyl group, a coronelyl group, a trinaphthylenyl group, a heptaphenyl group, a heptacenyl group, a pyranthrenyl group, and an ovalenyl group.

The unsubstituted C3-C60 heteroaryl group used herein may include one, two, or three heteroatoms selected from N, O, P and S. In an implementation, at least two rings may be fused to each other or linked to each other by a single bond. Examples of the unsubstituted C4-C60 heteroaryl group may include a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazol group, an indol group, a quinolyl group, an isoquinolyl group, and a dibenzothiophene group. In an implementation, at least one hydrogen atom in the heteroaryl group may be substituted with a substituent described above in conjunction with the unsubstituted C1-C60 alkyl group.

The unsubstituted C6-C60 aryloxy group may be a group represented by —OA$_1$, wherein A$_1$ may be a C6-C60 aryl group. An example of the aryloxy group may include a phenoxy group. In an implementation, at least one hydrogen atom in the aryloxy group may be substituted with a substituent described above in conjunction with the unsubstituted C1-C60 alkyl group.

The unsubstituted C6-C60 arylthio group is a group represented by —SA$_1$, wherein A$_1$ may be a C6-C60 aryl group. Examples of the arylthio group may include a benzenethio group and a naphthylthio group. In an implementation, at least one hydrogen atom in the arylthio group may be substituted with a substituent described above in conjunction with the unsubstituted C1-C60 alkyl group.

The unsubstituted C6-C60 condensed polycyclic group used herein may refer to a substituent including at least two rings wherein at least one aromatic ring and/or at least one non-aromatic ring are fused to each other, or refers to a substituent having an unsaturated group in a ring that may not form a conjugate structure. The unsubstituted C6-C60 condensed polycyclic group may be distinct from an aryl group or a heteroaryl group in terms of being non-aromatic.

Examples of the heterocyclic compound of Formula 1 above may include Compounds 1 to 70, below.

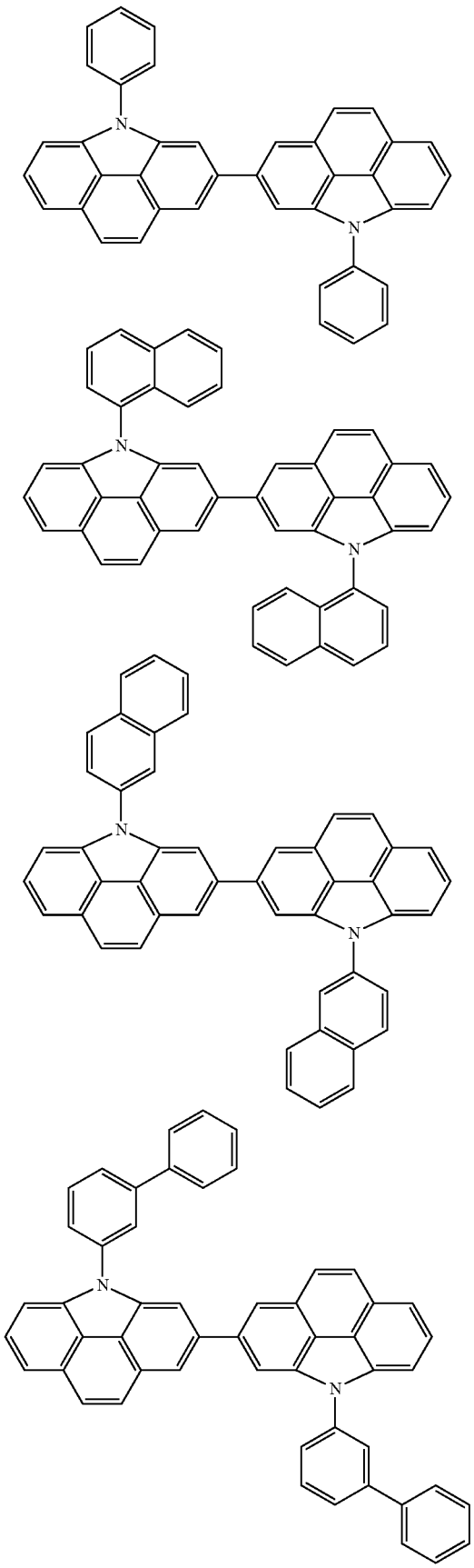

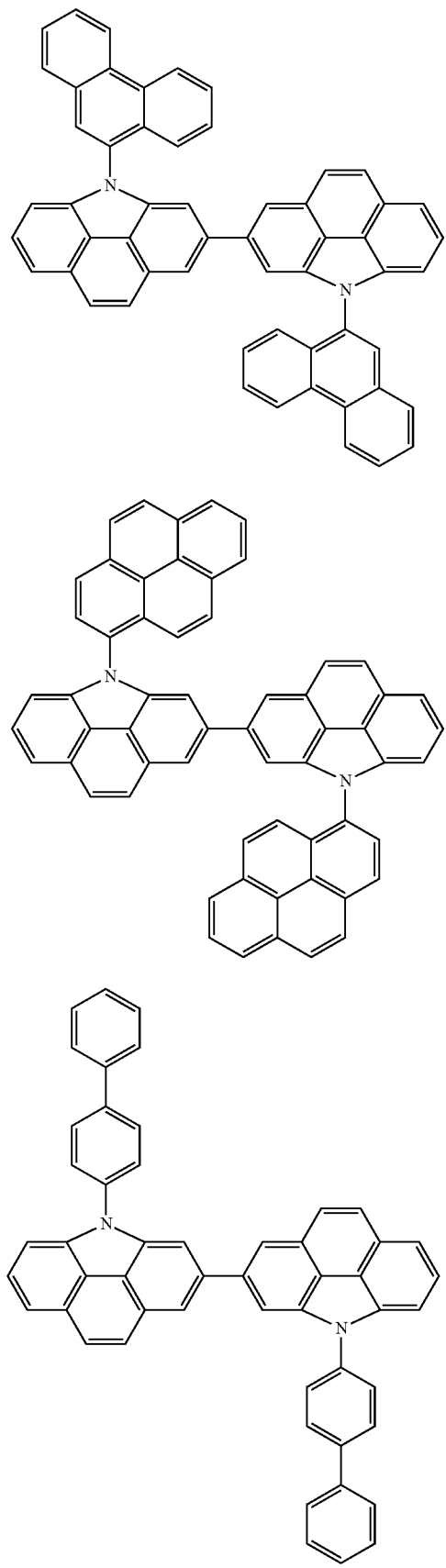
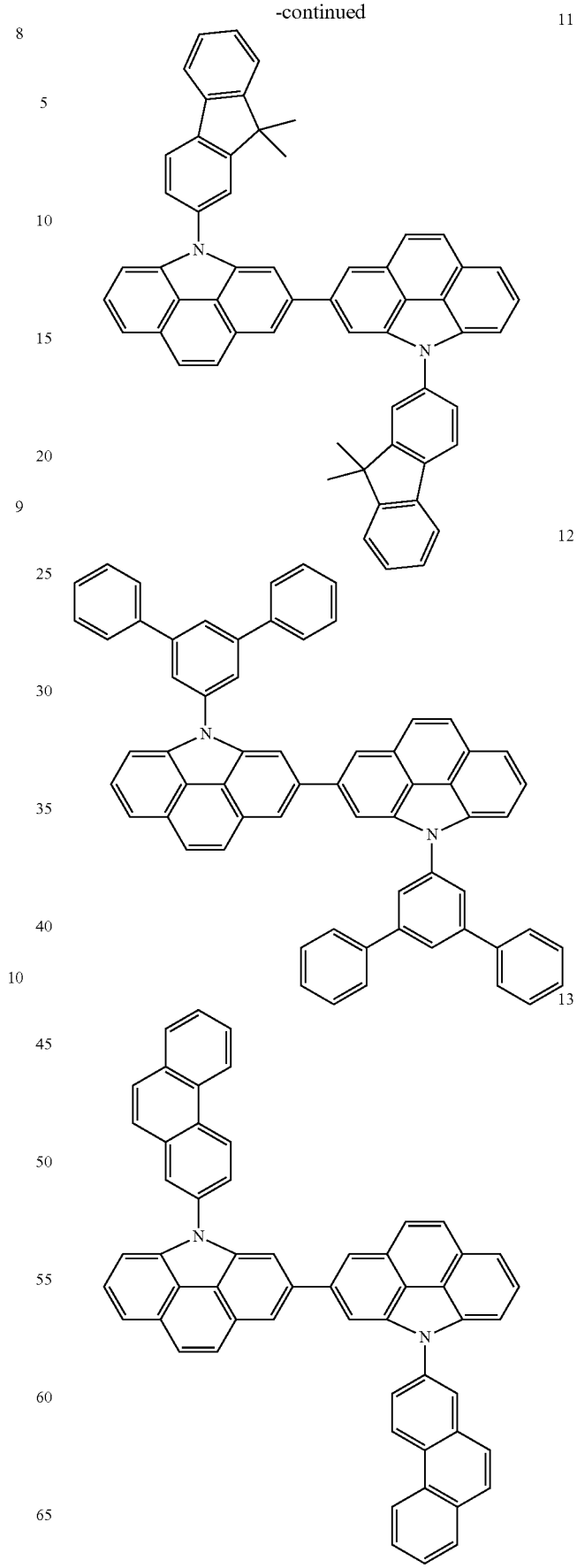

14
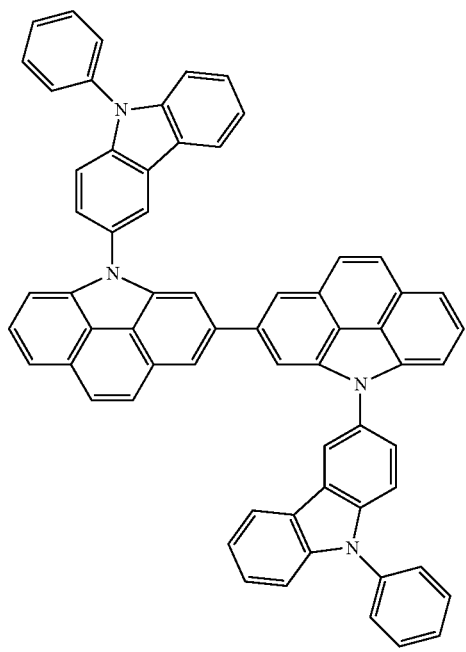
15
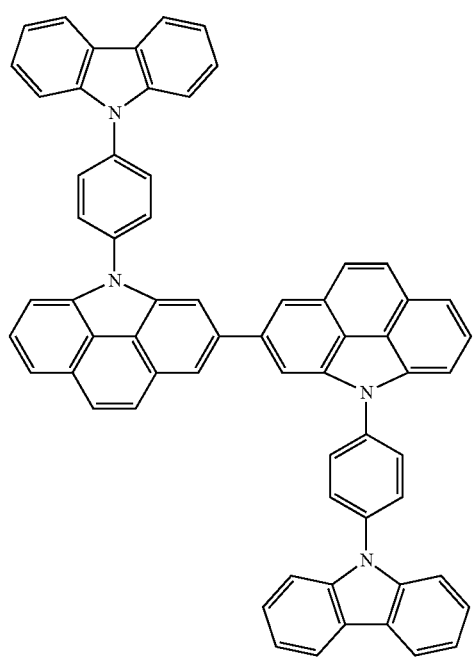
16
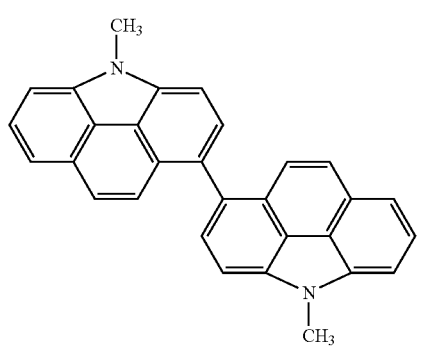
17
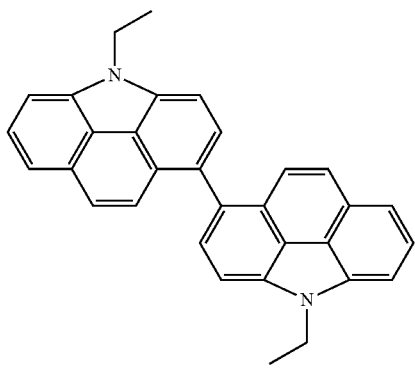
18
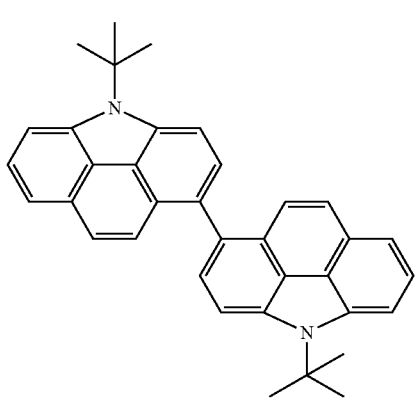
19

17
-continued
20
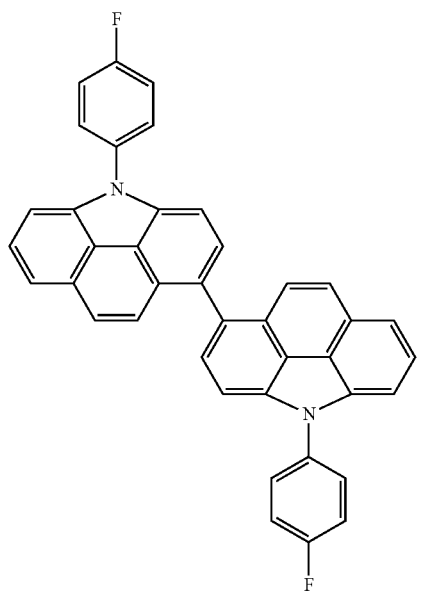
21
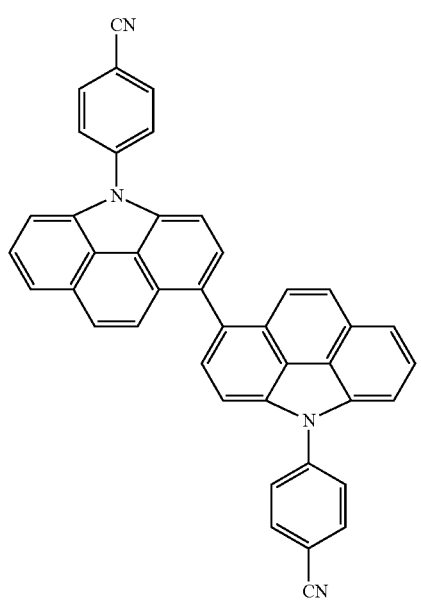
22
18
-continued
23
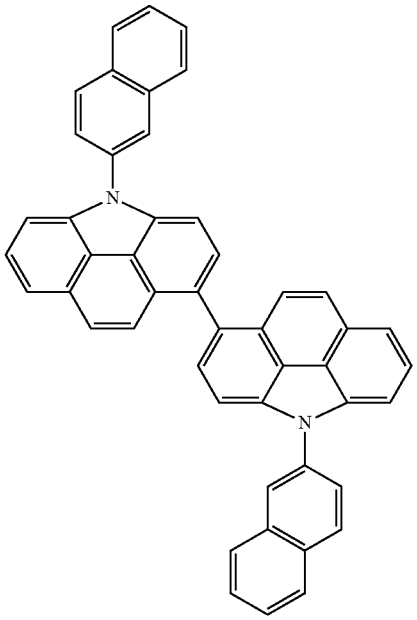
24
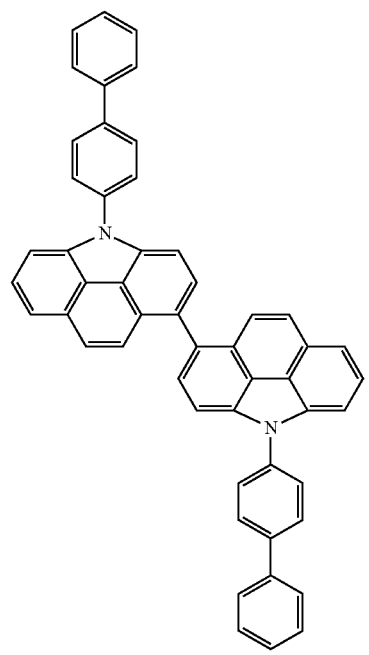

25
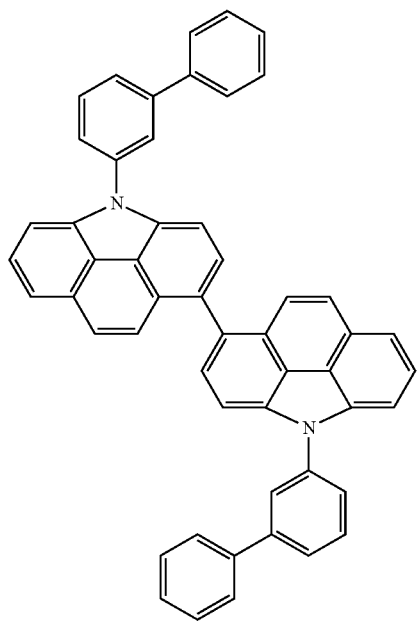
26
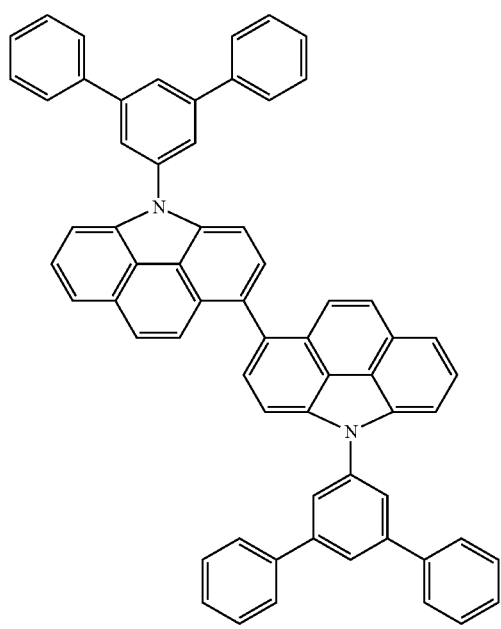
27
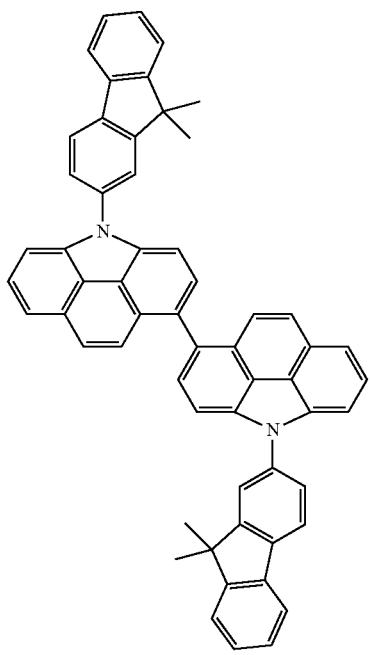
28
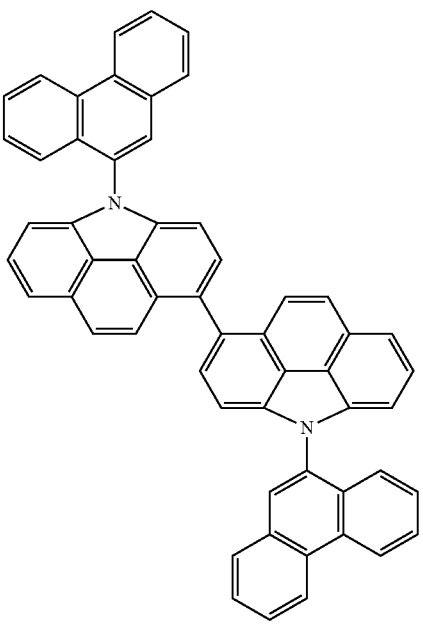

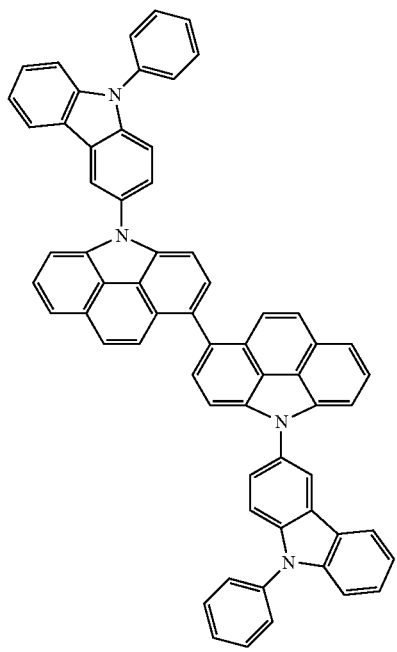
29
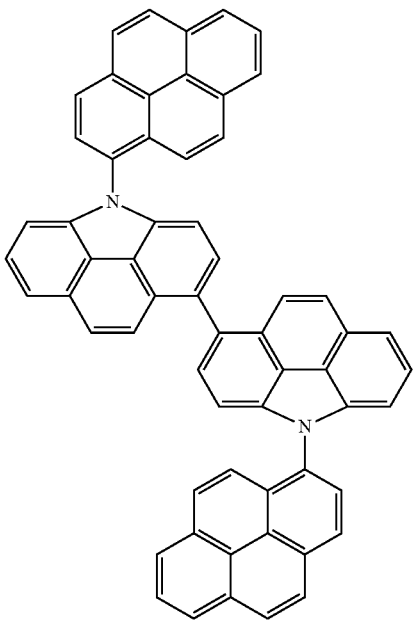
31
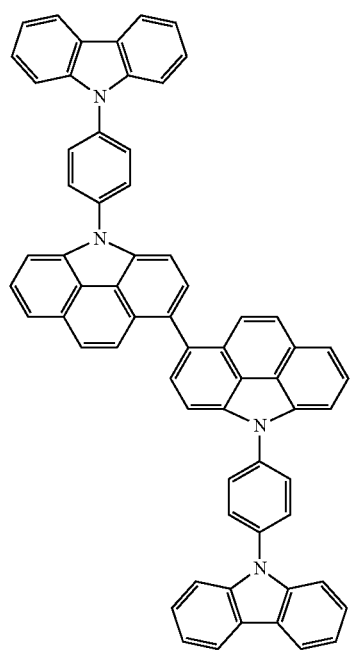
30
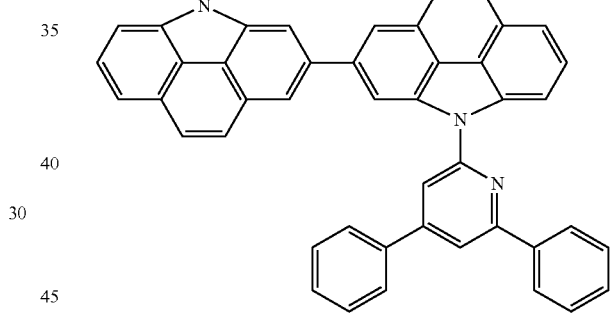
32
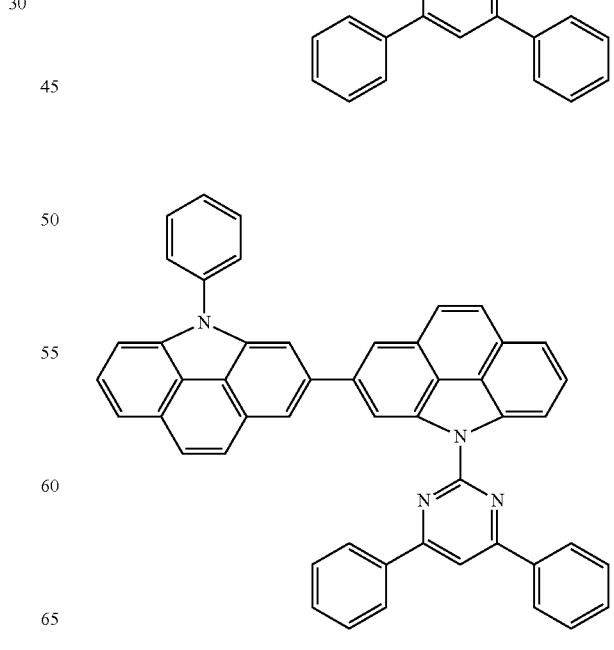
33

34
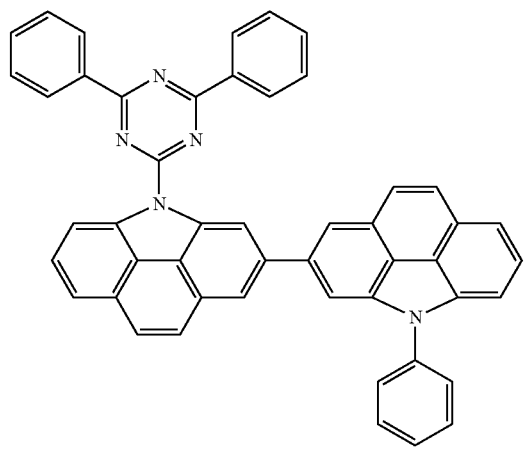
35
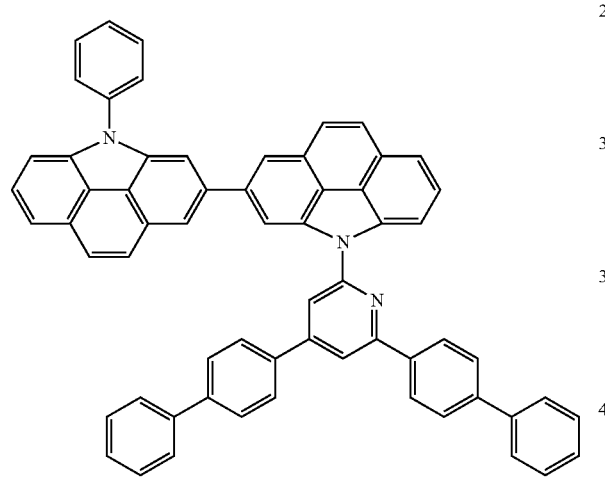
36
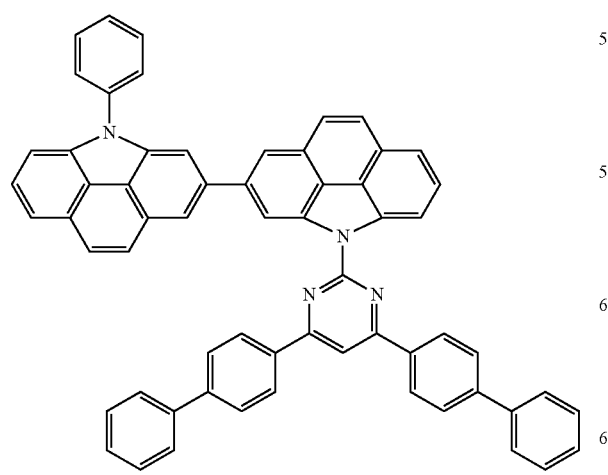
37
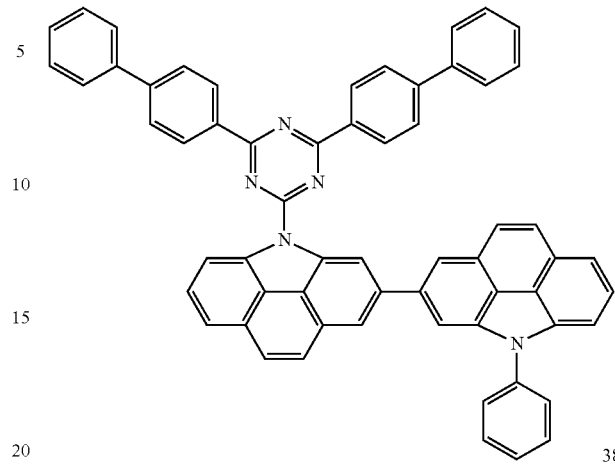
38
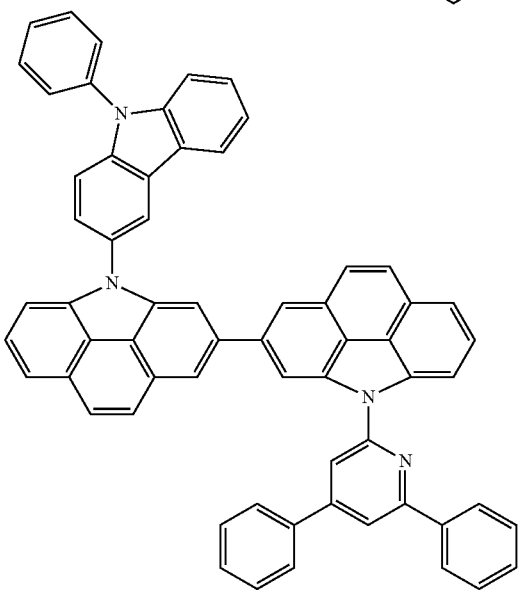
39
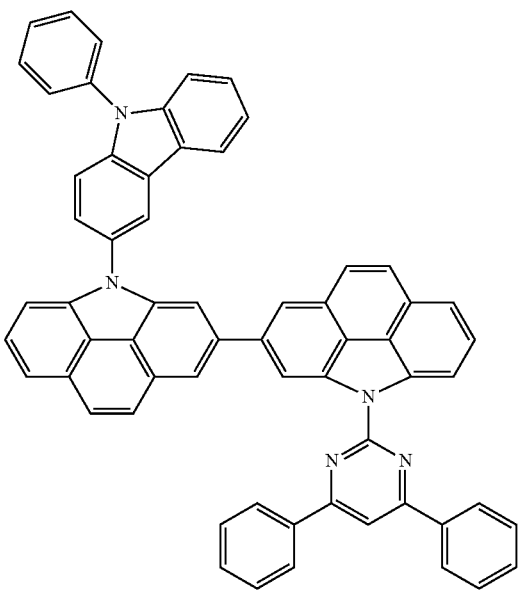

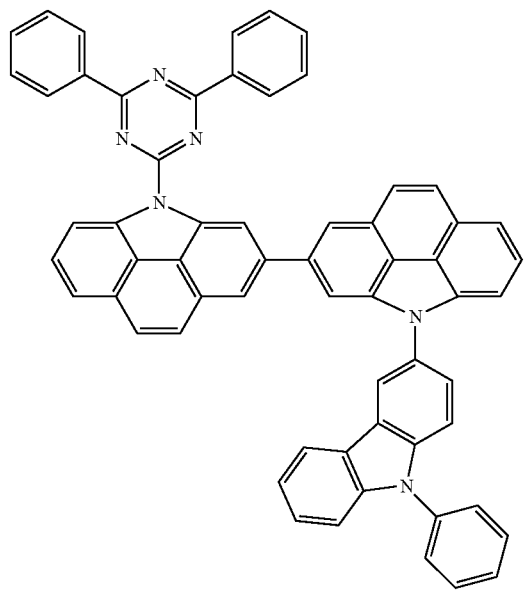
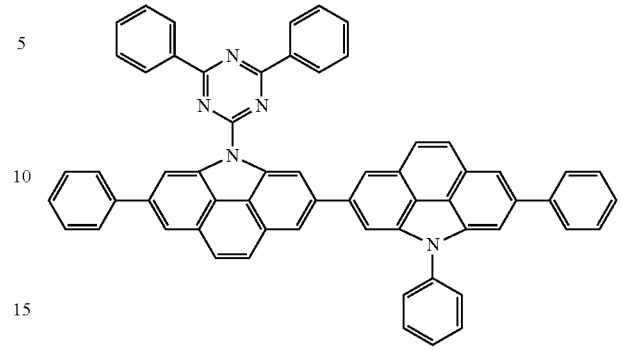
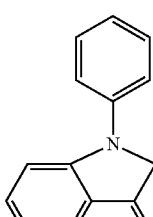
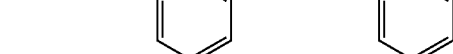
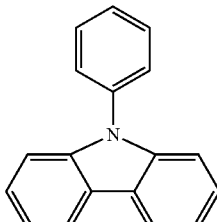
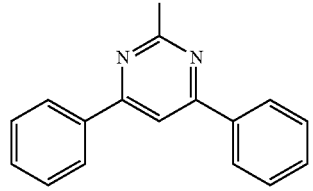

47
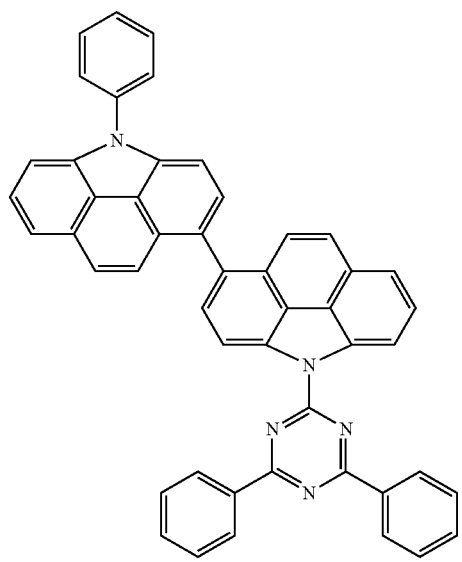
48
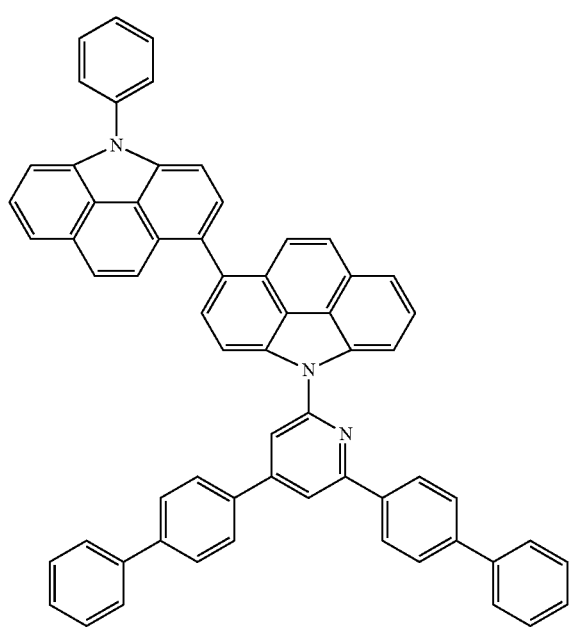
49
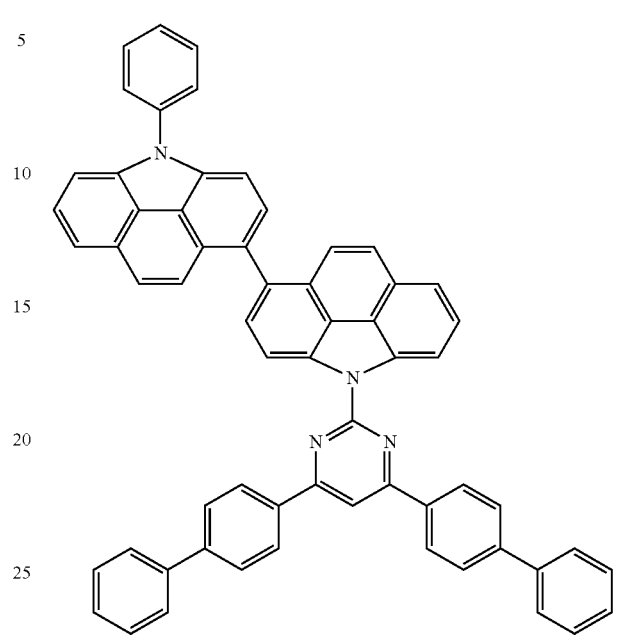
50
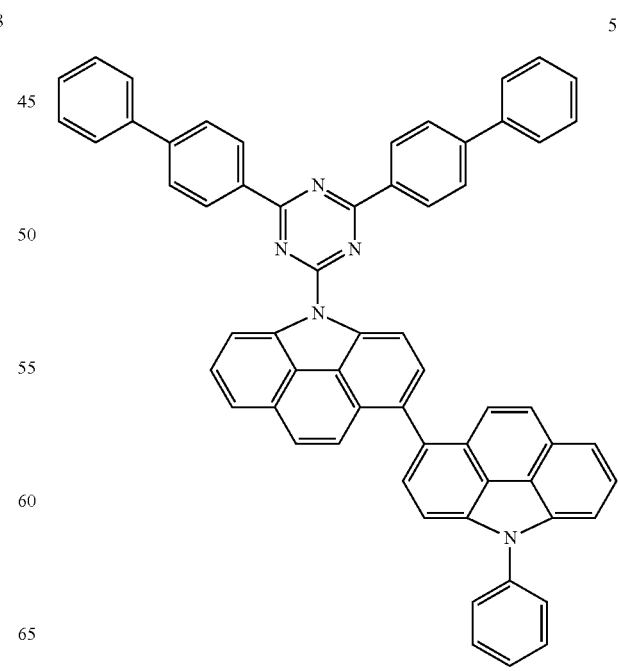

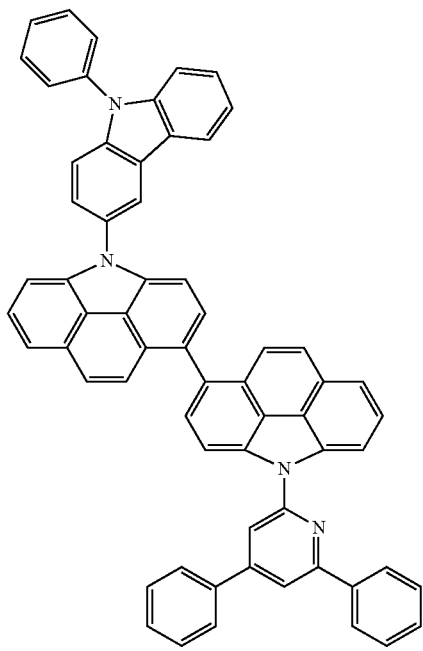
51
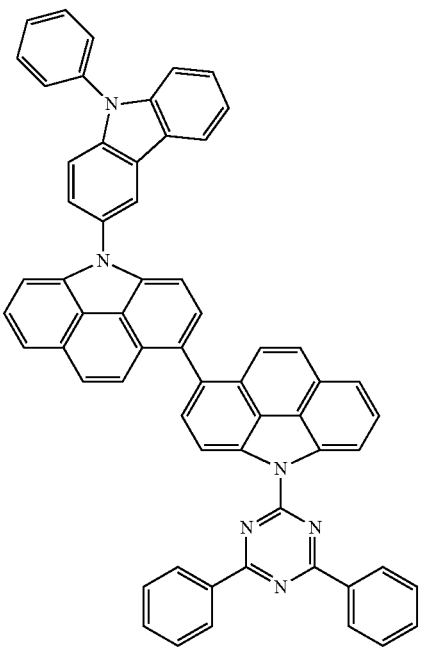
53
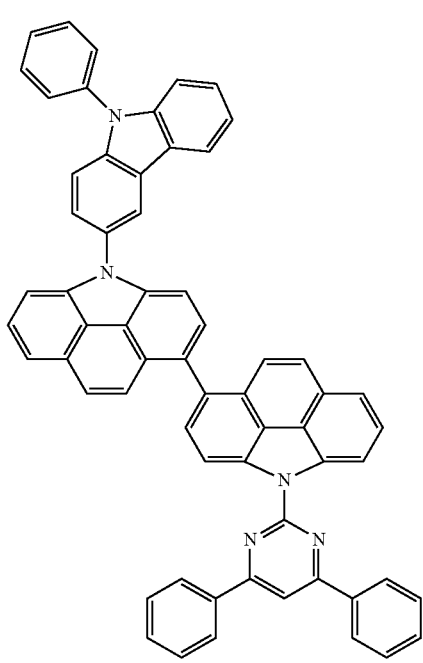
52
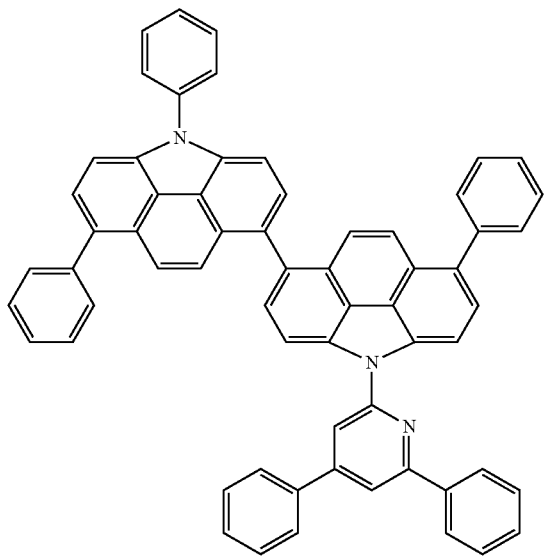
54

55
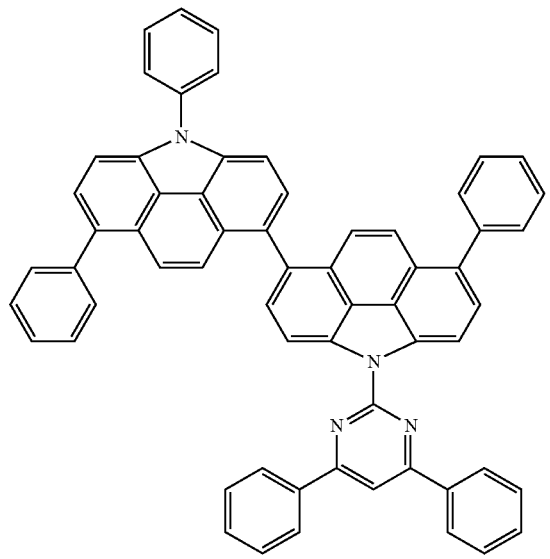
56
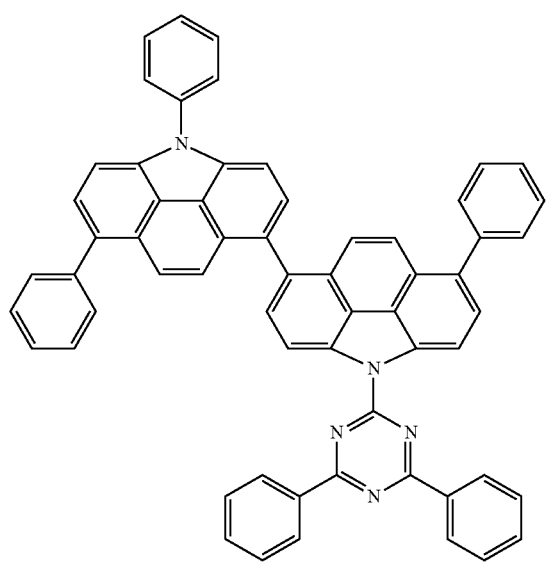
57
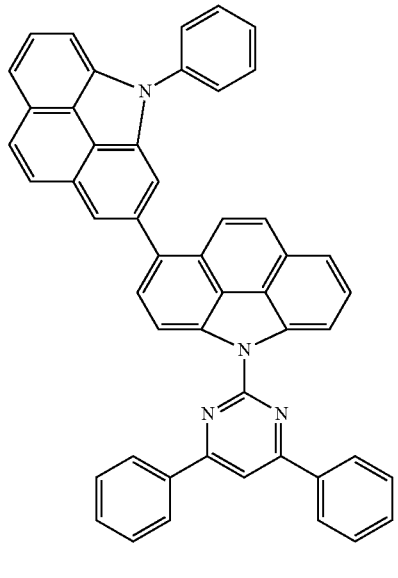
58
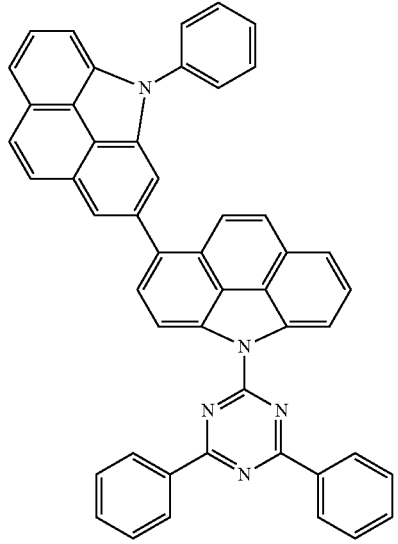
59
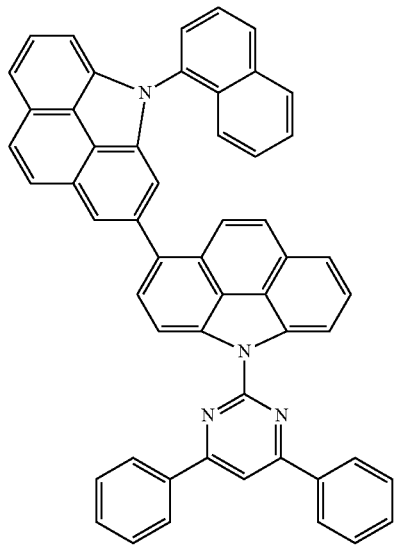

60
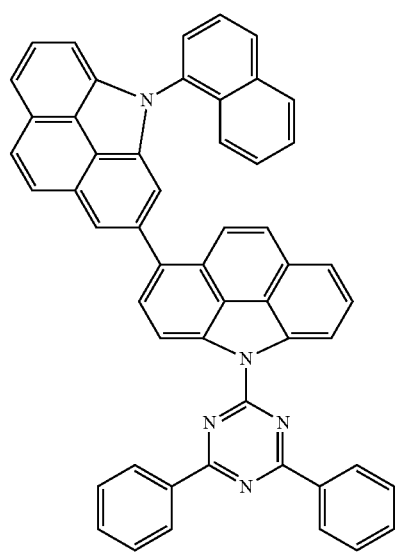
61
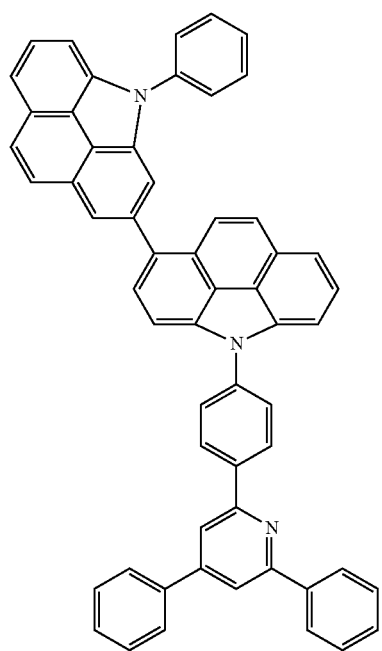
62
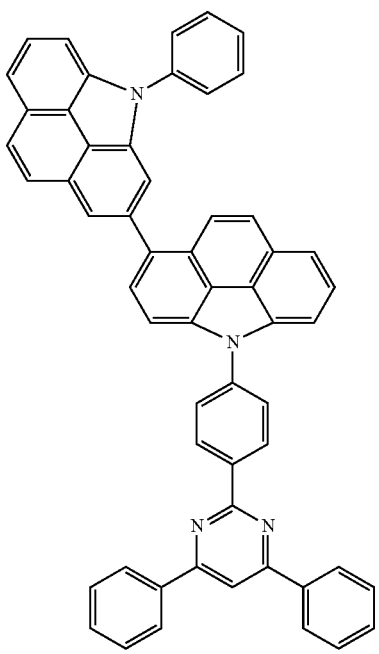
63
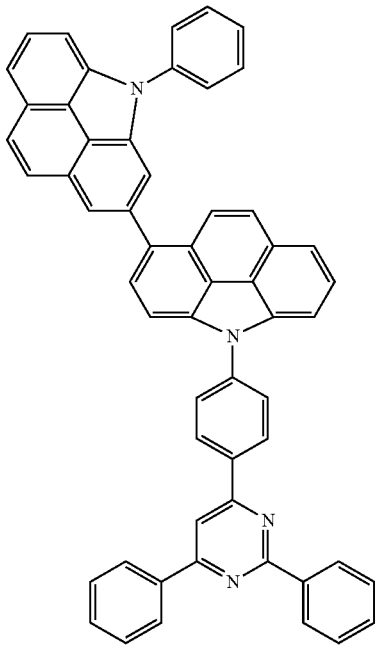

64
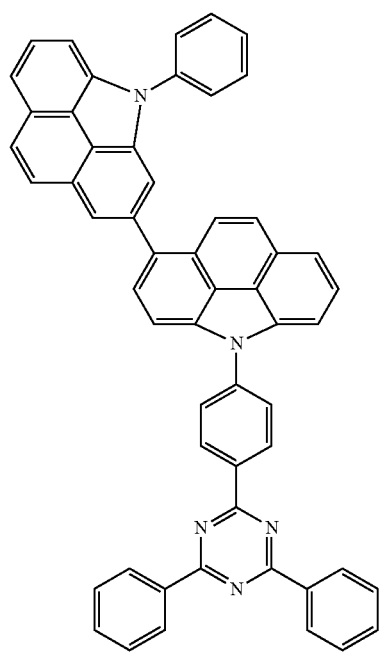
66
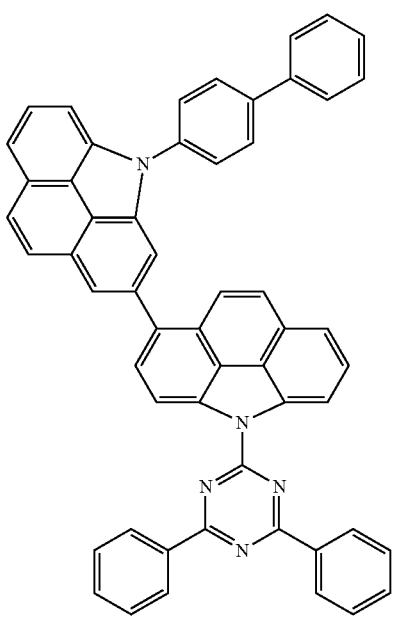
65
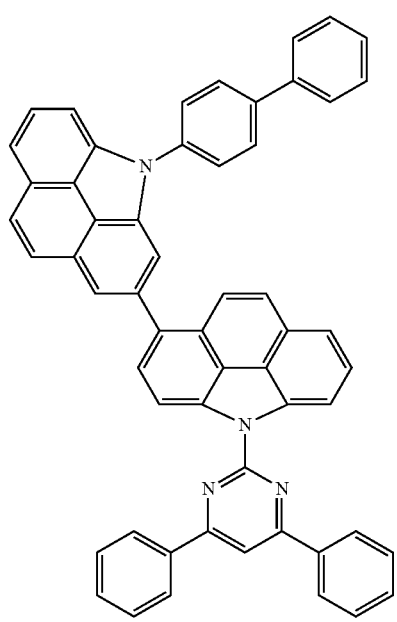
67
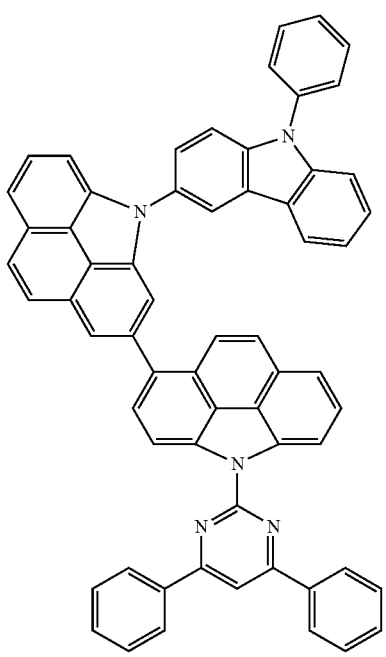

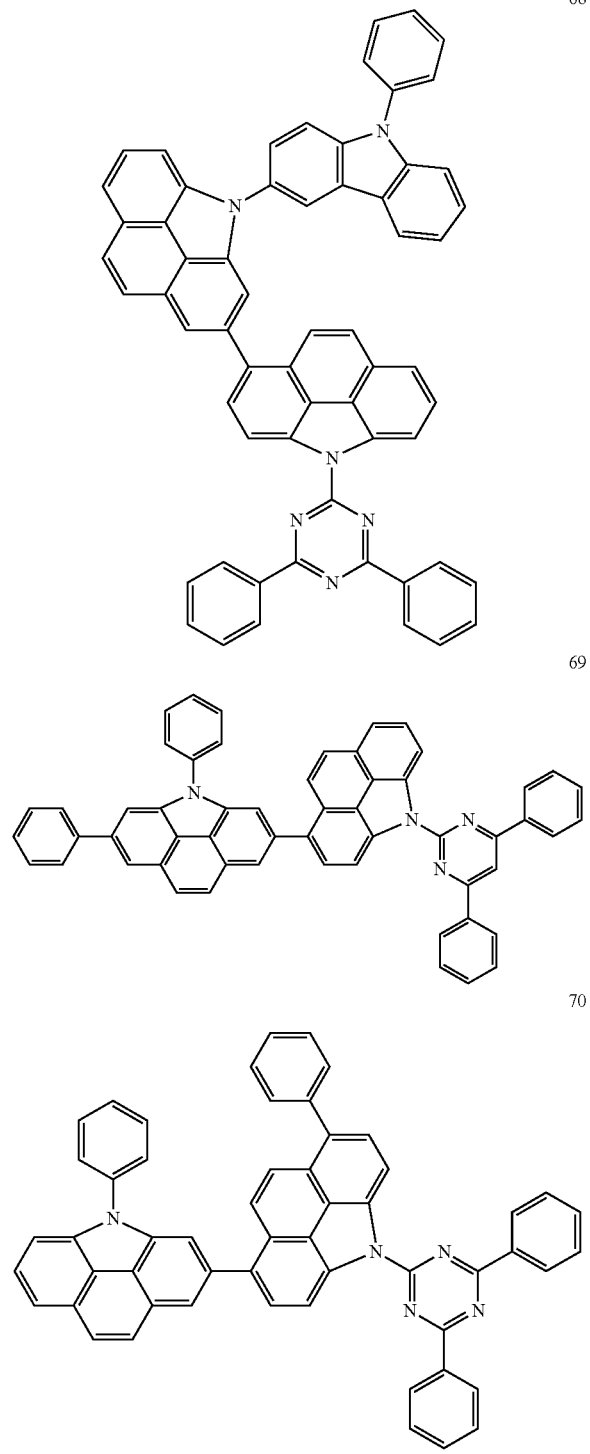

According to another embodiment, an organic light-emitting device may include a first electrode, a second electrode, and an organic layer between the first electrode and the second electrode, wherein the organic layer includes the heterocyclic compound of Formula 1, above.

The organic layer may include at least one layer selected from among a hole injection layer, a hole transport layer, a functional layer having both hole injection and hole transport capabilities (hereinafter, "H-functional layer"), a buffer layer, an electron blocking layer, an emission layer, a hole blocking layer, an electron transport layer, an electron injection layer, and a functional layer having both electron injection and electron transport capabilities (hereinafter, "E-functional layer").

For example, the organic layer may be an emission layer or an electron transporting layer.

In an implementation, the organic layer may include an electron injection layer, an electron transport layer, an emission layer, a hole injection layer, a hole transport layer, or a functional layer having both hole injection and transport capabilities. The emission layer may include, e.g., an anthracene-based compound, an arylamine-based compound or a styryl-based compound.

In an implementation, the organic layer may include an electron injection layer, an electron transport layer, an emission layer, a hole injection layer, a hole transport layer, or a functional layer having both hole injection and transport capabilities; at least one of a red emission layer, a green emission layer, a blue emission layer, and a white emission layer of the emission layer may include a phosphorescent compound; and at least one of the hole injection layer, the hole transport layer, and the functional layer having both hole injection and hole transport capabilities may include a charge-generating material.

In an implementation, the charge-generating material may be a p-type dopant, and the p-type dopant may include, e.g., a quinone derivative, a metal oxide, or a cyano group-containing compound.

In an implementation, the organic film may include an electron transport layer, and the electron transport layer may include an electron-transporting organic compound and a metal complex.

The metal complex may include a lithium (Li) complex.

The term "organic layer" as used herein may refer to a single layer and/or a plurality of layers disposed between the first and second electrodes of the organic light-emitting device.

The organic film may include an emission layer, and the emission layer may include the compound of Formula 1 described above.

The organic film may include at least one of a hole injection layer, a hole transport layer, or a functional layer having both hole injection and hole transport capabilities (hereinafter, "H-functional layer"); and at least one of the hole injection layer, the hole transport layer, or the functional layer having both hole injection and hole transport capabilities may include the compound of Formula 1.

FIG. 1 illustrates a schematic sectional view of an organic light-emitting device according to an embodiment.

Hereinafter, a structure of an organic light-emitting device according to an embodiment and a method of manufacturing the same will now be described with reference to FIG. 1.

A substrate (not shown) may be a suitable substrate for organic light emitting devices. In an implementation, the substrate may be a glass substrate or a transparent plastic substrate with strong mechanical strength, thermal stability, transparency, surface smoothness, ease of handling, and water resistance.

The first electrode may be formed by depositing or sputtering a first electrode-forming material on the substrate.

When the first electrode is an anode, a material having a high work function may be used as the first electrode-forming material to facilitate hole injection. The first electrode may be a reflective electrode or a transmission electrode. Transparent and conductive materials, e.g., ITO, IZO, $SnO_2$, and ZnO, may be used to form the first electrode. The first electrode may be formed as a reflective electrode using magnesium (Mg), aluminum (Al), aluminum-lithium (Al—Li), calcium (Ca), magnesium-indium (Mg—In), magnesium-silver (Mg—Ag), or the like.

The first electrode may have a single-layer structure or a multi-layer structure including at least two layers. For example, the first electrode may have a three-layered structure of ITO/Ag/ITO, or the like.

An organic layer(s) is disposed on the first electrode. The organic layer may include a hole injection layer (HIL), a hole transport layer (HTL), a buffer layer (not shown), an emission layer (EML), an electron transport layer (ETL), or an electron injection layer (EIL).

The HIL may be formed on the first electrode by vacuum deposition, spin coating, casting, Langmuir-Blodgett (LB) deposition, or the like.

When the HIL is formed using vacuum deposition, vacuum deposition conditions may vary depending on the compound that is used to form the HIL, and the desired structure and thermal properties of the HIL to be formed. For example, vacuum deposition may be performed at a temperature of about 100° C. to about 500° C., a pressure of about $10^{-8}$ torr to about $10^{-3}$ torr, and a deposition rate of about 0.01 to about 100 Å/sec.

When the HIL is formed using spin coating, the coating conditions may vary depending on the compound that is used to form the HIL, and the desired structure and thermal properties of the HIL to be formed. For example, the coating rate may be in the range of about 2000 rpm to about 5,000 rpm, and a temperature at which heat treatment is performed to remove a solvent after coating may be in the range of about 80° C. to about 200° C.

The HIL may be formed of a suitable material used to form a HIL. Examples of the material to form the HIL may include N,N'-diphenyl-N,N'-bis-[4-(phenyl-m-tolyl-amino)-phenyl]-biphenyl-4,4'-diamine, (DNTPD), a phthalocyanine compound such as copper phthalocyanine, 4,4',4"-tris(3-methylphenylphenylamino)triphenylamine (m-MTDATA), N,N'-di(1-naphthyl)-N,N'-diphenylbenzidine (NPB), TDATA, 2T-NATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), and polyaniline)/poly(4-styrenesulfonate (PANI/PSS).

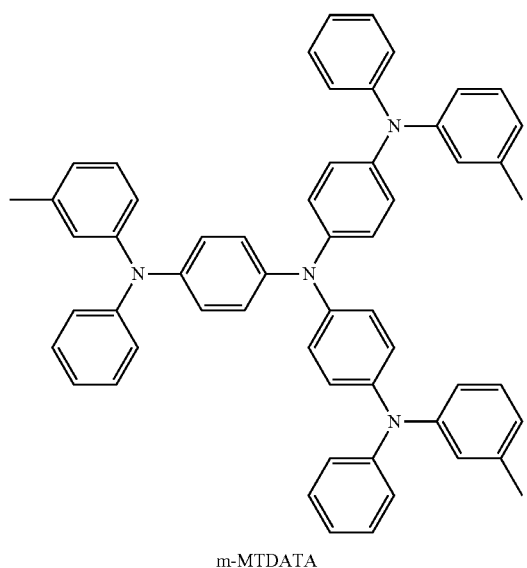

m-MTDATA

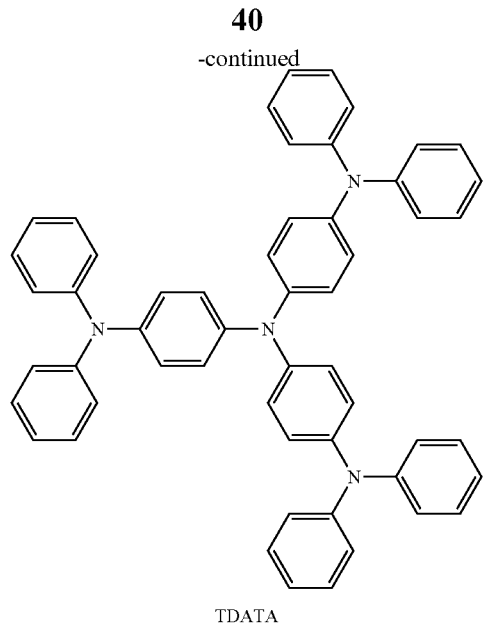

TDATA

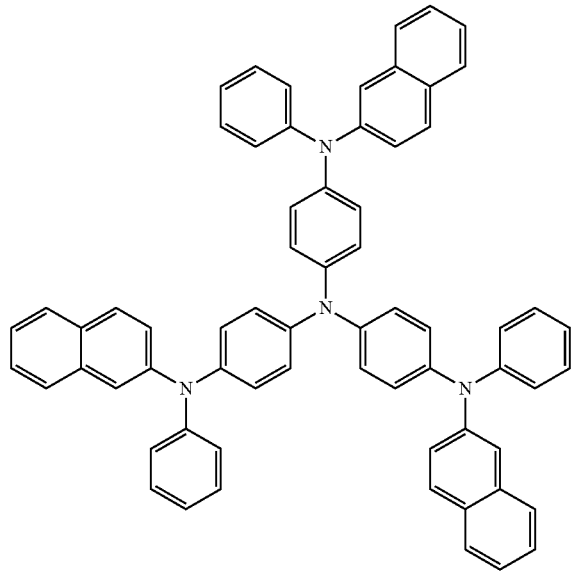

2-TNATA

The thickness of the HIL may be about 100 Å to about 10,000 Å, e.g., about 100 Å to about 1,000 Å. When the thickness of the HIL is within these ranges, the HIL may have good hole injecting ability without a substantial increase in driving voltage.

Then, a HTL may be formed on the HIL by using vacuum deposition, spin coating, casting, Langmuir-Blodgett (LB) deposition, or the like. When the HTL is formed using vacuum deposition or spin coating, the conditions for deposition and coating may be similar to those for the formation of the HIL, though the conditions for the deposition and coating may vary depending on the material that is used to form the HTL.

The HTL may be formed of suitable hole-transporting materials. Examples of the HTL forming materials may include carbazole derivatives, such as N-phenylcarbazole or polyvinylcarbazole, N,N'-bis(3-methylphenyl)-N,N'-diphenyl-[1,1-biphenyl]-4,4'-diamine (TPD), 4,4',4"-tris(N-carbazolyl)triphenylamine (TCTA), and N,N'-di(1-naphthyl)-N,N'-diphenylbenzidine) (NPB).

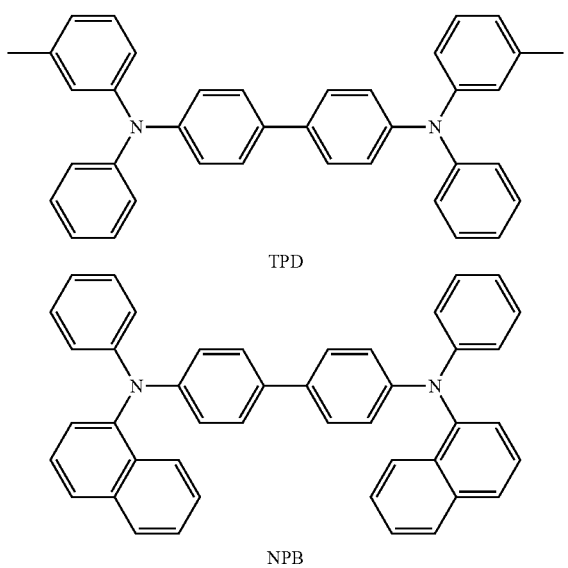

TPD

NPB

The thickness of the HTL may be from about 50 Å to about 2,000 Å, e.g., 100 Å to about 1,500 Å. When the thickness of the HTL is within these ranges, the HTL may have good hole transporting ability without a substantial increase in driving voltage.

The H-functional layer (having both hole injection and hole transport capabilities) may contain at least one material from each group of the hole injection layer materials and hole transport layer materials. The thickness of the H-functional layer may be from about 500 Å to about 10,000 Å, e.g., about 100 Å to about 1,000 Å. When the thickness of the H-functional layer is within these ranges, the H-functional layer may have good hole injection and transport capabilities without a substantial increase in driving voltage.

In an implementation, at least one of the HIL, HTL, and H-functional layer may include at least one of a compound of Formula 300, below, or a compound of Formula 350, below.

<Formula 300>

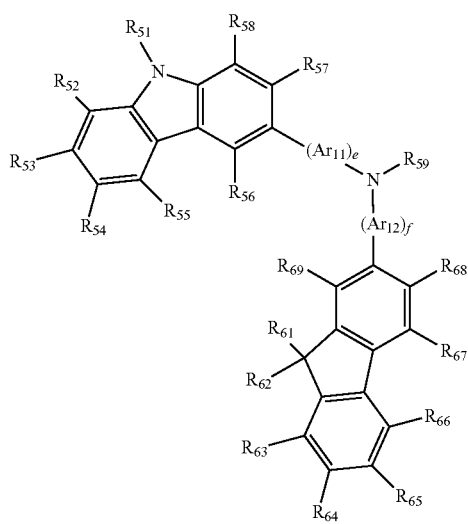

<Formula 350>

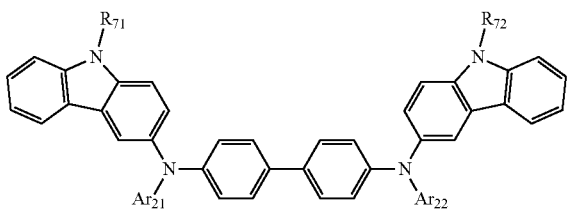

In Formulae 300 and 350, $Ar_{11}$, $Ar_{12}$, $Ar_2$, and $Ar_{22}$ may each independently be a substituted or unsubstituted $C_5$-$C_{60}$ arylene group.

In Formula 300, e and f may each independently be an integer from 0 to 5, e.g., 0, 1, or 2. For example, e may be 1, and f may be 0.

In Formulae 300 and 350 above, $R_{51}$ to $R_{58}$, $R_{61}$ to $R_{69}$, and $R_{71}$ and $R_{72}$ may each independently be a hydrogen atom, a deuterium atom, a halogen atom, a hydroxyl group, a cyano group, a nitro group, an amino group, an amidino group, a hydrazine group, a hydrazone group, a carboxyl) group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_5$-$C_{60}$ aryl group, a substituted or unsubstituted $C_5$-$C_{60}$ aryloxy group, or a substituted or unsubstituted $C_5$-$C_{60}$ arylthio group. In an implementation, $R_{51}$ to $R_{58}$, $R_{61}$ to $R_{69}$, $R_{71}$, and $R_{72}$ may each independently be one of a hydrogen atom; a deuterium atom; a halogen atom; a hydroxyl group; a cyano group; a nitro group; an amino group; an amidino group; a hydrazine group; a hydrazone group; a carboxyl group or a salt thereof; a sulfonic acid group or a salt thereof; a phosphoric acid group or a salt thereof; a $C_1$-$C_{10}$ alkyl group (for example, a methyl group, an ethyl group, a propyl group, a butyl group, a pentyl group, a hexyl group, or the like); a $C_1$-$C_{10}$ alkoxy group (for example, a methoxy group, an ethoxy group, a propoxy group, a butoxy group, a pentoxy group, or the like); a $C_1$-$C_{10}$ alkyl group and a $C_1$-$C_{10}$ alkoxy group that are substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof; a phenyl group; a naphthyl group; an anthryl group; a fluorenyl group; a pyrenyl group; and a phenyl group, a naphthyl group, an anthryl group, a fluorenyl group, and a pyrenyl group that are substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{10}$ alkyl group, and a $C_1$-$C_{10}$ alkoxy group.

In Formula 300, $R_{109}$ may be one of a phenyl group, a naphthyl group, an anthryl group, a biphenyl group, a pyridyl group; and a phenyl group, a naphthyl group, an anthryl group, a biphenyl group, or a pyridyl group that are substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a substituted or unsubstituted $C_1$-$C_{20}$ alkyl group, and a substituted or unsubstituted $C_1$-$C_{20}$ alkoxy group.

In an implementation, the compound of Formula 300 may be a compound represented by Formula 300A, below.

<Formula 300A>

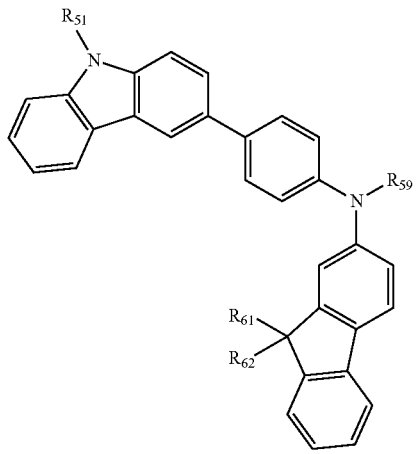

In Formula 300A, $R_{51}$, $R_{61}$, $R_{62}$, and $R_{59}$ may be as defined above.

In an implementation, at least one of the HIL, HTL, and H-functional layer may include a represented by one of Formulae 301 to 320, below.

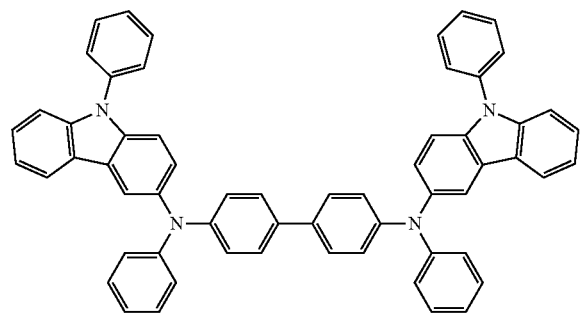

301

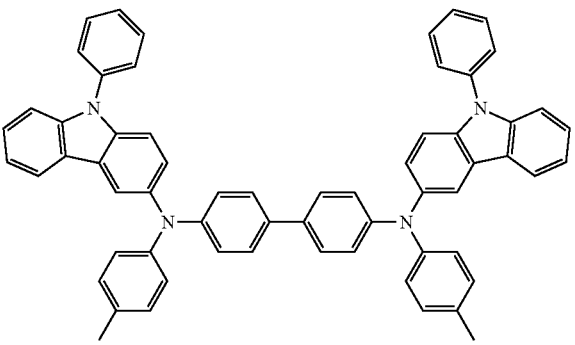

302

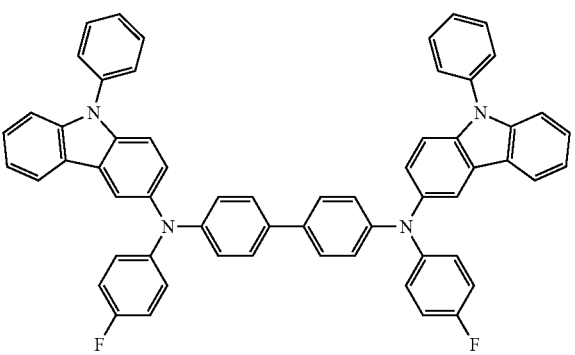

303

304

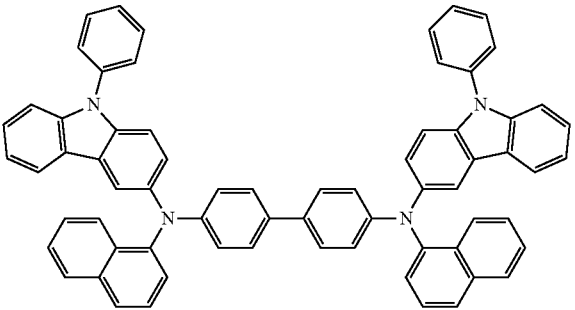

305

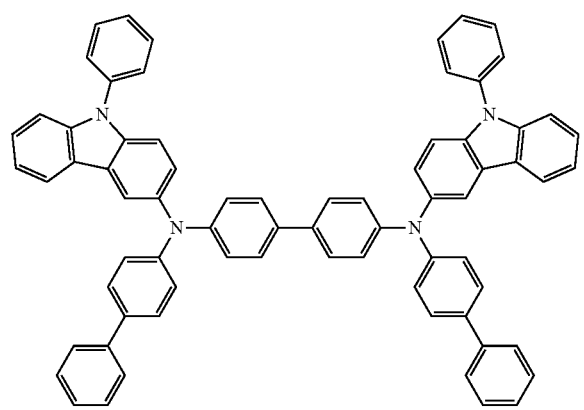
306
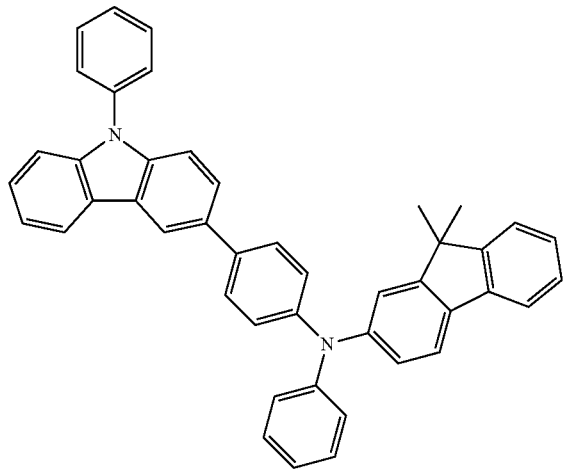
309
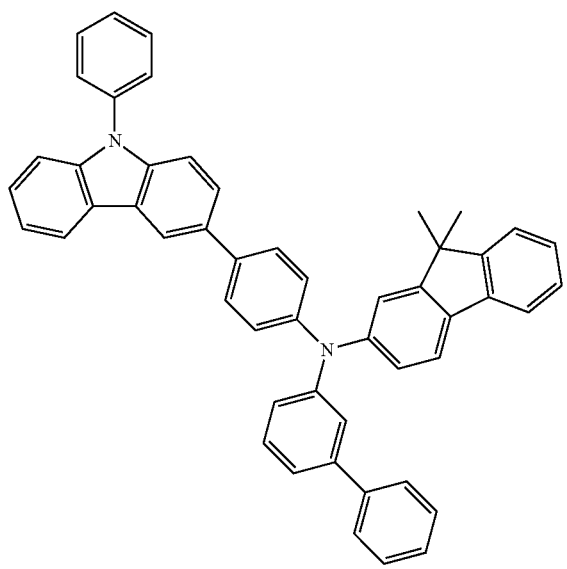
310
307
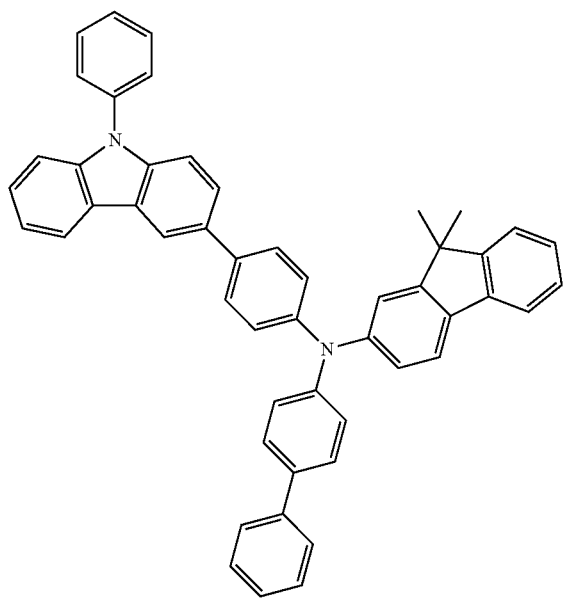
311
308

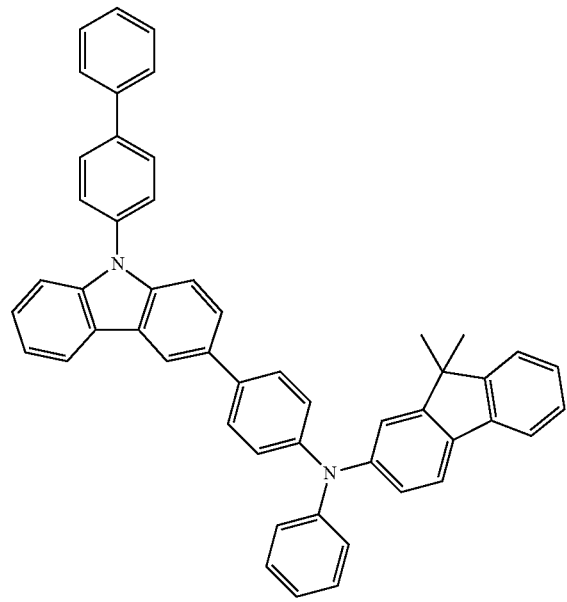
312
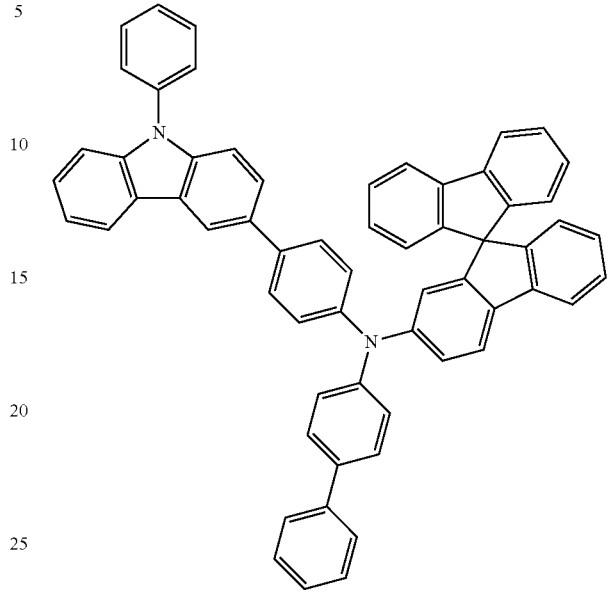
314
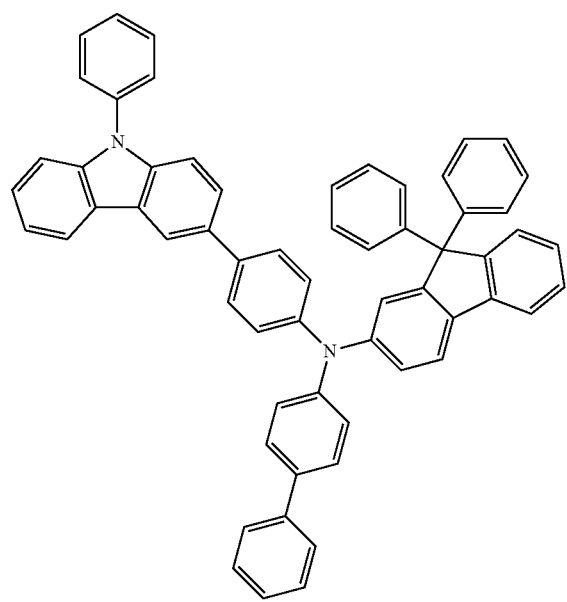
313
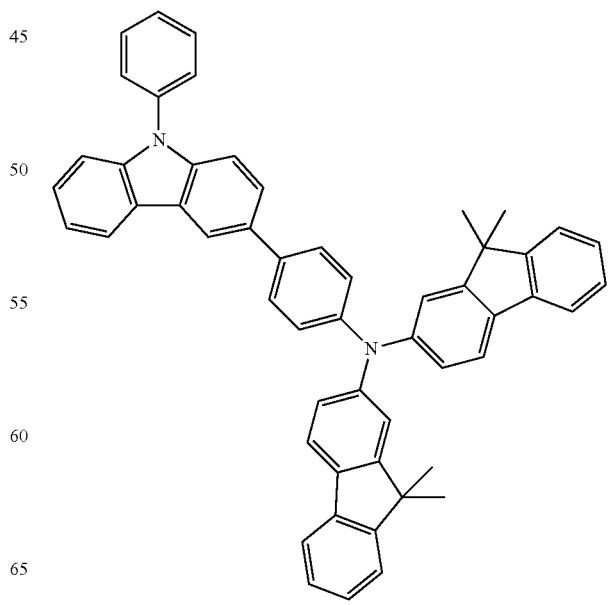
315

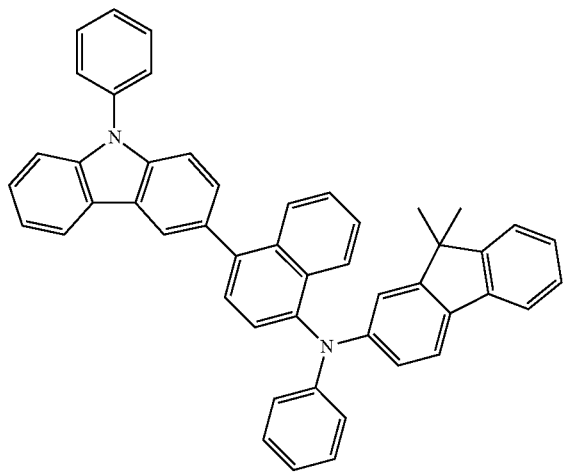

316

317

318

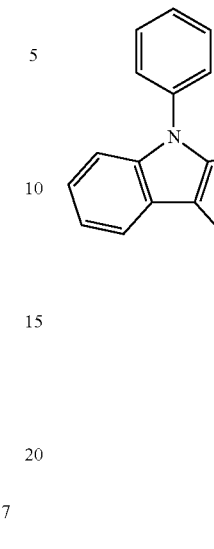

319

320

At least one of the HIL, HTL, and H-functional layer may further include a charge-generating material for improved layer conductivity, in addition to a suitable hole injecting material, hole transport material, and/or material having both hole injection and hole transport capabilities as described above.

The charge-generating material may be, e.g., a p-dopant. The p-dopant may include one of quinone derivatives, metal oxides, and compounds with a cyano group, or the like. Non-limiting examples of the p-dopant are quinone derivatives such as tetracyanoquinonedimethane (TCNQ), 2,3,5,6-tetrafluoro-tetracyano-1,4-benzoquinonedimethane (F4-TCNQ), and the like; metal oxides such as tungsten oxide, molybdenum oxide, and the like; and cyano-containing compounds such as Compound 200 below.

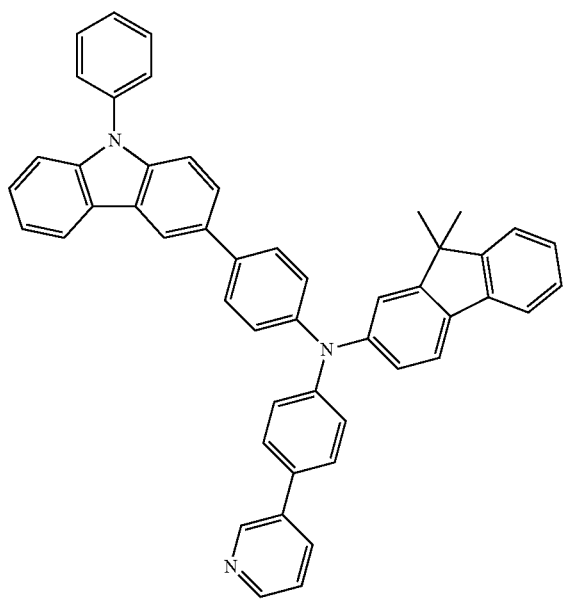

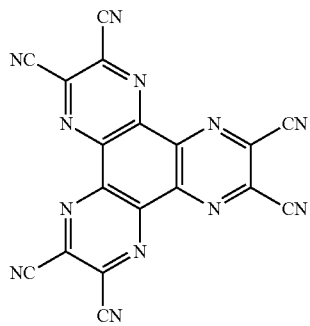

<Compound 200>

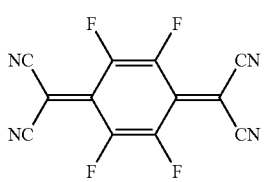

<F4-TCNQ>

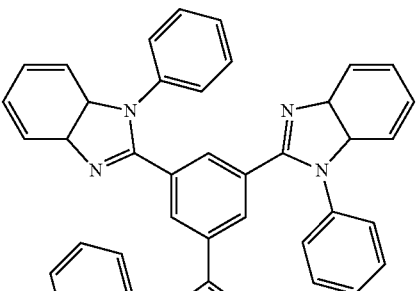

TPBI

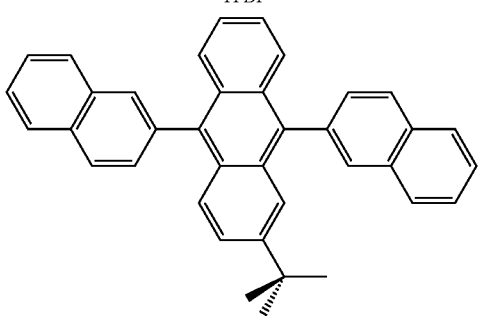

TBADN

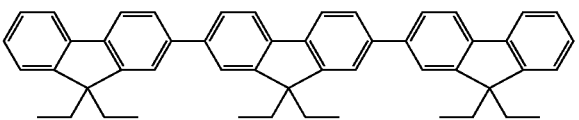

E3

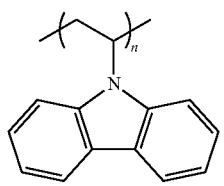

PVK

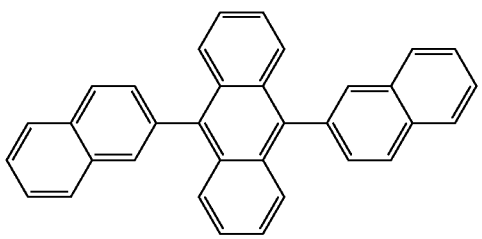

ADN

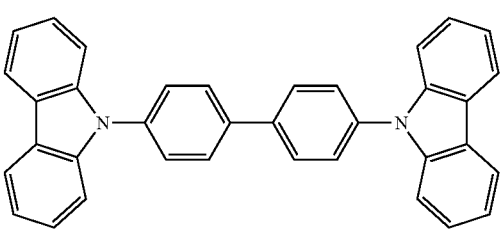

CBP

When the hole injection layer, hole transport layer, or H-functional layer further include a charge-generating material, the charge-generating material may be homogeneously dispersed or inhomogeneously (heterogeneously) distributed in the layer.

A buffer layer may be disposed between at least one of the HIL, HTL, and H-functional layer, and the EML. The buffer layer may compensate for an optical resonance distance of light according to a wavelength of the light emitted from the EML, and thus may increase efficiency. The butter layer may include a suitable hole injecting material or hole transporting material. In an implementation, the buffer layer may include the same material as one of the materials included in the HIL, HTL, and H-functional layer that underlie the buffer layer.

Then, an EML may be formed on the HTL, H-functional layer, or buffer layer by vacuum deposition, spin coating, casting, Langmuir-Blodgett (LB) deposition, or the like. When the EML is formed using vacuum deposition or spin coating, the deposition and coating conditions may be similar to those for the formation of the HIL, though the conditions for deposition and coating may vary depending on the material that is used to form the EML.

The EML may be formed using the compound of Formula 1 above, or any of a variety of suitable light-emitting materials, such as known hosts and dopants. Dopants that may be used to form the EML may include either a fluorescent dopant or a phosphorescent dopant which are widely known in the art.

Examples of the host may include $Alq_3$, 4,4'-N,N'-dicarbazole-biphenyl (CBP), poly(n-vinylcarbazole) (PVK), 9,10-di(naphthalene-2-yl)anthracene (DNA), TCTA, 1,3,5-tris(N-phenylbenzimidazole-2-yl)benzene (TPBI), 3-tert-butyl-9,10-di-2-naphthylanthracene (TBADN), E3, distyrylarylene (DSA), dmCBP (see a formula below), and Compounds 501 to 509 below.

53
-continued
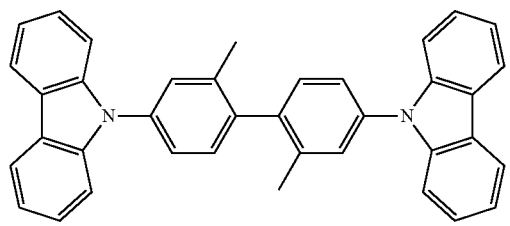
dmCBP
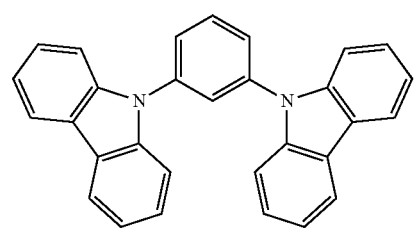
501
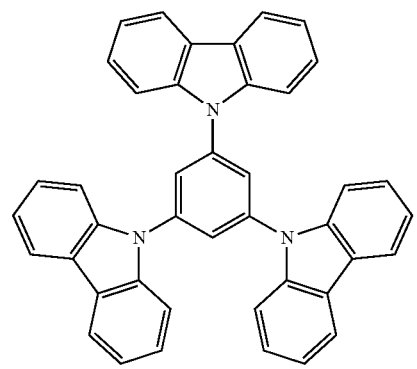
502
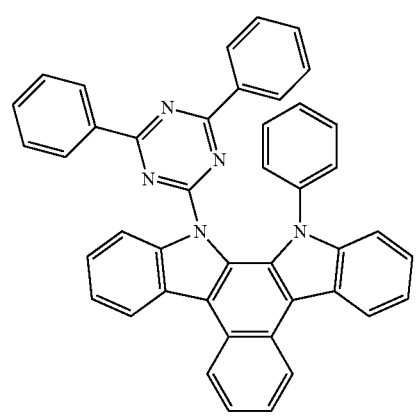
503
54
-continued
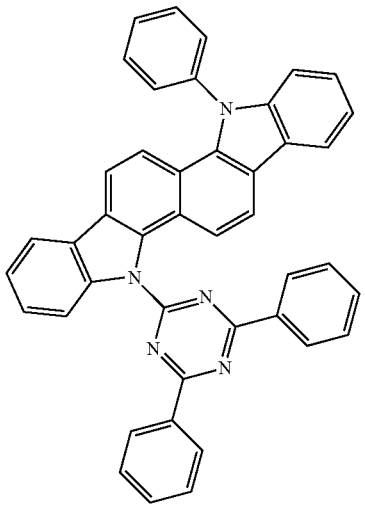
504
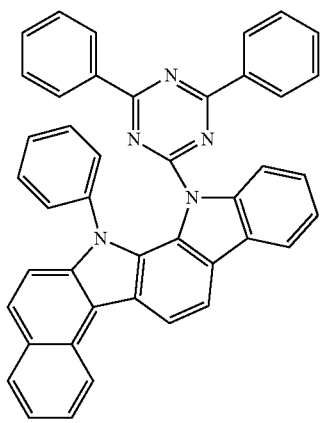
505
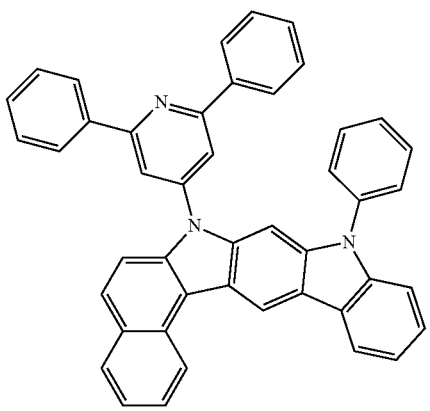
506

-continued

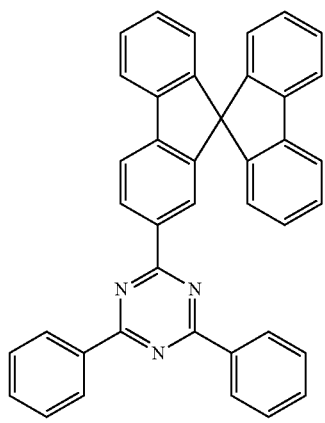

507

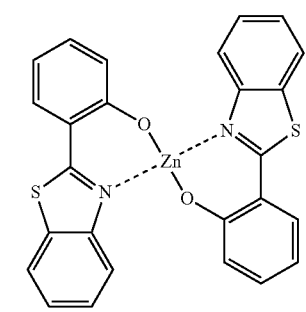

508

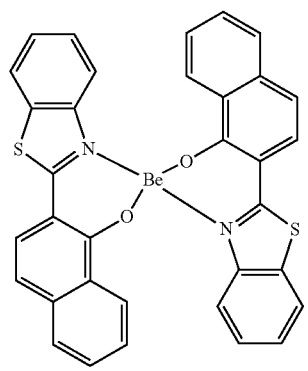

509

In an implementation, an anthracene-based compound represented by Formula 400 below may be used as the host.

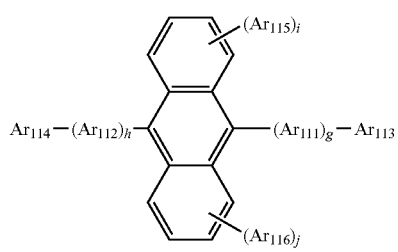
<Formula 400>

In Formula 400, $Ar_{111}$ and $Ar_{112}$ may each independently be a substituted or unsubstituted $C_6$-$C_{60}$ arylene group; $Ar_{13}$ to $Ar_{16}$ may each independently be a substituted or unsubstituted $C_1$-$C_{10}$ alkyl group, or a substituted or unsubstituted $C_5$-$C_{60}$ aryl group; and g, h, I, and j may each independently be an integer from 0 to 4.

In an implementation, $Ar_{111}$ and $Ar_{112}$ in Formula 400 may each independently be a phenylene group, a naphthylene group, a phenanthrenylene group, or a pyrenylene group; or a phenylene group, a naphthylene group, a phenanthrenylene group, a fluorenyl group, or a pyrenylene group that are substituted with at least one of a phenyl group, a naphthyl group, or an anthryl group.

In Formula 400 above, g, h, i, and j may each independently be 0, 1, or 2.

In an implementation, $Ar_{113}$ to $Ar_{116}$ in Formula 400 may each independently be one of a $C_1$-$C_{10}$ alkyl group substituted with at least one of a phenyl group, a naphthyl group, or an anthryl group; a phenyl group; a naphthyl group; an anthryl group; a pyrenyl group; a phenanthrenyl group; a fluorenyl group; a phenyl group, a naphthyl group, an anthryl group, a pyrenyl group, a phenanthrenyl group, or a fluorenyl group, each substituted with at least one of a deuterium atom, a halogen atom, a hydroxyl group, a cyano group, a nitro group, an amino group, an amidino group, hydrazine group, hydrazone group, a carboxyl group or a salt thereof, a sulfonic acid group or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a pyrenyl group, a phenanthrenyl group, or a fluorenyl group,

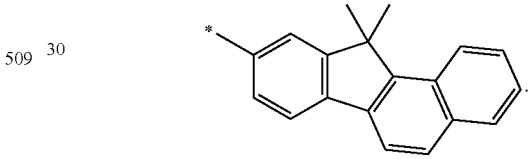

or

In an implementation, the anthracene-based compound of Formula 400 above may be one of the following compounds.

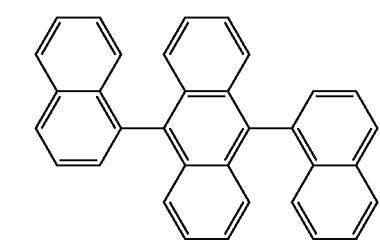

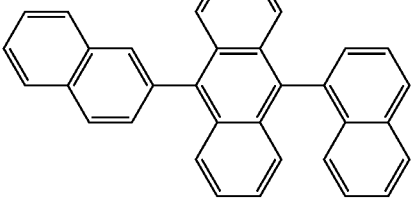

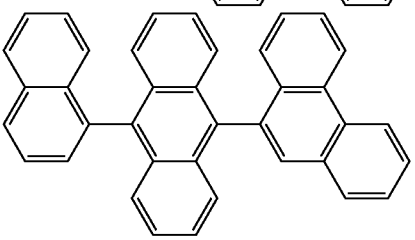

-continued
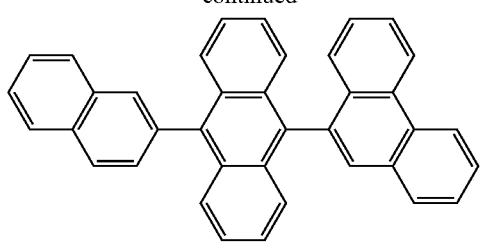
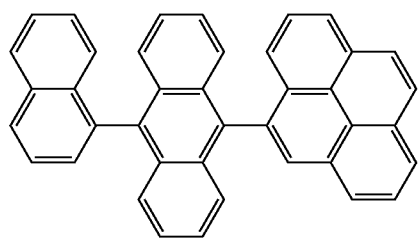
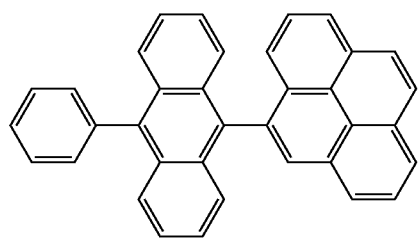
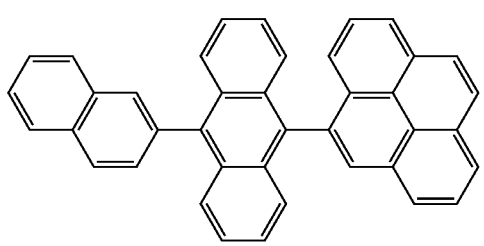
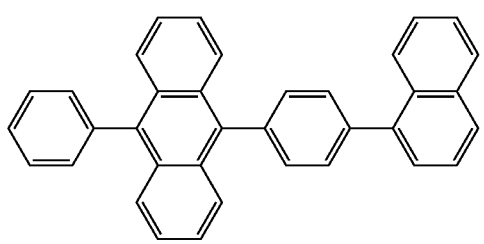
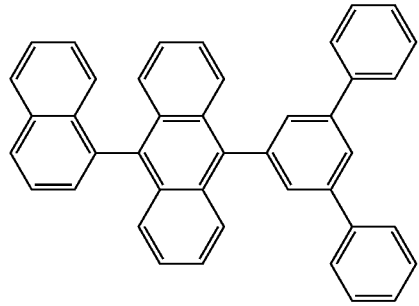
-continued
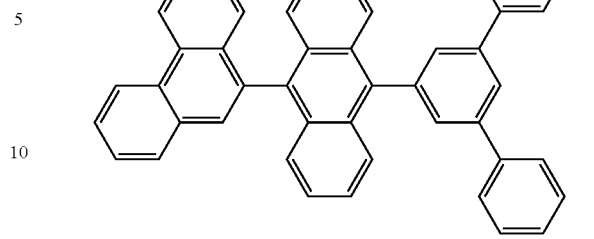
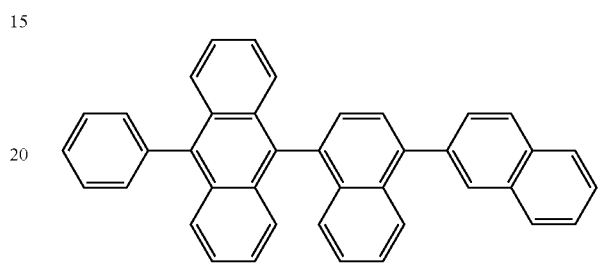
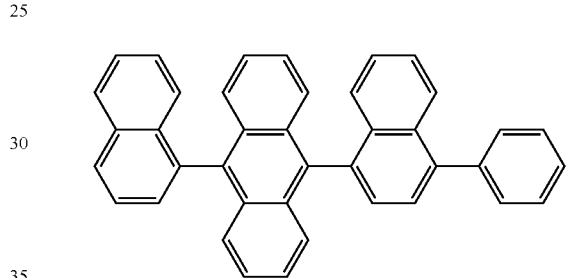
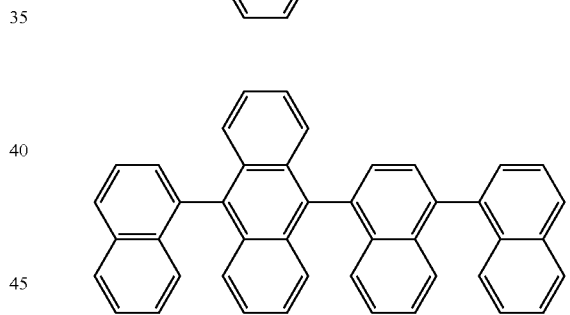
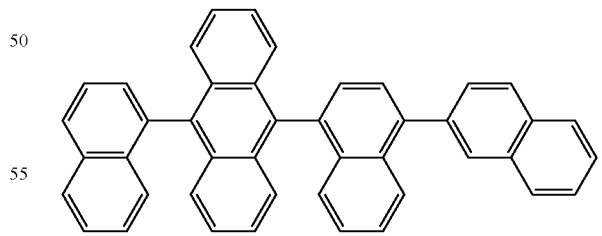
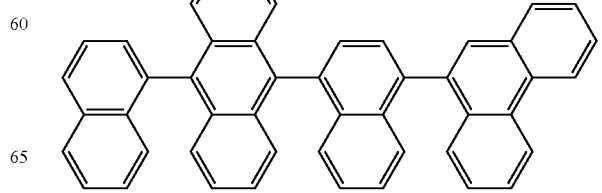

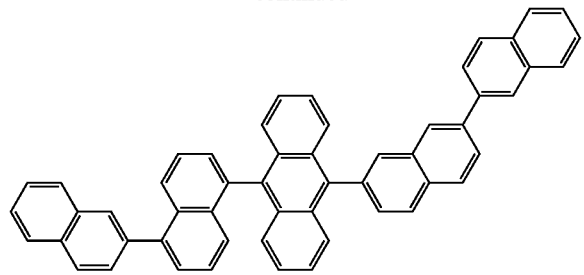
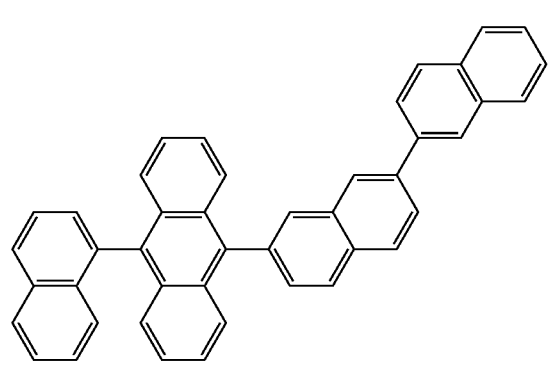
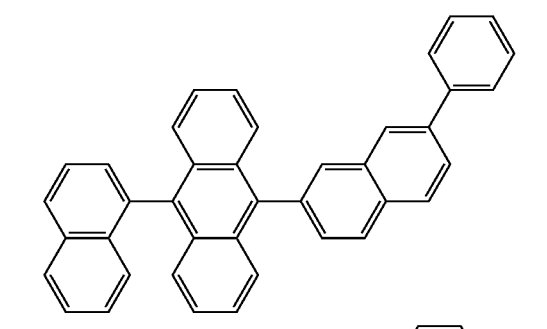
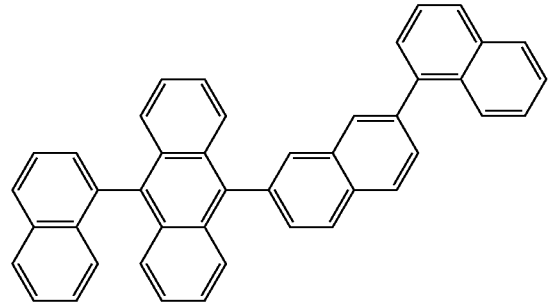
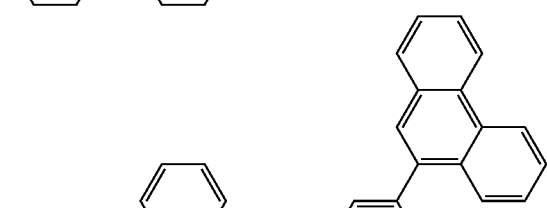
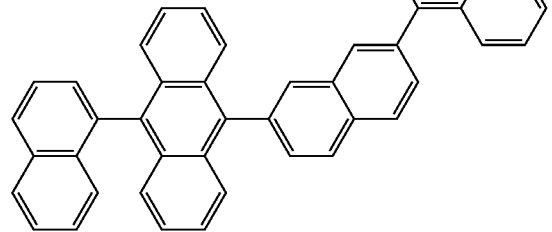
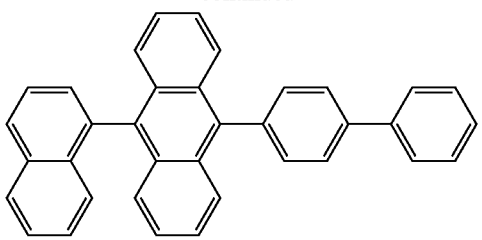
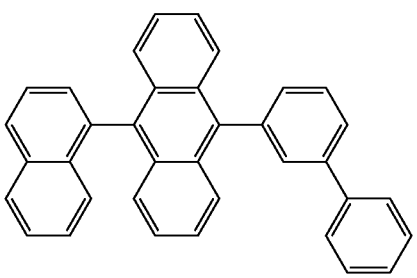
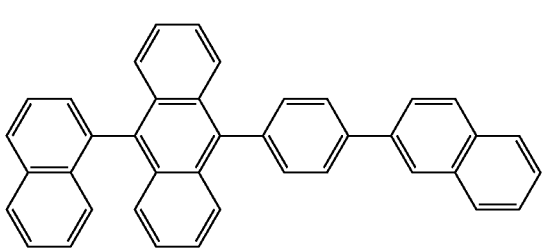
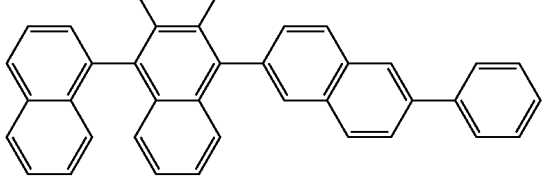
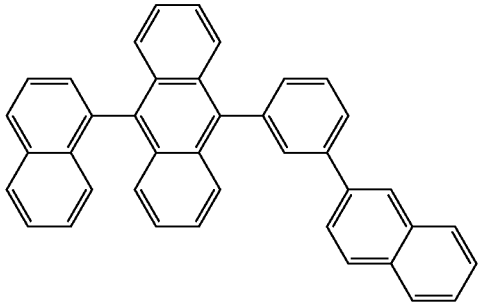
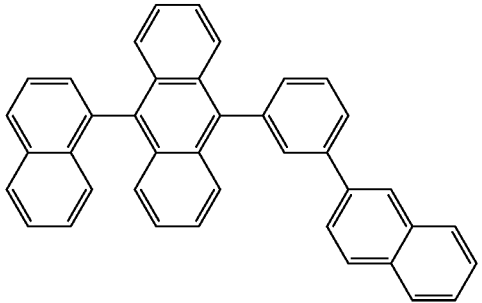

-continued
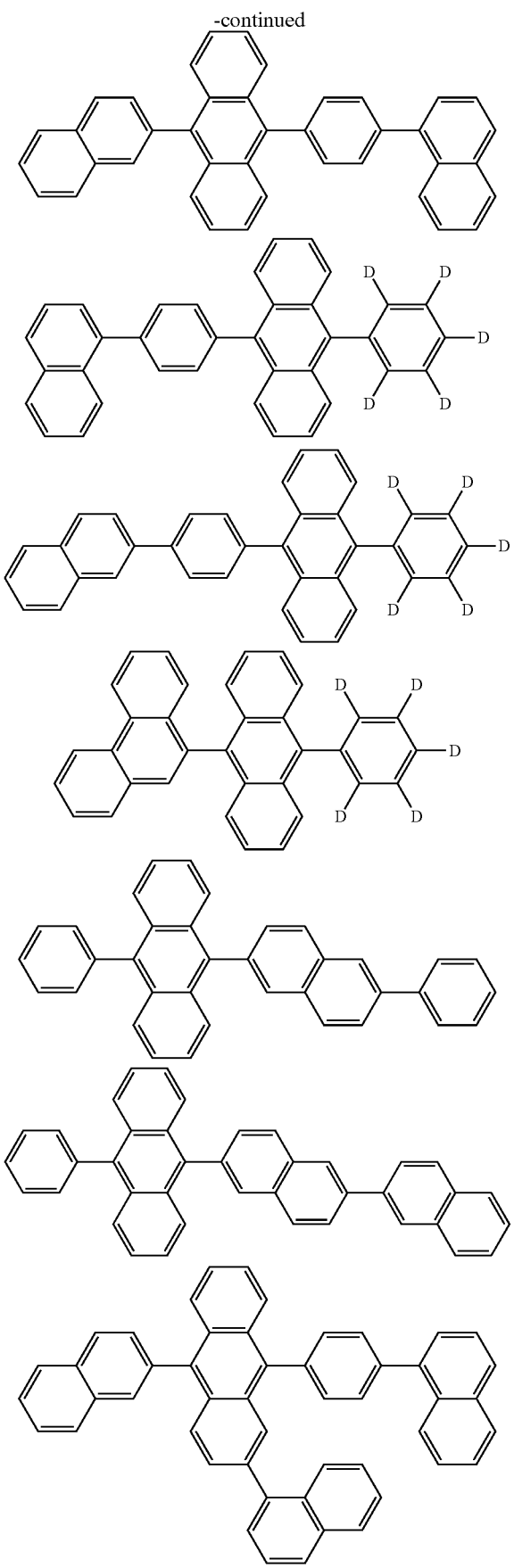
-continued
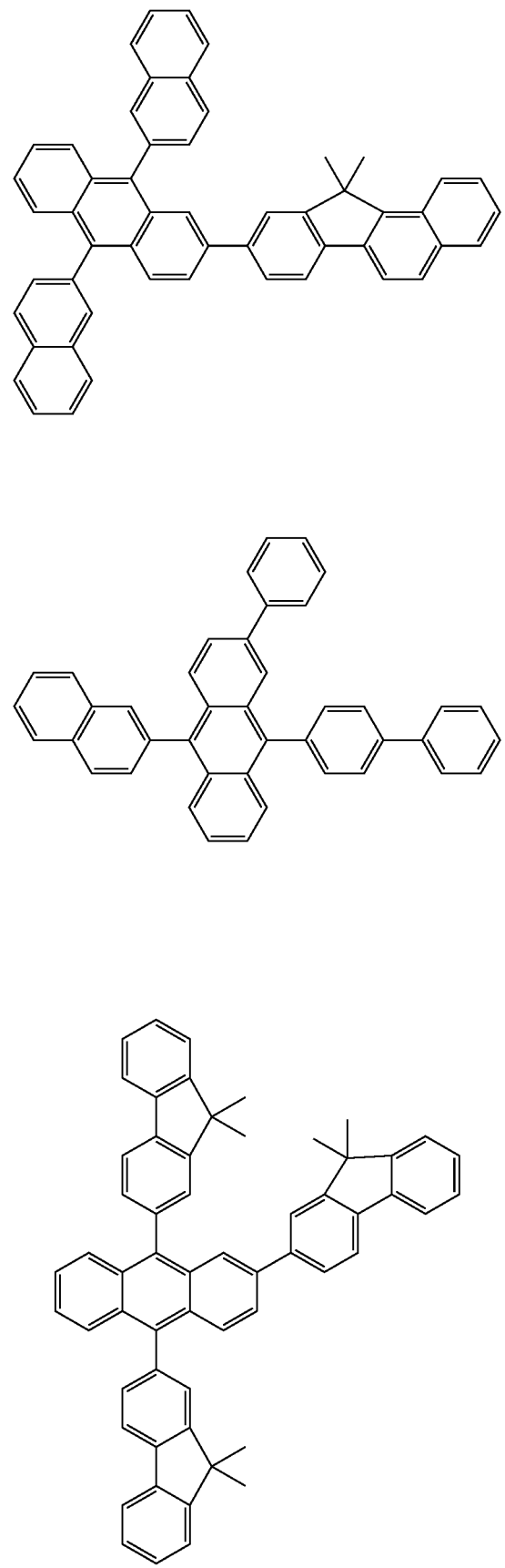

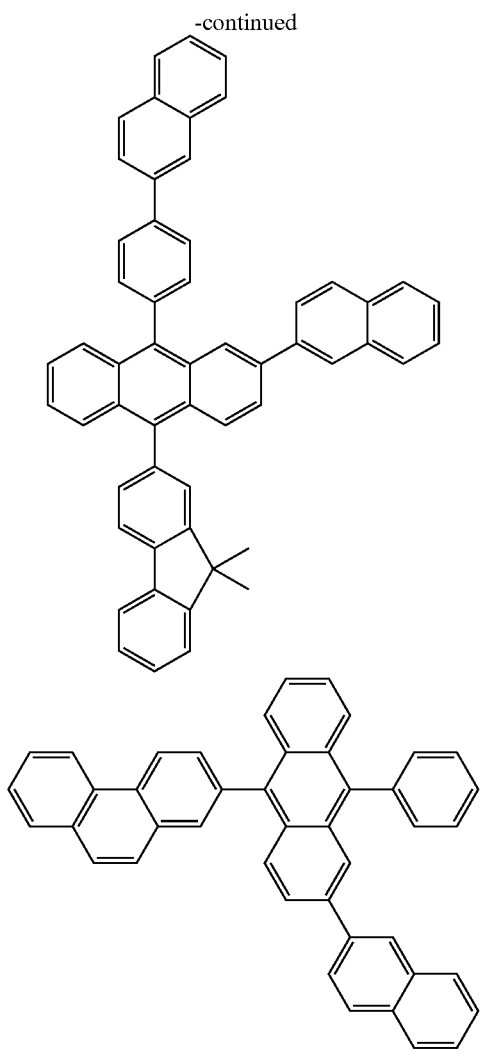

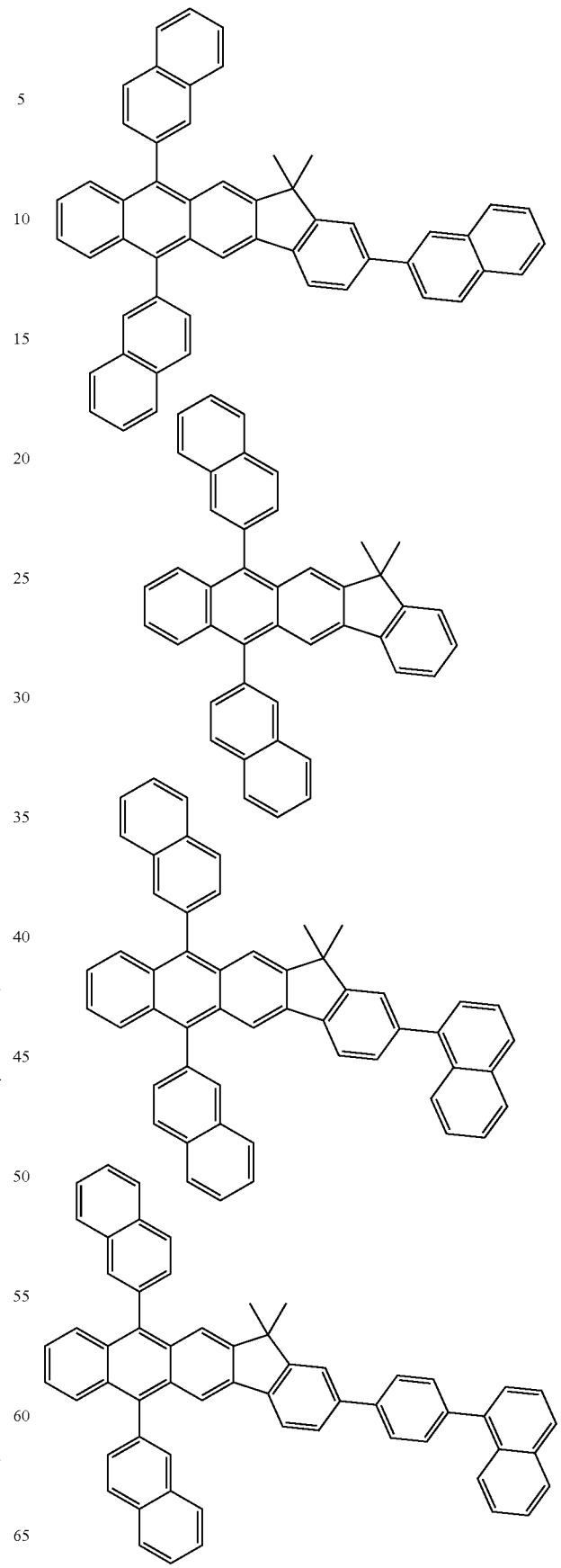

In an implementation, an anthracene-based compound represented by Formula 401 below may be used as the host.

<Formula 401>

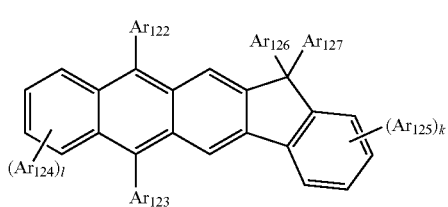

$Ar_{122}$ to $Ar_{125}$ in Formula 401 above may be defined as described above in conjunction with $Ar_{113}$ of Formula 400, and thus repeated detailed descriptions thereof may be omitted.

$Ar_{126}$ and $Ar_{127}$ in Formula 401 above may each independently be a $C_1$-$C_{10}$ alkyl group, e.g., a methyl group, an ethyl group, or a propyl group.

In Formula 401, k and l may each independently be an integer from 0 to 4, e.g., 0, 1, or 2.

For example, the anthracene compound of Formula 401 above may be one of the following compounds.

When the organic light-emitting device is a full color organic light-emitting device, the emission layer may be patterned into a red emission layer, a green emission layer, and a blue emission layer.

At least one of the red EML, the green EML, and the blue EML may include a dopant below (ppy=phenylpyridine).

Examples of the blue dopant may include compounds represented by the following formulae.

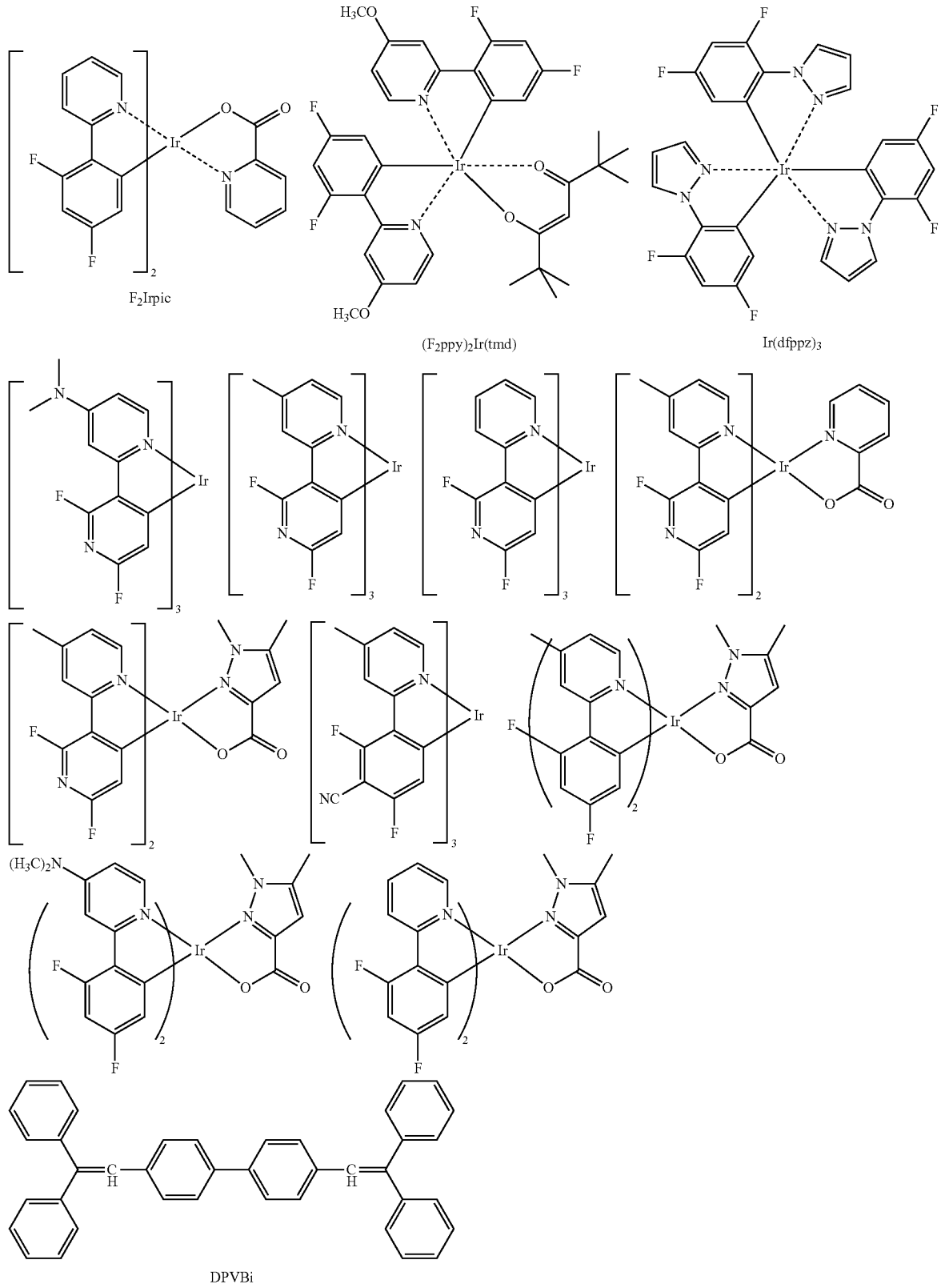

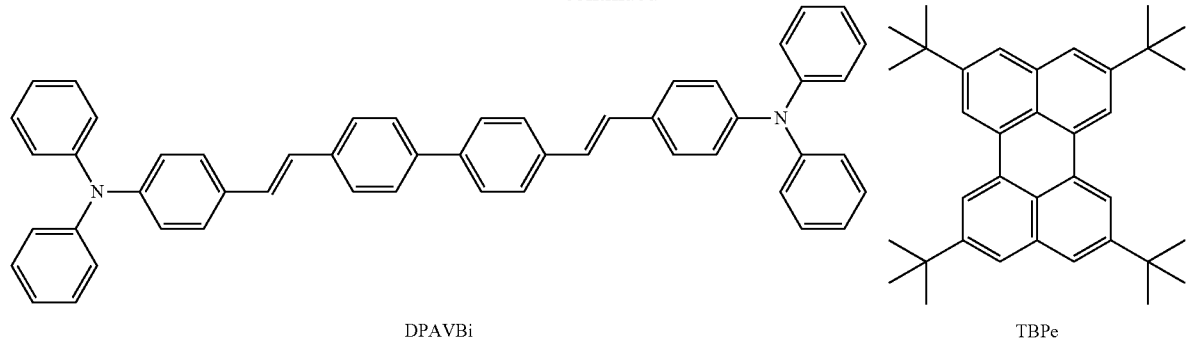
DPAVBi
TBPe
Examples of the red dopant may include compounds represented by the following formulae.
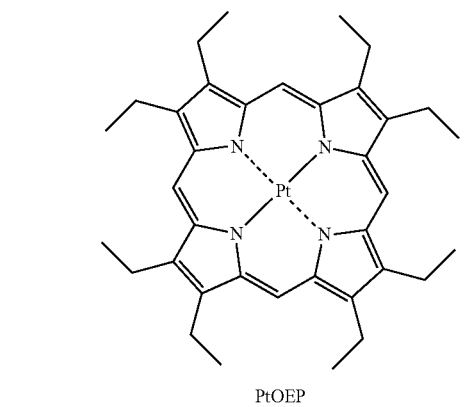
PtOEP
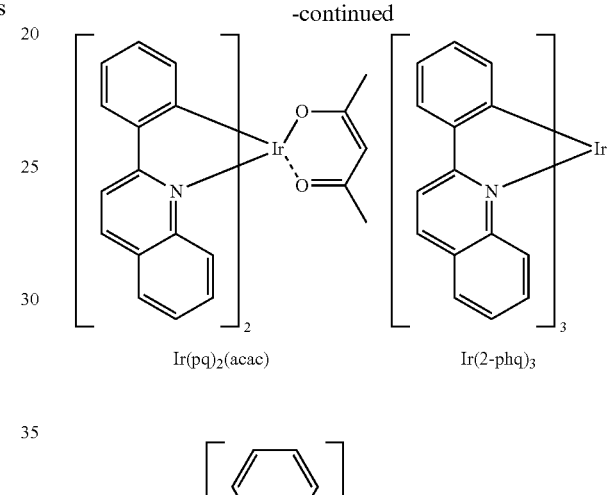
Ir(pq)$_2$(acac)
Ir(2-phq)$_3$
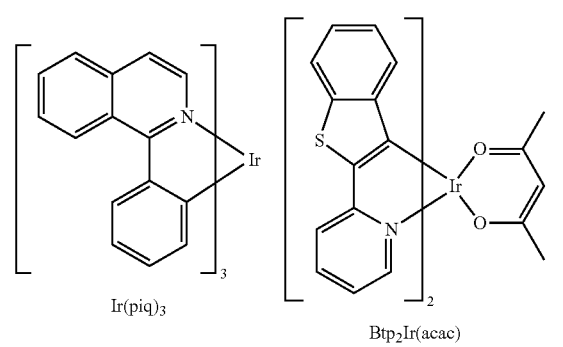
Ir(piq)$_3$
Btp$_2$Ir(acac)
Ir(BT)$_2$(acac)
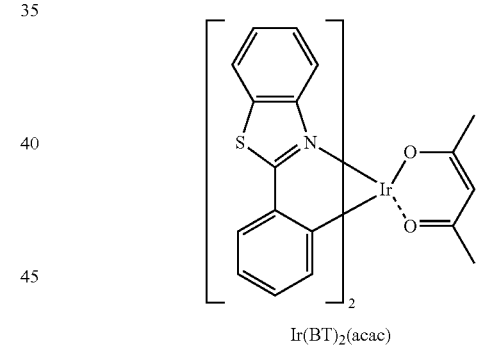
Ir(flq)$_2$(acac)
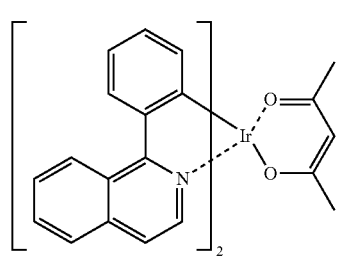

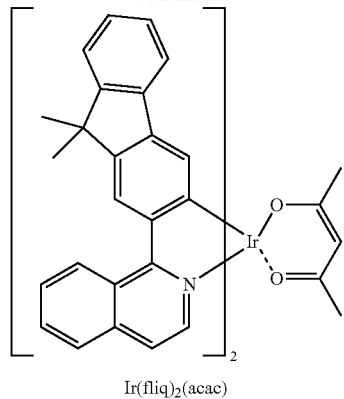
Ir(fliq)₂(acac)
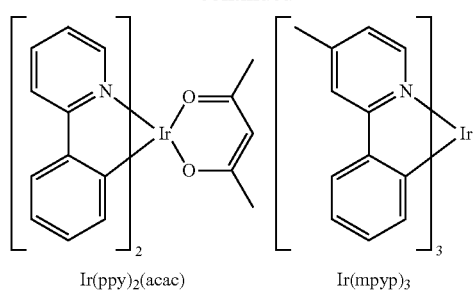
Ir(ppy)₂(acac)        Ir(mpyp)₃
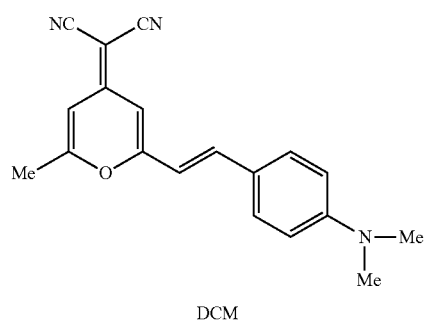
DCM
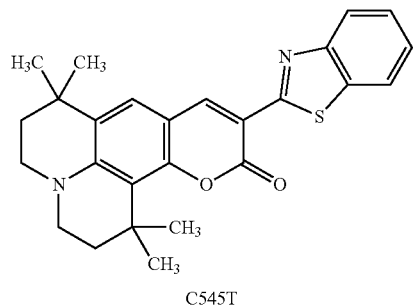
C545T
Examples of the dopant that may be used in the EML may include Pd complexes or Pt complexes represented by the following formulae.
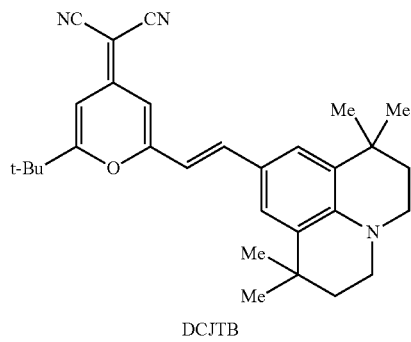
DCJTB
Examples of the green dopant may include compounds represented by the following formulae.
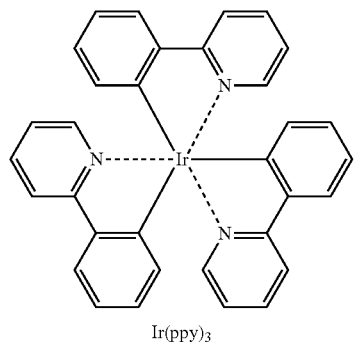
Ir(ppy)₃
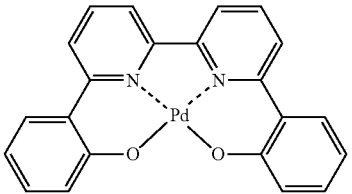
D1
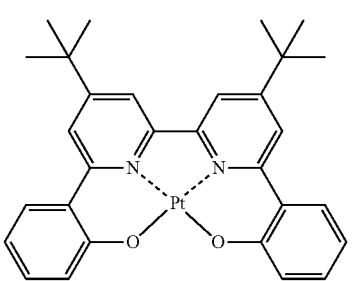
D2
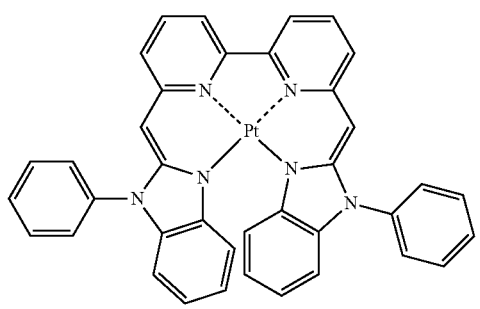
D3

D4
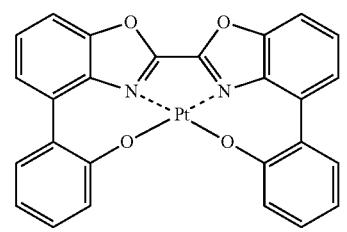
D5
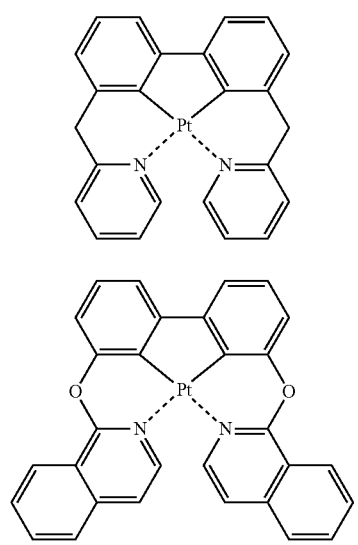
D6
D7
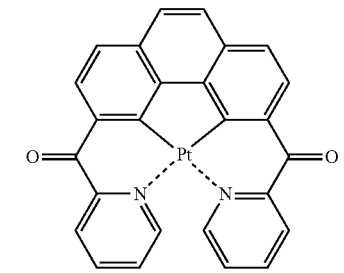
D8
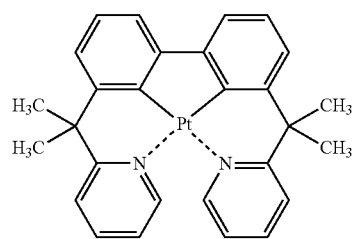
D9
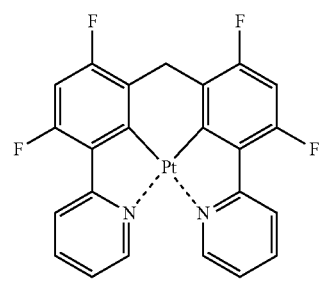
D10
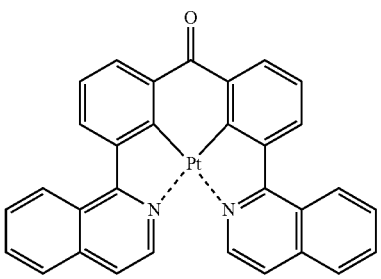
D11
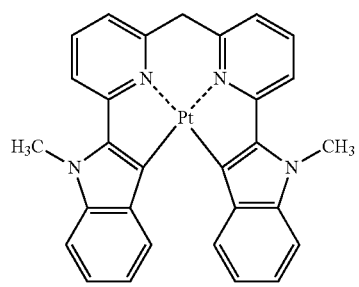
D12
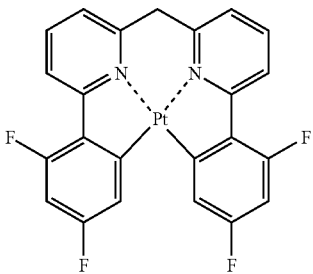
D13
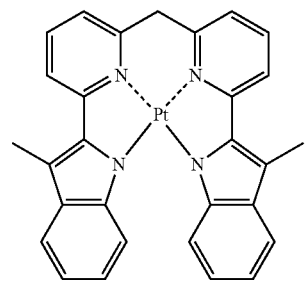
D14
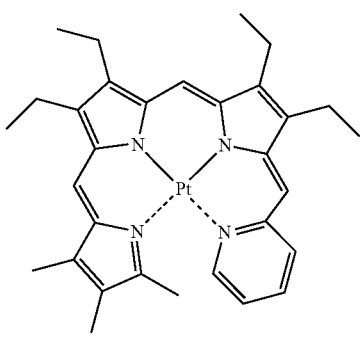

-continued
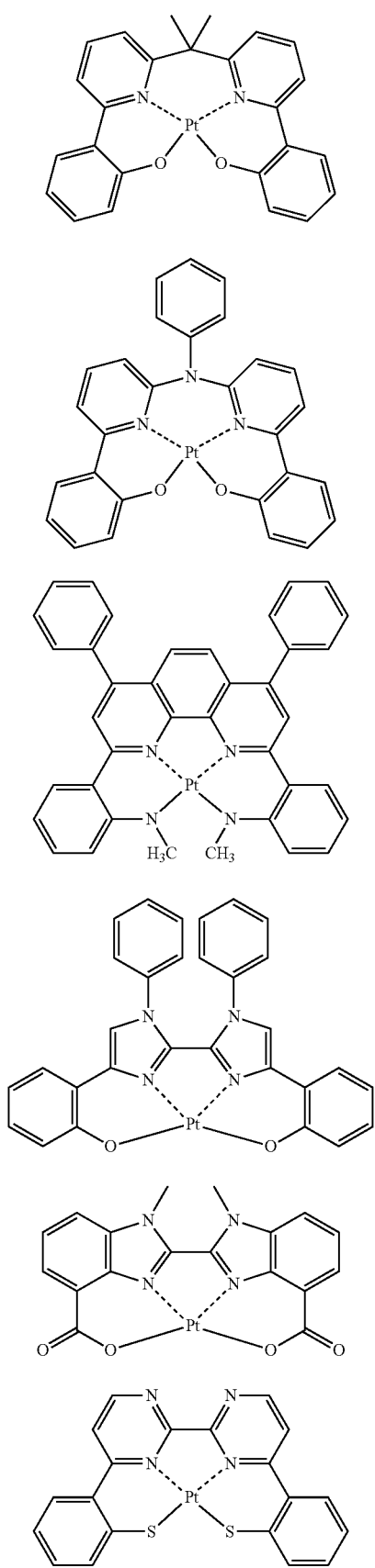
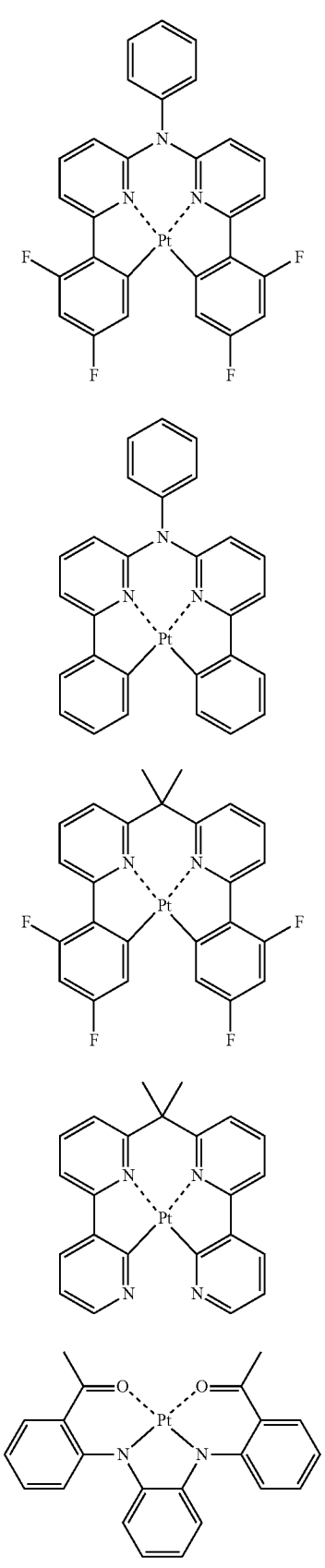

-continued
| | |
|---|---|
| 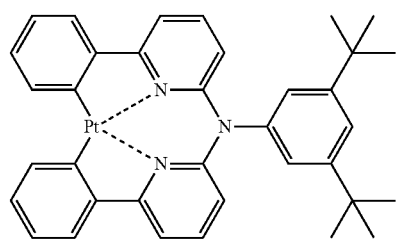 D26 | 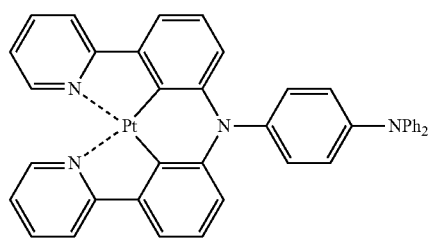 D32 |
| 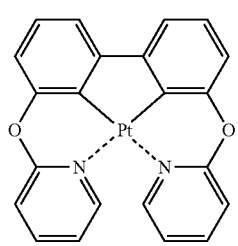 D27 | 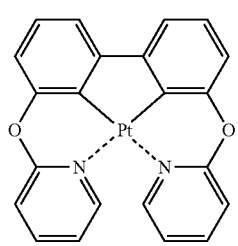 D33 |

D37
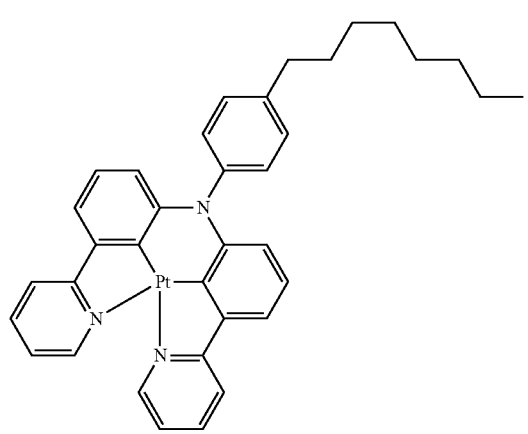
D38
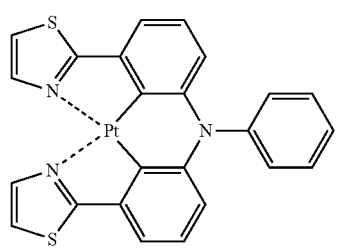
D39
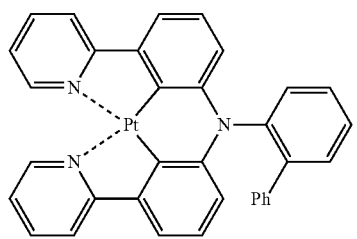
D40
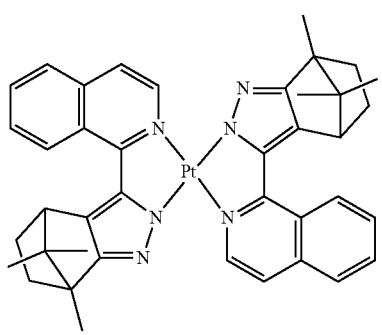
D41
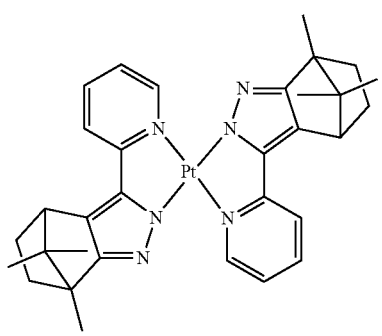
D42
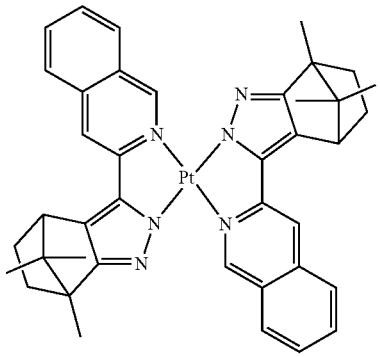
D43
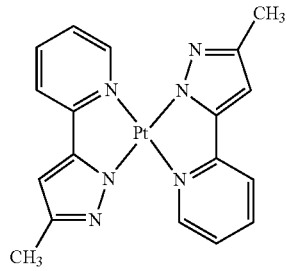
D44
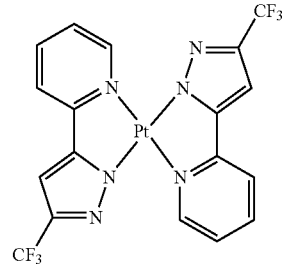
D45
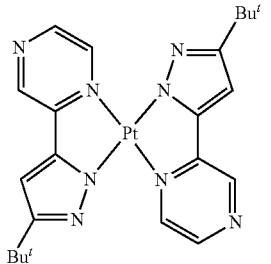
D46
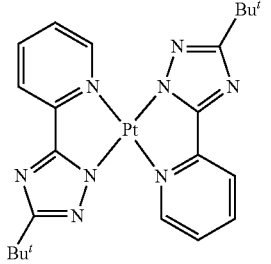

-continued

D47
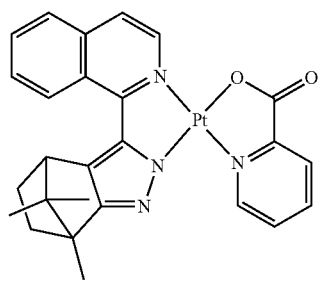

D48
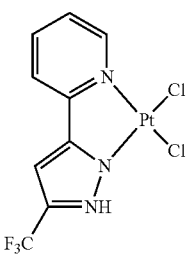

D49
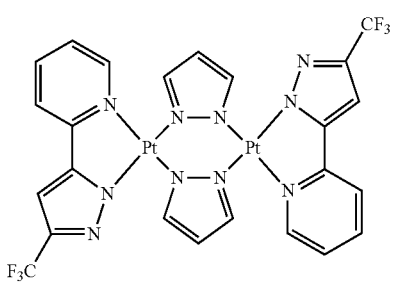

D50
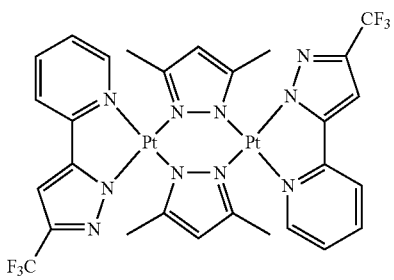

Examples of the dopant that may be used in the EML may include Os complexes represented by the following formulae.

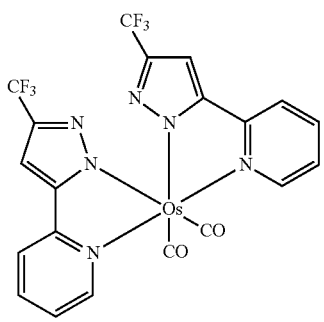

Os(fppz)$_2$(CO)$_2$

-continued

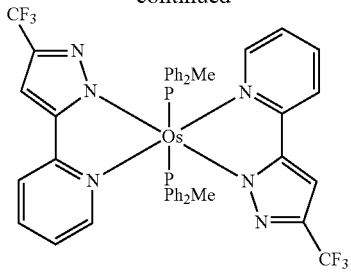

Os(fppz)$_2$(PPh$_2$Me)$_2$

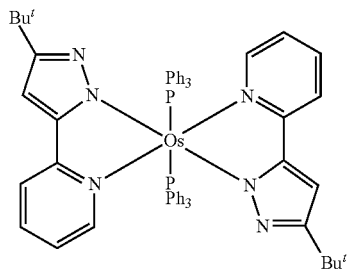

Os(bppz)$_2$(PPh$_3$)$_2$

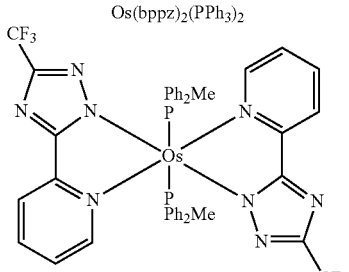

Os(fptz)$_2$(PPh$_2$Me)$_2$

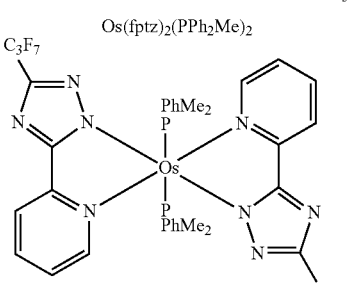

Os(hptz)$_2$(PPhMe$_2$)$_2$

When the EML includes both a host and a dopant, an amount of the dopant may be from about 0.01 to about 15 parts by weight based on 100 parts by weight of the host.

The thickness of the EML may be about 100 Å to about 1,000 Å, e.g., about 200 Å to about 600 Å. When the thickness of the EML is within these ranges, the EML may have good light emitting ability without a substantial increase in driving voltage.

Then, an ETL may be formed on the EML by vacuum deposition, spin coating, casting, or the like.

When the ETL is formed using vacuum deposition or spin coating, the deposition and coating conditions may be similar to those for the formation of the HIL, though the deposition and coating conditions may vary depending on a compound that is used to form the ETL.

A material for forming the ETL may be the compound of Formula 1 above, or may include a suitable material that can stably transport electrons injected from an electron injecting electrode (cathode).

Examples of materials for forming the ETL may include a quinoline derivative, such as tris(8-quinolinorate)aluminum (Alq$_3$), TAZ, BAlq, beryllium bis(benzoquinolin-10-olate (Bebq$_2$), 9,10-di(naphthalene-2-yl)anthracene (ADN), Compound 201, and Compound 202.

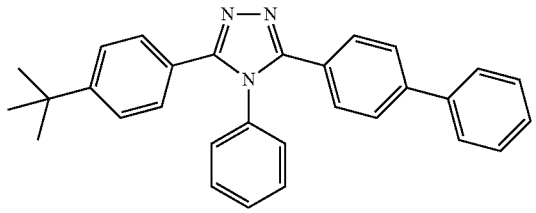

TAZ

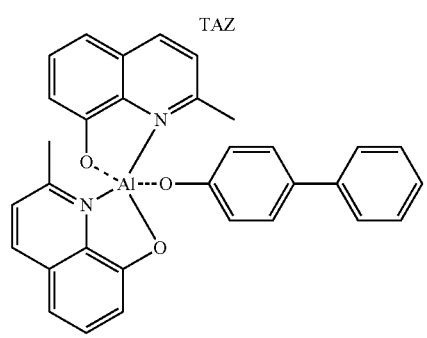

BAlq

<Compound 201>

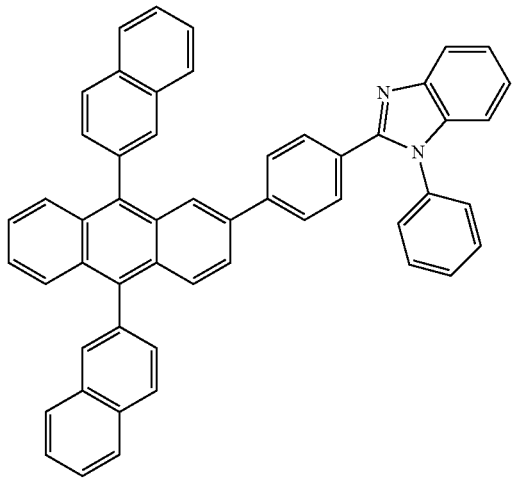

<Compound 202>

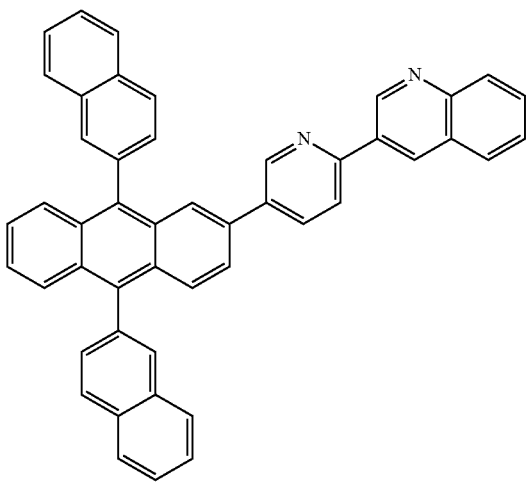

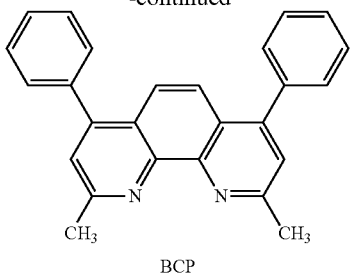

BCP

The thickness of the ETL may be from about 100 Å to about 1,000 Å, e.g., about 150 Å to about 500 Å. When the thickness of the ETL is within these ranges, the ETL may have satisfactory electron transporting ability without a substantial increase in driving voltage.

In an implementation, the ETL may further include a metal-containing material, in addition to a suitable electron-transporting organic compound.

The metal-containing material may include a lithium (Li) complex. Examples of the Li complex may include lithium quinolate (LiQ) and Compound 203 below:

<Compound 203>

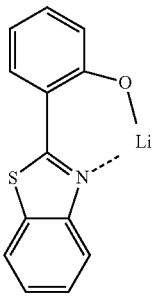

Then, an EIL, which facilitates injection of electrons from the cathode, may be formed on the ETL. A suitable electron-injecting material may be used to form the EIL.

Examples of materials for forming the EIL may include LiF, NaCl, CsF, Li$_2$O, and BaO. The deposition and coating conditions for forming the EIL may be similar to those for the formation of the HIL, though the deposition and coating conditions may vary depending on the material that is used to form the EIL.

The thickness of the EIL may be from about 1 Å to about 100 Å, e.g., about 3 Å to about 90 Å. When the thickness of the EIL is within these ranges, the EIL may have satisfactory electron injection ability without a substantial increase in driving voltage.

Finally, the second electrode may be disposed on the organic layer. The second electrode may be a cathode that is an electron injection electrode. A material for forming the second electrode may include, e.g. a metal, an alloy, an electro-conductive compound, which have a low work function, or a mixture thereof. In an implementation, the second electrode may be formed of lithium (Li), magnesium (Mg), aluminum (Al), aluminum (Al)-lithium (Li), calcium (Ca), magnesium (Mg)-indium (In), magnesium (Mg)-silver (Ag), or the like, and may be formed as a thin film type transmission electrode. In an implementation, to manufacture a top-emission light-emitting device, the transmission electrode may be formed of indium tin oxide (ITO) or indium zinc oxide (IZO).

When a phosphorescent dopant is used in the EML, a HBL may be formed between the HTL and the EML or between the H-functional layer and the EML by using vacuum deposition, spin coating, casting, Langmuir-Blodgett (LB) deposition, or the like, in order to help prevent diffusion of triplet excitons or holes into the ETL. When the HBL is formed using vacuum deposition or spin coating, the conditions for deposition and coating may be similar to those for the formation of the HIL, although the conditions for deposition and coating may vary depending on the material that is used to form the HBL. A suitable hole-blocking material may be used. Examples of hole-blocking materials may include oxadiazole derivatives, triazole derivatives, and phenanthroline derivatives. For example, bathocuproine (BCP) represented by the following formula may be used as a material for forming the HBL.

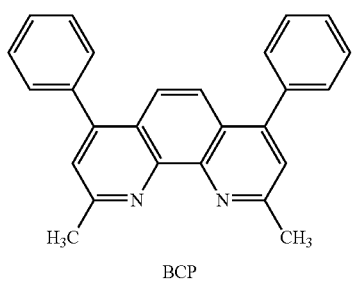 [SMILES: Cc1cc(-c2ccccc2)c2ccc3c(-c4ccccc4)cc(C)nc3c2n1 ; "BCP"]

BCP

The thickness of the HBL may be from about 20 Å to about 1,000 Å, e.g., about 30 Å to about 300 Å. When the thickness of the HBL is within these ranges, the HBL may have improved hole blocking ability without a substantial increase in driving voltage.

According to an embodiment, the organic light-emitting device may be included in various types of flat panel display devices, e.g., in a passive matrix organic light-emitting display device or in an active matrix organic light-emitting display device. For example, when the organic light-emitting device is included in an active matrix organic light-emitting display device including a thin-film transistor, the first electrode on the substrate may function as a pixel electrode, electrically connected to a source electrode or a drain electrode of the thin-film transistor. Moreover, the organic light-emitting device may also be included in flat panel display devices having double-sided screens.

In an implementation, the organic layer of the organic light-emitting device may be formed of the compound of Formula 1 by using a deposition method or may be formed using a wet method of coating a solution of the compound of Formula 1.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES

Synthesis Example 1

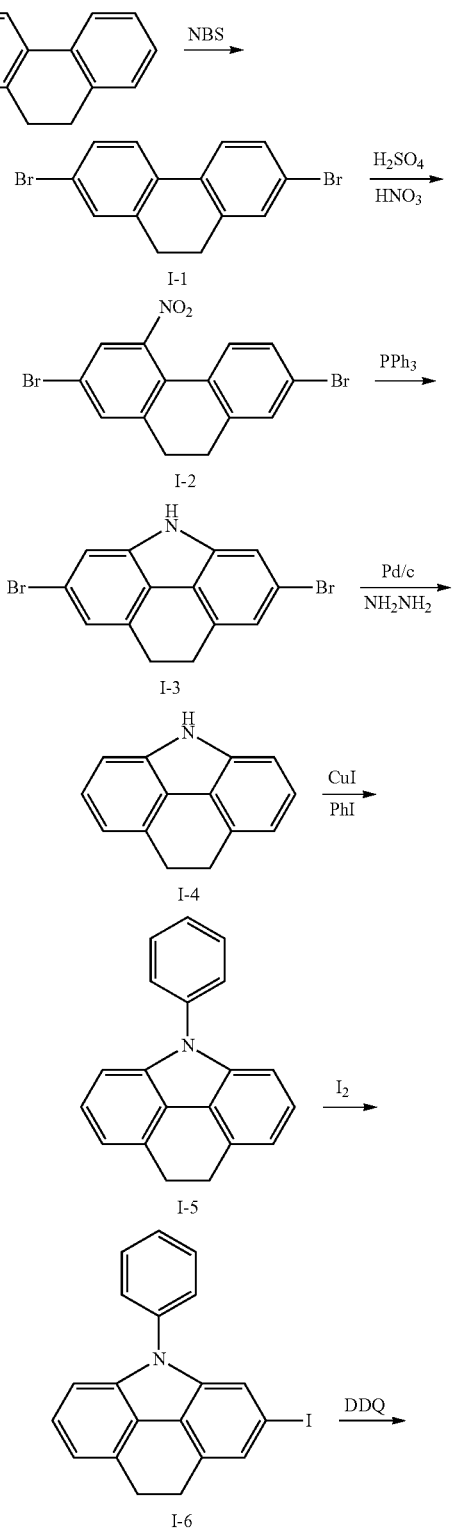

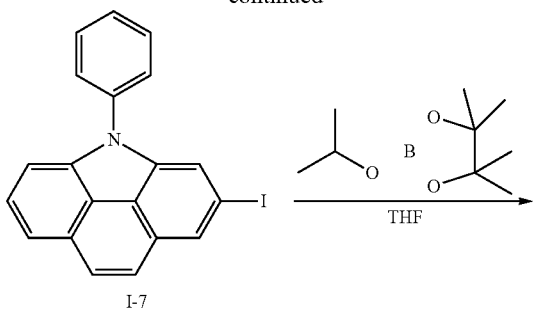

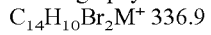

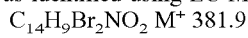

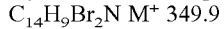

Synthesis of Intermediate I-1

10.0 g (55.4 mmol) of 9,10-dihydrophenanthrene, 21.8 g (121.0 mmol) of N-bromosuccinimide, and 0.5 g (2.7 mmol) of p-TsOH were dissolved in 30 mL of acetonitrile, and then stirred at about 50° C. for about 12 hours. The reaction solution was cooled down to room temperature, and stirred for about 30 minutes to precipitate crystals. The crystals were collected through a vacuum filter, and washed with methanol to obtain 8.4 g of Intermediate I-1 as gray crystals (Yield: 45%). This compound was identified using liquid chromatography-mass spectroscopy (LC-MS).

$C_{14}H_{10}Br_2 M^+$ 336.9

Synthesis of Intermediate I-2

After 5.0 g (15.0 mmol) of Intermediate I-1 was completely dissolved in 50 mL of dichloromethane, 1.7 g (30.0 mmol) of nitric acid was added, and 1.5 g (15.0 mmol) of sulfuric acid was slowly added dropwise thereto to obtain a solution, which was then stirred at about 30° C. for about 6 hours. After completion of the reaction, the reaction solution was cooled down to room temperature, 50 mL of methanol was added thereto and stirred for about 2 hours to precipitate crystals. The crystals were collected through vacuum filtration, and washed with methanol to obtain 5.2 g of Intermediate I-2 as yellow crystals (Yield: 90%). This compound was identified using LC-MS.

$C_{14}H_9Br_2NO_2 \ M^+$ 381.9

Synthesis of Intermediate I-3

After 4.6 g (12.0 mmol) of Intermediate I-2 was dissolved in 30 mL of o-dichlorobenzene and heated until completely dissolved, 4.7 g (18.0 mmol) of triphenylphosphine was added thereto and stirred at about 180° C. for about 3 hours. After the reaction solution was cooled down to room temperature, the solvent was removed by evaporation to obtain a residue, which was then separated and purified using silica gel column chromatography, and washed with methanol to obtain 2.9 g of Intermediate I-3 (Yield: 70%) as white crystals. This compound was identified using LC-MS.

$C_{14}H_9Br_2N \ M^+$ 349.9

Synthesis of Intermediate I-4

After 10 g (28.5 mmol) of Intermediate I-3 and 0.03 g (0.28 mmol) of Pd/C (10%) were dissolved in 100 mL of ethanol at room temperature, the temperature was increased to 50° C., and 5.48 g (171 mmol) of hydrazine was dropwise added thereto and stirred for about 24 hours. The reaction solution was cooled down to room temperature, and washed with acetone, followed by adding 100 mL of ice water to obtain 3.63 g of Intermediate I-4 as white crystals (Yield: 66%). This compound was identified using LC-MS.

$C_{14}H_{11}N M+$ 194.1

Synthesis of Intermediate I-5

1.93 g (10.0 mmol) of Intermediate 1-4, 2.5 g (12.0 mmol) of iodobenzene, 0.2 g (1.0 mmol) of 1,10-phenanthroline, 0.2 g (2.0 mmol) of CuI, and 4.1 g (30.0 mmol) of $K_2CO_3$ were dissolved in 30 mL of N,N-dimethylformamide (DMF) to obtain a solution, which was then stirred at about 80° C. for about 24 hours. The reaction solution was cooled down to room temperature, followed by extraction three times with 30 mL of water and 40 mL of diethyl ether. An organic layer was collected and was dried using magnesium sulfate to evaporate or remove solvent. The residue was separated and purified using silica gel column chromatography to obtain 2.39 g of Intermediate I-5 (Yield: 89%). This compound was identified using LC-MS. $C_{20}H_{15}N$ $M^+$ 270.1

Synthesis of Intermediate I-6

After 10 g (37.1 mmol) of Intermediate I-5 was completely dissolved in 100 mL of dichloromethane, 3.58 g (14.1 mmol) of iodine and 2.38 g (11.13 mmol) of $KIO_3$ were added as five parts. After being stirred for about 6 hours, the reaction solution was washed with methanol to obtain 8.06 g of Intermediate I-6 (Yield: 55%). This compound was identified using LC-MS. $C_{20}H_{14}IN$ M+ 396.1

Synthesis of Intermediate I-7

After 10 g (25.3 mmol) of Intermediate I-6 was dissolved in 100 mL of toluene in an oxygen atmosphere, 1.57 g (7.6 mmol) of 2,3-dichloro-5,6-dicyano-1,4-benzoquinone and 0.52 g (7.6 mmol) of $NaNO_2$ were put thereinto at room temperature. After being stirred at about 110° C. for about 6 hours and completion of the reaction, the reaction solution was cooled down to room temperature, and the solvent was evaporated. The residue was separated and purified using silica gel column chromatography to obtain 8.94 g of Intermediate I-7 (Yield: 90%). This compound was identified using LC-MS. $C_{20}H_{12}IN$ M+ 394.0

Synthesis of Intermediate I-8

After 10 g (25.3 mmol) of Intermediate I-7 was dissolved in 30 mL of tetrahydrofuran (THF), 10 mL (25.0 mmol, 2.5 M in hexane) of n-BuLi was slowly added dropwise thereto at about −78° C. to obtain a solution, which was then stirred at the same temperature for about 1 hour. After slowly dropwise adding 9.3 mL (50 mmol) of 2-isoproxy-4,4,5,5,-tetramethyl-1,3,2-dioxaborolane thereto, the reaction solution was stirred at about −78° C. for 1 hour, and then at room temperature for about 24 hours. After completion of the reaction, 50 mL of a 10% HCl aqueous solution and 50 mL of $H_2O$ were added thereto, followed by extraction three times with 80 mL of diethyl ether. An organic layer was collected using magnesium sulfate to evaporate or remove solvent. The residue was separated and purified using silica gel column chromatography to obtain 7.49 g of Intermediate I-8 (Yield: 75%). This compound was identified using LC-MS. $C_{26}H_{23}BNO_2$:M+ 396.2

Synthesis of Compound 4

3.93 g (10 mmol) of Intermediate I-7, 3.95 g (10.0 mmol) of Intermediate I-8, 0.577 g (0.5 mmol) of tetrakis(triphenylphosphine)palladium ($Pd(PPh_3)_4$), and 1.658 g (12 mmol) of $K_2CO_3$ were dissolved in 100 mL of a mixed solution of THF and $H_2O$ (2:1 by volume), and then stirred at about 80° C. for about 5 hours. The reaction solution was cooled down to room temperature, followed by adding 40 mL of water and extracting three times with 50 mL of diethyl ether. An organic layer was collected and was dried using magnesium sulfate to evaporate or remove solvent. The residue was separated and purified using silica gel column chromatography to obtain 4.2 g of Compound 4 (Yield: 79%).

This compound was identified using mass spectroscopy/fast atom bombardment (MS/FAB) and $^1$H nuclear magnetic resonance (NMR). $C_{40}H_{24}N_2$ cal. 532.19. found 533.19

$^1$H NMR (CDCl$_3$, 400 MHz) ∥δ=∥8.43 (m, 2H), 8.28-8.25 (m, 2H), 8.11 (m, 1H), 8.09 (m, 1H), 7.87-7.84 (m, 4H), 7.79-7.75 (m, 6H), 7.70-7.65 (m, 6H), 7.62-7.61 (d, 1H), 7.60 (d, 1H)

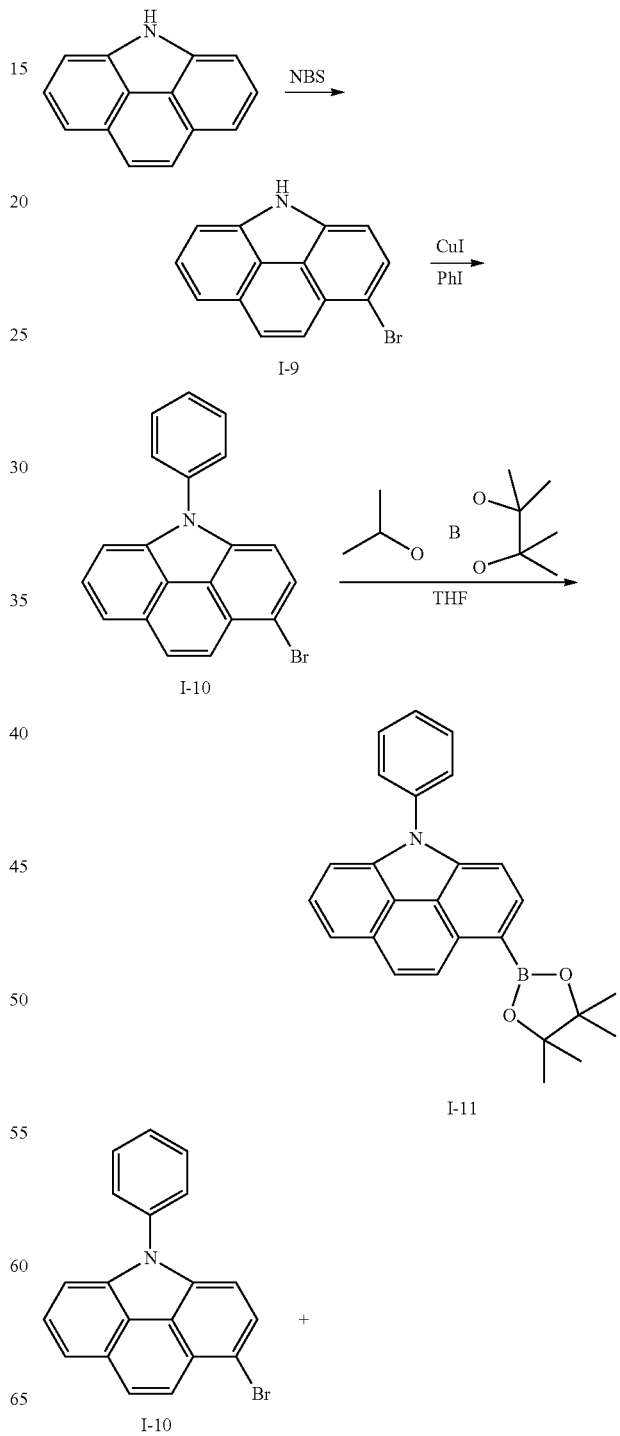

-continued

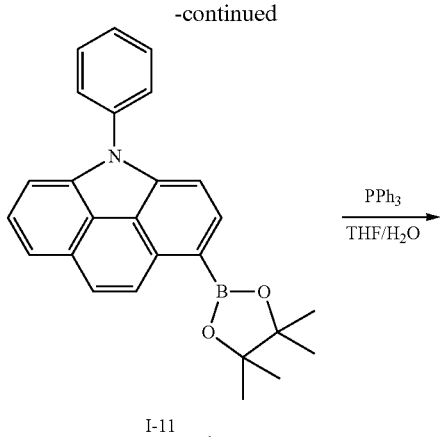

I-10 was used instead of Intermediate I-7. This compound was identified using LC-MS. $C_{26}H_{24}BNO_2$:M+ 394.2

Synthesis of Compound 19

3.83 g of Compound 19 (Yield: 72%) was obtained in the same manner as in the synthesis of Compound 4, except that Intermediate I-10 and Intermediate I-11 were used instead of Intermediate I-7 and Intermediate I-8, respectively. This compound was identified using MS/FAB and $^1$H NMR. $C_{40}H_{24}N_2$ cal. 532.19. found 533.19

$^1$H NMR (CDCl$_3$, 400 MHz) ‖‖‖δ=8.03-8.00 (ss, 2H), 7.90-7.88 (m, 2H), 7.76-7.73 (ss, 2H), 7.71-7.62 (m, 12H), 7.55-7.50 (m, 3H), 7.48 (s, 1H), 7.47-7.44 (dd, 2H)

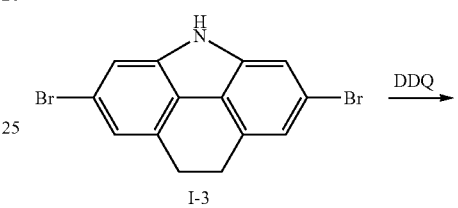

I-3

Synthesis of Intermediate I-9

After 1.91 g (10.0 mmol) of 6H-benzo[def]carbazole was completely dissolved in 60 mL of carbon tetrachloride (CCl$_4$), 1.78 g (10.0 mmol) of N-bromosuccinimide was added thereto and stirred at about 80° C. for about 30 minutes. After being cooled down to room temperature, the reaction solution was stirred for about 30 minutes to precipitate crystals. The crystals were collected through filtration under reduced pressure, and washed with methanol to obtain 1.1 g of Intermediate I-9 as white crystals (Yield: 45%). This compound was identified using LC-MS. $C_{14}H_8BrN$:M+ 245.9

Synthesis of Intermediate I-10

Intermediate I-10 was synthesized in the same manner as in the synthesis of Intermediate I-5, except that Intermediate I-9 was used instead of Intermediate I-4. This compound was identified using LC-MS. $C_{20}H_{12}BrN$:M+ 346.0

Synthesis of Intermediate I-11

Intermediate I-11 was synthesized in the same manner as in the synthesis of Intermediate I-8, except that Intermediate

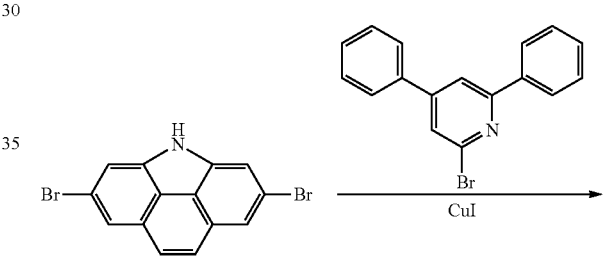

I-12

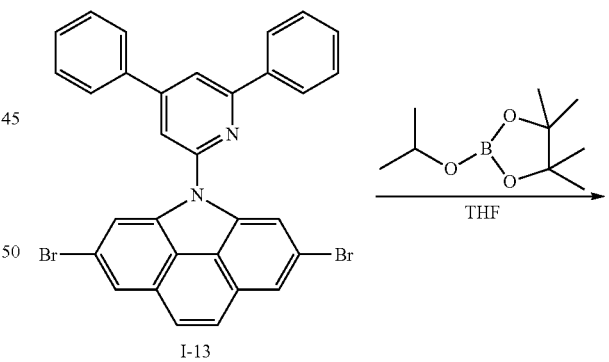

I-13

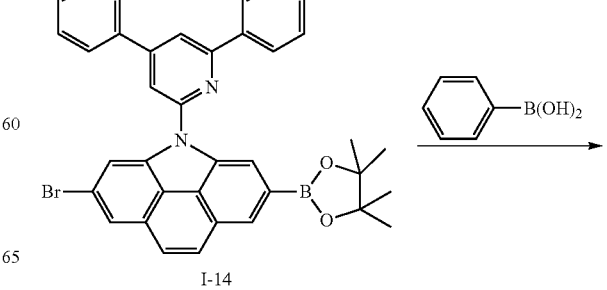

I-14

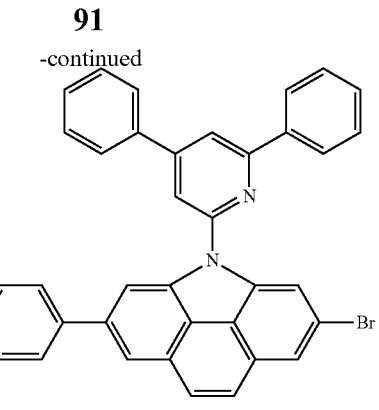

I-15

Synthesis of Intermediate I-12

Intermediate I-12 was synthesized in the same manner as in the synthesis of Intermediate I-7, except that Intermediate I-3 was used instead of Intermediate I-6. This compound was identified using LC-MS. $C_{14}H_7Br_2N:M^+$ 397.8

Synthesis of Intermediate I-13

Intermediate I-13 was synthesized in the same manner as in the synthesis of Intermediate I-5, except that Intermediate I-12 and 2-bromo-4,6-diphenylpyridine were used instead of Intermediate I-4 and iodobenzene, respectively. This compound was identified using LC-MS. $C_{31}H_{18}Br_2N_2:M^+$ 576.9

Synthesis of Intermediate I-14

Intermediate I-14 was synthesized in the same manner as in the synthesis of Intermediate I-8, except that Intermediate I-13 was used instead of Intermediate I-7. This compound was identified using LC-MS. $C_{37}H_{30}BBrN_2O_2:M^+$ 625.1

Synthesis of Intermediate I-15

Intermediate I-15 was synthesized in the same manner as in the synthesis of Compound 4, except that Intermediate I-14 and phenylboronic acid were used instead of Intermediate I-7 and Intermediate I-8, respectively. This compound was identified using LC-MS. $C_{37}H_{23}BrN_2:M^+$ 575.1

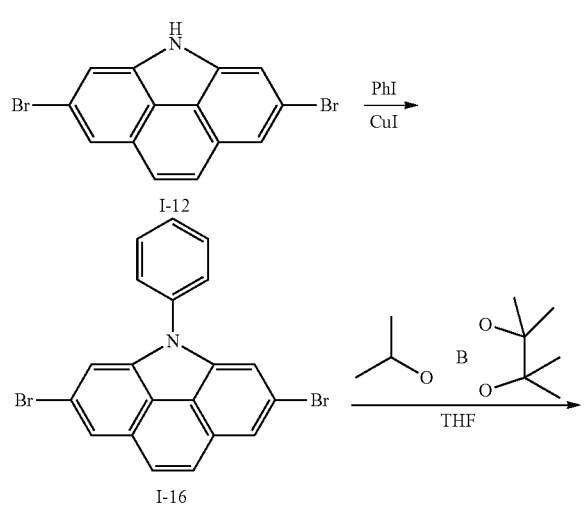

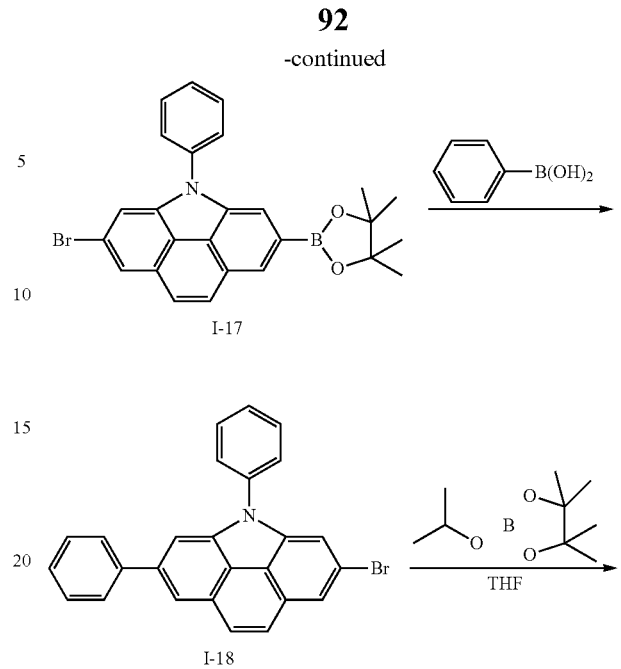

Synthesis of Intermediate I-16

Intermediate I-16 was synthesized in the same manner as in the synthesis of Intermediate I-5, except that Intermediate I-12 was used instead of Intermediate I-4. This compound was identified using LC-MS. $C_{20}H_{11}Br_2N:M^+$ 423.9

Synthesis of Intermediate I-17

Intermediate I-17 was synthesized in the same manner as in the synthesis of Intermediate I-8, except that Intermediate I-16 was used instead of Intermediate I-7. This compound was identified using LC-MS. $C_{26}H_{23}BBrNO_2:M^+$ 472.1

Synthesis of Intermediate I-18

Intermediate I-18 was synthesized in the same manner as in the synthesis of Intermediate I-15, except that Intermediate I-17 was used instead of Intermediate I-14. This compound was identified using LC-MS. $C_{26}H_{16}BrN:M^+$ 422.0

Synthesis of Intermediate I-19

Intermediate I-19 was synthesized in the same manner as in the synthesis of Intermediate I-8, except that Intermediate I-18 was used instead of Intermediate I-7. This compound was identified using LC-MS. $C_{32}H_{28}BNO_2:M^+$ 470.2

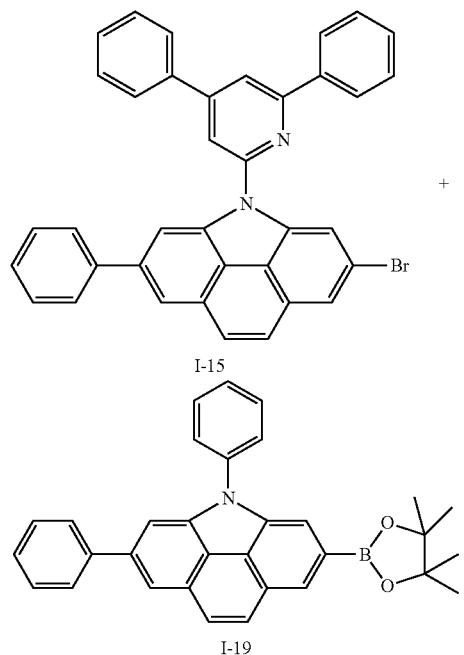

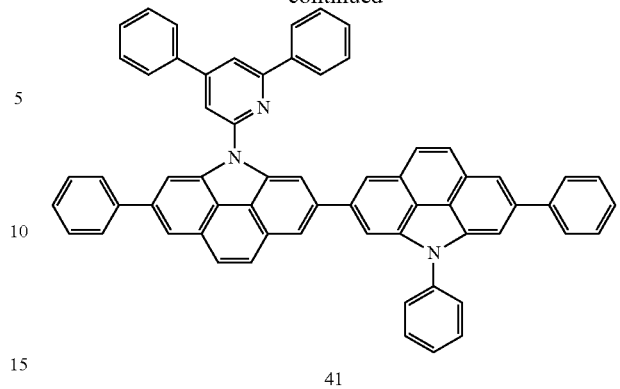

Synthesis of Compound 41

5.86 g of Compound 41 (Yield: 77%) was synthesized in the same manner as in the synthesis of Compound 4, except that Intermediate I-15 and Intermediate I-19 were used instead of Intermediate I-7 and Intermediate I-8, respectively. This compound was identified using MS/FAB and $^1$H NMR. $C_{63}H_{39}N_3$ cal. 837.31. found 838.31

$^1$H NMR (CDCl$_3$, 400 MHz) ‖δ=‖8.42 (d, 1H), 8.36 (d, 1H), 8.23-8.20 (m, 2H), 8.17-8.14 (dd, 2H), 8.02-7.99 (m, 4H), 7.95-7.92 (m, 2H), 7.83-7.81 (m, 2H), 7.77-7.50 (m, 24H), 7.44 (d, 1H)

Additional compounds were synthesized using appropriate intermediate compounds (for example, a material with a corresponding Br substituent, a material with a corresponding B(OH)$_2$ substituent, or the like) according to the same synthetic pathways and the same method as described above. Analysis data of these compounds by $^1$H NMR and MS/FAB are shown in Table 1 below.

TABLE 1

| Compound | $^1$H NMR (CDCl$_3$, 400 MHz) | MS/FAB found | MS/FAB calc. |
|---|---|---|---|
| 4 | δ = 8.43 (m, 2H), 8.28-8.25 (m, 2H), 8.11 (m, 1H), 8.09 (m, 1H), 7.87-7.84 (m, 4H), 7.79-7.75 (m, 6H), 7.70-7.65 (m, 6H), 7.62-7.61 (d, 1H), 7.60 (d, 1H) | 533.19 | 532.19 |
| 5 | δ = 8.44 (m, 2H), 8.20-8.18 (m, 2H), 8.06-8.03 (m, 2H), 8.00-7.98 (m, 2H), 7.89-7.84 (m, 4H), 7.78-7.76 (m, 2H), 7.70-7.67 (m, 4H), 7.65-7.63 (ss, 2H), 7.57-7.55 (ss, 4H), 7.47-7.45 (m, 1H), 7.40-7.38 (dd, 3H) | 633.23 | 632.23 |
| 6 | δ = 8.43 (m, 2H), 8.26-8.24 (ss, 2H), 8.15-8.13 (m, 2H), 8.08-8.06 (m, 2H), 7.97-7.89 (m, 6H), 7.83-7.82 (m, 1H), 7.80-7.78 (ss, 2H), 7.76-7.71 (m, 6H), 7.69 (m, 1H), 7.65-7.64 (d, 2H), 7.61-7.60 (dd, 2H) | 633.55 | 632.23 |
| 7 | δ = 8.43 (m, 2H), 8.28-8.22 (m, 6H), 8.01-7.99 (m, 4H), 7.94-7.88 (m, 6H), 7.82-7.79 (m, 6H), 7.75-7.71 (m, 6H), 7.63-7.59 (m, 2H) | 685.26 | 684.26 |
| 9 | δ = 8.44 (m, 2H), 8.36-8.23 (m, 12H), 7.99-7.97 (m, 4H), 7.92-7.90 (ss, 2H), 7.87-7.86 (d, 2H), 7.69-7.63 (m, 4H), 7.59-7.55 (m, 2H), 7.48-7.46 (ss, 2H), 7.39-7.35 (dd, 2H) | 781.26 | 780.26 |
| 11 | δ = 8.43 (m, 2H), 8.27-8.25 (dd, 2H), 8.18-8.15 (m, 2H), 8.08-8.06 (ss, 2H), 8.01-7.99 (m, 2H), 7.92-7.87 (m, 2H), 7.69-7.58 (m, 10H), 7.51-7.49 (m, 2H), 7.43-7.40 (m, 4H) 1.64 (s, 12H) | 765.32 | 764.32 |
| 12 | δ = 8.43 (m, 2H), 8.20-8.16 (m, 10H), 7.91-7.89 (m, 2H), 7.85-7.78 (m, 16H), 7.74-7.70 (m, 6H), 7.63-7.62 (m, 4H) | 837.32 | 836.32 |
| 13 | δ = 8.79-8.74 (m, 2H), 8.43 (d, 2H), 8.38-8.37 (m, 2H), 8.17-8.14 (m, 4H), 7.98-7.96 (dd, 2H), 7.88 (d, 2H), 7.85-7.79 (dd, 2H), 7.72-7.68 (m, 2H), 7.58-7.51 (m, 8H) | 733.26 | 732.26 |
| 14 | δ = 8.43 (m, 2H), 8.37-8.31 (m, 2H), 8.17-8.16 (m, 2H), 7.97-7.95 (m, 2H), 7.81-7.79 (m, 2H), 7.74-7.67 (m, 10H), 7.59-7.46 (m, 16H), 7.32-7.30 (dd, 2H) | 863.31 | 862.31 |
| 18 | δ = 7.88-7.86 (ss, 2H), 7.77-7.71 (m, 4H), 7.61-7.52 (m, 6H), 7.42-7.40 (ss, 2H), 7.87 (s, 18H) | 493.26 | 492.26 |

TABLE 1-continued

| Compound | $^1$H NMR (CDCl$_3$, 400 MHz) | MS/FAB found | MS/FAB calc. |
|---|---|---|---|
| 19 | δ = 8.03-8.00 (ss, 2H), 7.90-7.88 (m, 2H), 7.76-7.73 (ss, 2H), 7.71-7.62 (m, 12H), 7.55-7.50 (m, 3H), 7.48 (s, 1H), 7.47-7.44 (dd, 2H) | 533.19 | 532.19 |
| 20 | δ = 8.03-8.00 (ss, 2H), 7.90-7.88 (m, 2H), 7.76-7.62 (m, 6H), 7.47-7.40 (m, 8H), 7.28-7.22 (m, 4H) | 569.18 | 568.18 |
| 21 | δ = 8.03-8.00 (ss, 2H), 7.96-7.93 (m, 6H), 7.81-7.71 (m, 4H), 7.69-7.64 (m, 6H), 7.52-7.48 (m, 4H) | 583.18 | 582.18 |
| 23 | δ = 8.12-8.10 (ss. 2H), 8.04-8.02 (m, 2H), 7.95-7.93 (m, 2H), 7.85-7.83 (m, 2H), 7.77-7.71 (m, 5H), 7.68-7.66 (ss, 3H), 7.63-7.50 (m, 8H), 7.44 (s, 1H), 7.42-7.40 (dd, 3H) | 633.23 | 632.23 |
| 24 | δ = 8.03-8.00 (ss, 2H), 7.95-7.93 (m, 2H), 7.84-7.81 (m, 5H), 7.78 (s, 1H), 7.76 (s, 1H), 7.63-7.56 (m, 11H), 7.52-7.45 (m, 6H), 7.42-7.39 (m, 4H) | 685.26 | 684.26 |
| 26 | δ = 8.20-8.18 (ss, 2H), 8.00-7.93 (m, 10H), 7.81-7.68 (m, 20H), 7.64-7.60 (m, 4H), 7.53-7.51 (m, 4H) | 837.35 | 836.32 |
| 30 | δ = 8.12-8.10 (m, 4H), 8.03-8.00 (ss, 2H), 7.90-7.88 (m, 2H), 7.76-7.62 (m, 6H), 7.52-7.40 (m, 20H), 7.32-7.29 (m, 4H) | 863.31 | 862.31 |
| 31 | δ = 8.11-7.98 (m, 14H), 7.85-7.66 (m, 12H), 7.57-7.53 (m, 2H), 7.50-7.48 (dd, 2H), 7.25-7.23 (dd, 2H) | 781.26 | 780.26 |
| 32 | δ = 8.43-8.36 (m, 2H), 8.25-8.22 (m, 2H), 7.97-7.89 (m, 4H), 8.83 (d, 1H), 8.81-8.61 (m, 18H), 7.57-7.53 (m, 3H), 7.49-7.46 (m, 1H) | 686.25 | 685.25 |
| 34 | δ = 8.77-8.75 (m, 4H), 8.65 (m, 1H), 8.55 (m, 1H), 8.44-8.39 (m, 1H), 8.08 (d, 1H), 8.03-7.57 (m, 20H), 7.54-7.52 (dd, 1H) | 688.24 | 687.24 |
| 36 | δ = 8.43-8.42 (m, 1H), 8.33 (m, 1H), 8.29-8.26 (m, 4H), 8.23-8.21 (dd, 1H), 8.05 (m, 1H), 8.02-7.97 (m, 5H), 7.91-7.74 (m, 4H), 7.71-7.57 (m, 12H), 7.52-7.45 (m, 8H), 7.42-7.40 (m, 1H) | 839.31 | 838.31 |
| 38 | δ = 8.43 (m, 1H), 8.37-8.32 (m, 2H), 8.08-8.05 (m, 2H), 7.92-7.91 (m, 1H), 7.80-7.72 (m, 4H), 7.66-7.44 (m, 19H), 7.38-7.26 (m, 8H), 7.12-7.10 (dd, 1H) | 851.31 | 850.31 |
| 40 | δ = 8.77-8.75 (m, 4H), 8.58 (d, 1H), 8.51-8.47 (m, 2H), 8.19-8.17 (dd, 1H), 8.02-8.01 (d, 1H), 7.96 (d, 1H), 7.91-7.69 (m, 9H), 7.62-7.57 (m, 6H), 7.52-7.36 (m, 10H), 7.22-7.19 (dd, 1H) | 853.31 | 852.30 |
| 41 | δ = 8.42 (d, 1H), 8.36 (d, 1H), 8.23-8.20 (m, 2H), 8.17-8.14 (dd, 2H), 8.02-7.99 (m, 4H), 7.95-7.92 (m, 2H), 7.83-7.81 (m, 2H), 7.77-7.50 (m, 24H), 7.44 (d, 1H) | 838.31 | 837.31 |
| 42 | δ = 8.42-8.41 (m, 1H), 8.33-8.32 (m, 1H), 8.27-8.24 (m, 4H), 8.14-8.12 (m, 2H), 8.03 (s, 1H), 7.98-7.94 (m, 6H), 7.83-7.59 (m, 14H), 7.55-7.45 (m, 6H), 7.41-7.37 (m, 3H) | 839.31 | 838.31 |
| 45 | δ = 8.08-8.00 (m, 4H), 7.92 (s, 1H), 7.90-7.88 (m, 2H), 7.85-7.80 (m, 3H), 7.76-7.53 (m, 18H), 7.50-7.45 (m, 2H), 7.43-7.39 (m, 1H) | 686.25 | 685.25 |
| 48 | δ = 8.17-8.14 (m, 2H), 8.06-8.00 (m, 2H), 7.95-7.90 (m, 7H), 7.88-7.87 (d, 1H), 7.85-7.80 (m, 3H), 7.75-7.68 (m, 9H), 7.65-7.57 (m, 10H), 7.52-7.40 (m, 5H) | 838.31 | 837.31 |
| 49 | δ = 8.29-8.19 (m, 5H), 8.16-8.14 (ss, 1H), 8.03-8.00 (ss, 1H), 7.95 (d, 1H), 7.92-7.89 (m, 6H), 7.85-7.78 (m, 4 H), 7.72-7.68 (m, 5H), 7.65-7.57 (m, 10H), 7.52-7.39 (m, 5H) | 839.31 | 838.31 |
| 51 | δ = 8.37-8.32 (m, 1H), 8.12-8.03 (m, 4H), 7.92-7.91 (m, 1H), 7.82-7.70 (m, 6H), 7.66-7.44 (m, 18H), 7.41-7.26 (m, 7H), 7.21-7.18 (dd, 1H) | 851.31 | 850.31 |
| 52 | δ = 8.37-8.31 (m, 1H), 8.27-8.10 (m, 7H), 7.95-7.89 (m, 4H), 7.75-7.68 (m, 4H), 7.56-7.46 (m, 11H), 7.41-7.27 (m, 9H), 7.21-7.19 (dd, 1H) | 852.30 | 851.30 |
| 53 | δ = 8.78-8.17 (m, 4H), 8.52-8.46 (m, 1H), 8.36-8.25 (m, 3H), 8.15-8.13 (ss, 1H), 8.07-8.04 (m, 2H), 7.90-7.76 (m, 8H), 7.73-7.62 (m, 7H), 7.57-7.41 (m, 9H), 7.36-7.33 (dd, 1H) | 853.30 | 852.30 |
| 57 | δ = 8.54-8.52 (ss, 1H), 8.41-8.34 (m, 6H), 8.27-8.25 (ss, 1H), 8.08 (s, 1H), 7.93-7.84 (m, 4H), 7.73-7.42 (m, 17H) | 687.25 | 686.25 |

TABLE 1-continued

| Compound | $^1$H NMR (CDCl$_3$, 400 MHz) | MS/FAB found | calc. |
|---|---|---|---|
| 59 | δ = 8.54-8.52 (ss, 1H), 8.42-8.34 (m, 6H), 8.27-8.25 (ss, 1H), 8.15-8.13 (m, 1H), 8.08 (s, 1H), 8.01-7.99 (m, 1H), 7.94-7.92 (m, 1H), 7.90-7.80 (m, 5H), 7.73-7.60 (m, 10H), 7.52-7.40 (m, 4H), 7.35-7.33 (dd, 1H) | 737.26 | 736.26 |
| 62 | δ = 8.53-8.50 (m, 2H), 8.39-8.36 (m, 4H), 8.31 (m, 1H), 8.08-8.05 (m, 2H), 7.88-7.82 (m, 3H), 7.68-7.55 (m, 14H), 7.49-7.45 (m, 3H), 7.42-7.37 (m, 5H) | 763.28 | 762.28 |
| 64 | δ = 8.80-8.78 (m, 4H), 8.65-8.61 (m, 2H), 8.41 (m, 1H), 8.18-8.15 (ss, 1H), 7.97-7.93 (m, 3H), 7.83-7.73 (m, 9H), 7.69-7.55 (m, 10H), 7.53-7.49 (m, 3H) | 764.27 | 763.27 |
| 66 | δ = 8.78-8.75 (m, 4H), 8.54-8.52 (ss, 1H), 8.41-8.36 (m, 2H), 8.32-8.30 (ss, 1H), 8.02-8.00 (ss, 1H), 7.97-7.95 (m, 1H), 7.93-7.81 (m, 8H), 7.77-7.68 (m, 7H), 7.62-7.58 (m, 4H), 7.55-7.49 (m, 4H) | 764.27 | 763.27 |
| 67 | δ = 8.54-8.52 (ss, 1H), 8.31-8.31 (m, 1H), 8.27-8.19 (m, 6H), 8.12-8.10 (ss, 1H), 7.93 (s, 2H), 7.78-7.69 (m, 4H), 7.57-7.48 (m, 11H), 7.38-7.27 (m, 10H), 7.12-7.10 (dd, 1H) | 852.30 | 851.30 |
| 68 | δ = 8.77-8.75 (m, 4H), 8.54-8.52 (ss, 1H), 8.37-8.31 (m, 1H), 8.21-8.16 (m, 2H), 8.12-8.10 (ss, 1H), 8.02-8.01 (d, 1H), 7.92-7.90 (ss, 1H), 7.87-7.74 (m, 7H), 7.67-7.36 (m, 17H), 7.22-7.20 (dd, 1H) | 853.30 | 852.30 |

Example 1

To manufacture an anode, a substrate with deposited ITO/Ag/ITO layers (70/1,000/70 Å) was cut to a size of 50 mm×50 mm×0.5 mm and then sonicated in isopropyl alcohol and pure water each for five minutes, and then cleaned by irradiation of ultraviolet rays for 30 minutes and exposure to ozone. The resulting glass substrate was loaded into a vacuum deposition device.

Then, 2-TNATA, which is a HIL material, was vacuum-deposited on the glass substrate to form a HIL having a thickness of about 600 Å. Then, 4,4'-bis[N-(1-naphthyl)-N-phenylamino]biphenyl (NPB), which is a hole transporting compound, was vacuum-deposited on the HIL to form a HTL having a thickness of about 1,000 Å.

Then, Compound 4 as a green phosphorescent host and Ir(ppy)$_3$ as a dopant were co-deposited in a weight ratio of 91:9 on the HTL to form an EML having a thickness of about 250 Å. Then, BCP as a hole blocking compound was vacuum-deposited on the EML to form a HBL having a thickness of about 50 Å. Then, Alq$_3$ was deposited on the EML to form an ETL having a thickness of 350 Å, and then LiF, which is a halogenated alkali metal, was deposited on the ETL to form an EIL having a thickness of 10 Å. Then, Mg and Ag were vacuum-deposited in a weight ratio of 90:10 on the EIL to form an electrode having a thickness of 120 Å, thereby completing the manufacture of an organic light-emitting device.

The organic light-emitting device had a driving voltage of about 5.5V at a current density of about 10 mA/cm$^2$, a luminance of about 5,112 cd/m$^2$, an emission efficiency of about 51.1 cd/A, and a half-life span (hr 100 mA/cm$^2$) of about 58 hours.

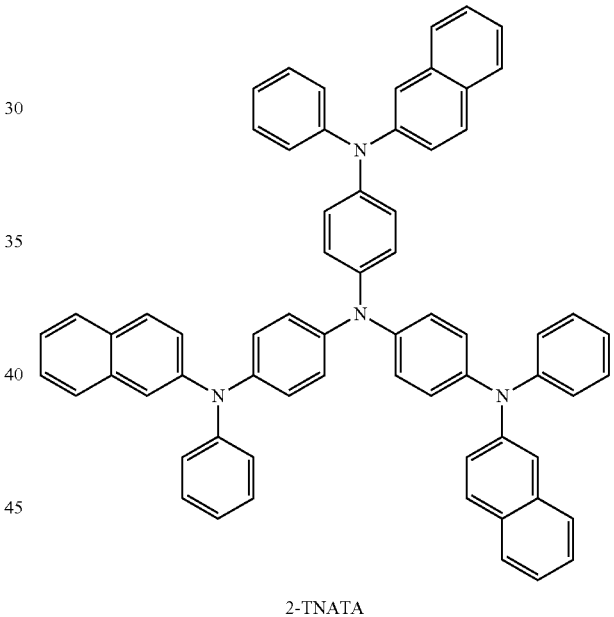

2-TNATA

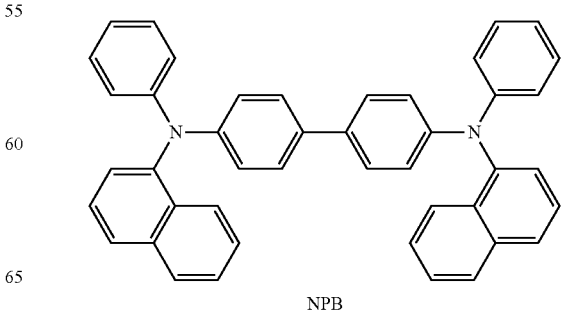

NPB

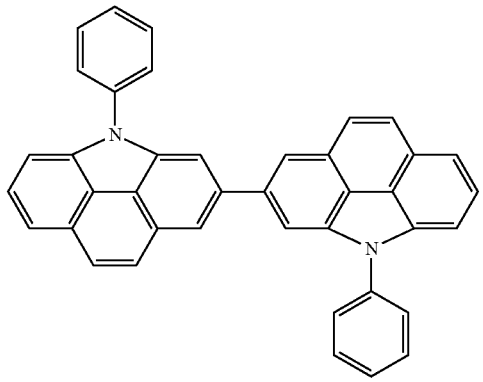

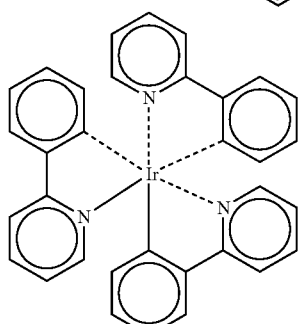

Ir(ppy)₃

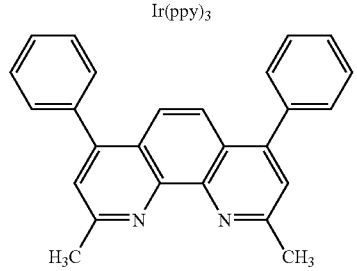

BCP

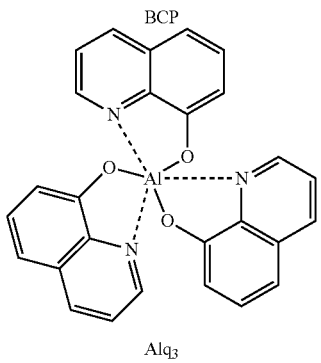

Alq₃

Example 2

An organic light-emitting device was manufactured in the same manner as in Example 1, except that Compound 12 was used instead of Compound 4 to form the EML.

The organic light-emitting device had a driving voltage of about 5.5 V at a current density of about 10 mA/cm², a luminance of about 5,323 cd/m², an emission efficiency of about 53.2 cd/A, and a half-life span (hr 100 mA/cm²) of about 62 hours.

Example 3

An organic light-emitting device was manufactured in the same manner as in Example 1, except that Compound 18 was used instead of Compound 4 to form the EML.

The organic light-emitting device had a driving voltage of about 5.3 V at a current density of about 10 mA/cm², a luminance of about 5,020 cd/m², an emission efficiency of about 50.2 cd/A, and a half-life span (hr 100 mA/cm²) of about 52 hours.

Example 4

An organic light-emitting device was manufactured in the same manner as in Example 1, except that Compound 24 was used instead of Compound 4 to form the EML.

The organic light-emitting device had a driving voltage of about 5.4V at a current density of about 10 mA/cm², a luminance of about 5,454 cd/m², an emission efficiency of about 54.5 cd/A, and a half-life span (hr 100 mA/cm²) of about 72 hours.

Example 5

An organic light-emitting device was manufactured in the same manner as in Example 1, except that 4,4'-bis[N-(1-naphthyl)-N-phenylamino]biphenyl (NPB) as a HTL material was vacuum-deposited to form a HTL having a thickness of about 1,350 Å, and Compound 30 as a red phosphorescent host and BtpIr (bis(2-(2'-benzo[4,5-a]thienyl)pyridinato-N, C3') iridium acetylacetonate as a known dopant were co-deposited on the HTL in a weight ratio of about 94:6 to form an EML having a thickness of 400 Å.

The organic light-emitting device had a driving voltage of about 5.8 V at a current density of about 10 mA/cm², a luminance of about 2,642 cd/m², an emission efficiency of about 26.4 cd/A, and a half-life span (hr 100 mA/cm²) of about 94 hours.

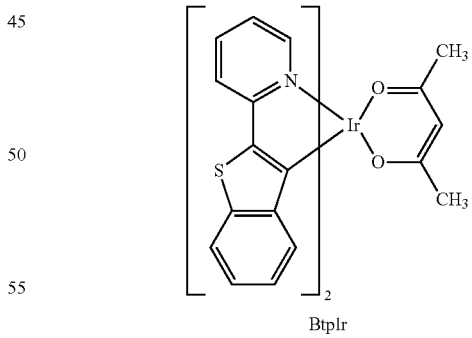

BtpIr

Example 6

An organic light-emitting device was manufactured in the same manner as in Example 5, except that Compound 36 was used instead of Compound 30 to form the EML.

The organic light-emitting device had a driving voltage of about 5.7V at a current density of about 10 mA/cm², a

Example 7

An organic light-emitting device was manufactured in the same manner as in Example 5, except that Compound 53 was used instead of Compound 30 to form the EML.

The organic light-emitting device had a driving voltage of about 5.6V at a current density of about 10 mA/cm², a luminance of about 2,930 cd/m², an emission efficiency of about 29.3 cd/A, and a half-life span (hr 100 mA/cm²) of about 102 hours.

Example 8

An organic light-emitting device was manufactured in the same manner as in Example 1, except that Compound 56 was used instead of Alq₃ to form the ETL.

The organic light-emitting device had a driving voltage of about 5.1V at a current density of about 10 mA/cm², a luminance of about 5,725 cd/m², an emission efficiency of about 57.3 cd/A, and a half-life span (hr 100 mA/cm²) of about 83 hours.

Example 9

An organic light-emitting device was manufactured in the same manner as in Example 8, except that Compound 62 was used instead of Compound 56 to form the ETL.

The organic light-emitting device had a driving voltage of about 5.3V at a current density of about 10 mA/cm², a luminance of about 5,912 cd/m², an emission efficiency of about 59.1 cd/A, and a half-life span (hr 100 mA/cm²) of about 95 hours.

Comparative Example 1

An organic light-emitting device was manufactured in the same manner as in Example 1, except that, as the green phosphorescent host, 4,4'-N,N'-dicarbazolbiphenyl (CBP), instead of Compound 4, was used to form the EML.

The organic light-emitting device had a driving voltage of about 6.5V at a current density of about 10 mA/cm², a luminance of about 3,210 cd/m², an emission efficiency of about 32.1 cd/A, and a half-life span (hr 100 mA/cm²) of about 32 hours.

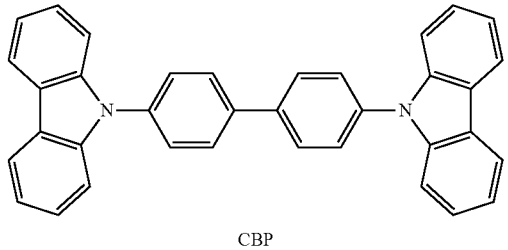 [SMILES: c1ccc2c(c1)c1ccccc1n2-c1ccc(-c2ccc(-n3c4ccccc4c4ccccc43)cc2)cc1 ; "CBP"]

CBP

Comparative Example 2

An organic light-emitting device was manufactured in the same manner as in Example 5, except that, as a red phosphorescent host, 4,4'-N,N'-dicarbazolbiphenyl (CBP), instead of Compound 30, was used to form the EML.

The organic light-emitting device had a driving voltage of about 6.8V at a current density of about 10 mA/cm², a luminance of about 1,643 cd/m², an emission efficiency of about 16.4 cd/A, and a half-life span (hr 100 mA/cm²) of about 45 hours.

The organic light-emitting devices manufactured using the heterocyclic compounds represented by Formula 1, above, as green or red phosphorescent hosts in the EML or as ETL materials had markedly lower driving voltages and improved I-V-L characteristics with a higher efficiency, compared to those manufactured using CBP. For example, the organic light-emitting devices manufactured using the heterocyclic compounds represented by Formula 1, above, had markedly improved lifetimes. Main characteristics and lifetime characteristics of the organic light-emitting devices of Examples 1 to 9 and Comparative Examples 1 and 2 are shown in Table 2, below.

TABLE 2

| Example | Host or ETL material | Driving voltage (V) | Current density (mA/cm²) | Luminance (cd/m²) | Efficiency (cd/A) | Emission color | Lifetime LT97 (hr) |
|---|---|---|---|---|---|---|---|
| Example 1 | Compound 4 | 5.5 | 10 | 5,112 | 51.1 | Green | 58 hr |
| Example 2 | Compound 12 | 5.5 | 10 | 5,323 | 53.2 | Green | 62 hr |
| Example 3 | Compound 18 | 5.3 | 10 | 5,020 | 50.2 | Green | 52 hr |
| Example 4 | Compound 24 | 5.4 | 10 | 5,454 | 54.5 | Green | 71 hr |
| Example 5 | Compound 30 | 5.8 | 10 | 2,642 | 26.4 | Red | 94 hr |
| Example 6 | Compound 36 | 5.7 | 10 | 2,561 | 25.6 | Red | 86 hr |
| Example 7 | Compound 53 | 5.6 | 10 | 2,930 | 29.3 | Red | 102 hr |
| Example 8 | Compound 56 | 5.1 | 10 | 5,725 | 57.3 | Green | 83 hr |
| Example 9 | Compound 62 | 5.3 | 10 | 5,912 | 59.1 | Green | 95 hr |
| Comparative Example 1 | CBP | 6.5 | 10 | 3,210 | 32.1 | Green | 32 hr |
| Comparative Example 2 | CBP | 6.8 | 10 | 1,643 | 16.4 | Red | 45 hr |

As described above, according to an embodiment, a heterocyclic compound represented by Formula 1 above may have good charge transporting capability, and thus may be used as an EML material or an electron transport material for fluorescent or phosphorescent devices of any color of red, green, blue, and white. An organic light-emitting device with high-efficiency, low-driving voltage, high luminance and long lifetime may be manufactured using the heterocyclic compound of Formula 1.

By way of summation and review, an OLED may have a structure including a substrate, and an anode, a hole transport layer (HTL), an emission layer (EML), an electron transport layer (ETL), and a cathode which are sequentially stacked on the substrate. In this regard, the HTL, the EML, and the ETL may be organic thin films formed of organic compounds.

An operating principle of an OLED having the above-described structure may be as follows.

When a voltage is applied between the anode and the cathode, holes injected from the anode may move to the EML via the HTL, and electrons injected from the cathode may move to the EML via the ETL. The holes and electrons may recombine in the EML to generate excitons. When the excitons drop from an excited state to a ground state, light may be emitted.

The embodiments may provide a material having improved electrical stability, high charge-transport or emission capability, and a high glass transition temperature that is high enough to prevent crystallization.

The embodiments may provide a heterocyclic compound that is suitable as an electron emission layer material or an electron transport material for fluorescent or phosphorescent devices of any color of red, green, blue, or white, and an organic light-emitting device including the heterocyclic compound, and having high efficiency, low voltage, high luminance, and long lifetime.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A heterocyclic compound represented by Formula 1, below:

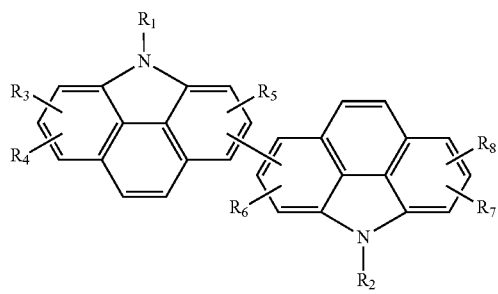

<Formula 1> wherein, in Formula 1, $R_1$ to $R_8$ are each independently a hydrogen atom, a deuterium atom, a substituted or unsubstituted C1-C60 alkyl group, a substituted or unsubstituted C3-C60 cycloalkyl group, a substituted or unsubstituted C2-C60 heteroaryl group, a substituted or unsubstituted C6-C60 aryl group, or a substituted or unsubstituted C6-C60 condensed polycyclic group.

2. The heterocyclic compound as claimed in claim 1, wherein $R_1$ and $R_2$ in Formula 1 are each independently a substituted or unsubstituted C1-C20 alkyl group, or a group represented by one of Formulae 2a to 2e, below:

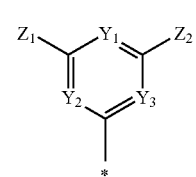

2a

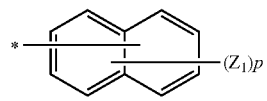

2b

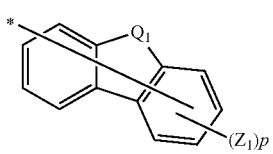

2c

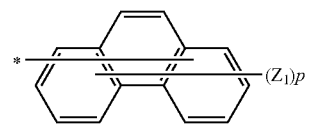

2d

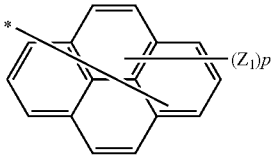

2e wherein, in Formulae 2a to 2e, $Y_1$, $Y_2$, and $Y_3$ are each independently CH or N;

$Q_1$ is a linker represented by —$CR_{50}R_{51}$— or —$NR_{52}$—;

$Z_1$, $Z_2$, $R_{50}$, $R_{51}$, and $R_{52}$ are each independently a hydrogen atom, a deuterium atom, a substituted or unsubstituted C1-C20 alkyl group, a substituted or unsubstituted C6-C20 aryl group, a substituted or unsubstituted C3-C20 heteroaryl group, a substituted or unsubstituted C6-C20 condensed polycyclic group, an amino group substituted with a C6-C20 aryl group or a C3-C20 heteroaryl group, a halogen group, a cyano group, a nitro group, a hydroxy group, or a carboxyl group; and \* indicates a binding site;

wherein, in Formulae 2b and 2c, p is an integer of 1 to 7; and wherein, in Formulae 2d and 2e, p is an integer of 1 to 9.

3. The heterocyclic compound as claimed in claim 1, wherein $R_3$, $R_4$, $R_7$, and $R_8$ in Formula 1 are each independently a hydrogen atom, a deuterium atom, or

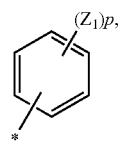

wherein:

Z$_1$ is a hydrogen atom, a deuterium atom, a substituted or unsubstituted C1-C20 alkyl group, a substituted or unsubstituted C6-C20 aryl group, a substituted or unsubstituted C3-C20 heteroaryl group, a substituted or unsubstituted C6-C20 condensed polycyclic group, an amino group substituted with a C6-C20 aryl group or a C3-C20 heteroaryl group, a halogen group, a cyano group, a nitro group, a hydroxy group, or a carboxyl group;

p is an integer from 1 to 5; and

* indicates a binding site.

4. The heterocyclic compound as claimed in claim 1, wherein R$_5$ and R$_6$ in Formula 1 are each independently a hydrogen atom or a deuterium atom.

5. The heterocyclic compound as claimed in claim 1, wherein R$_3$, R$_4$, R$_5$, R$_6$, R$_7$, and R$_8$ in Formula 1 are each independently a hydrogen atom or a deuterium atom.

6. The heterocyclic compound as claimed in claim 1, wherein the heterocyclic compound represented by Formula 1 is one of the following compounds:

4

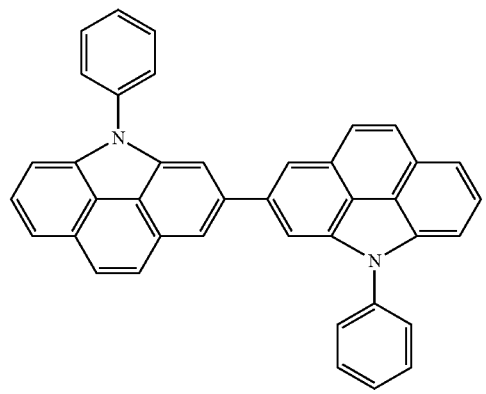

12

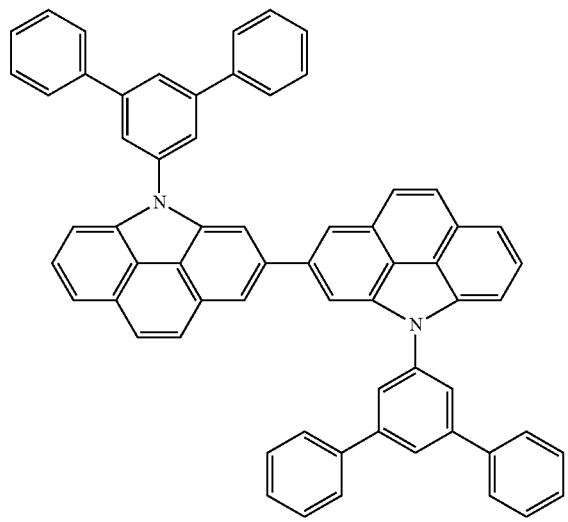

18

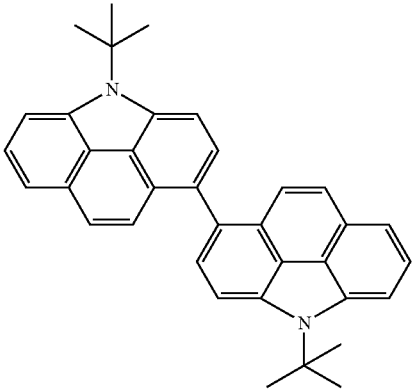

24

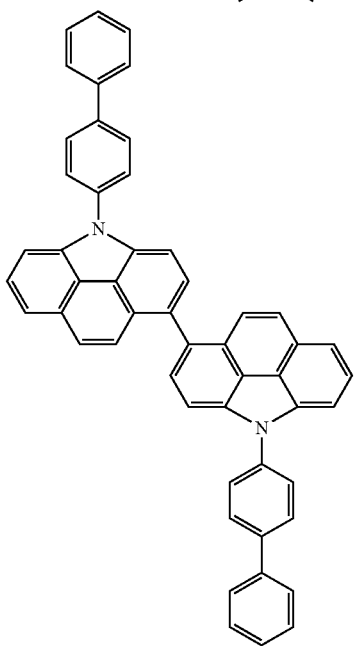

30

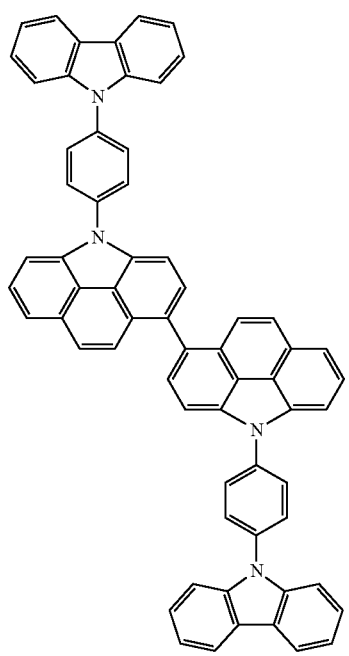

107

-continued

36

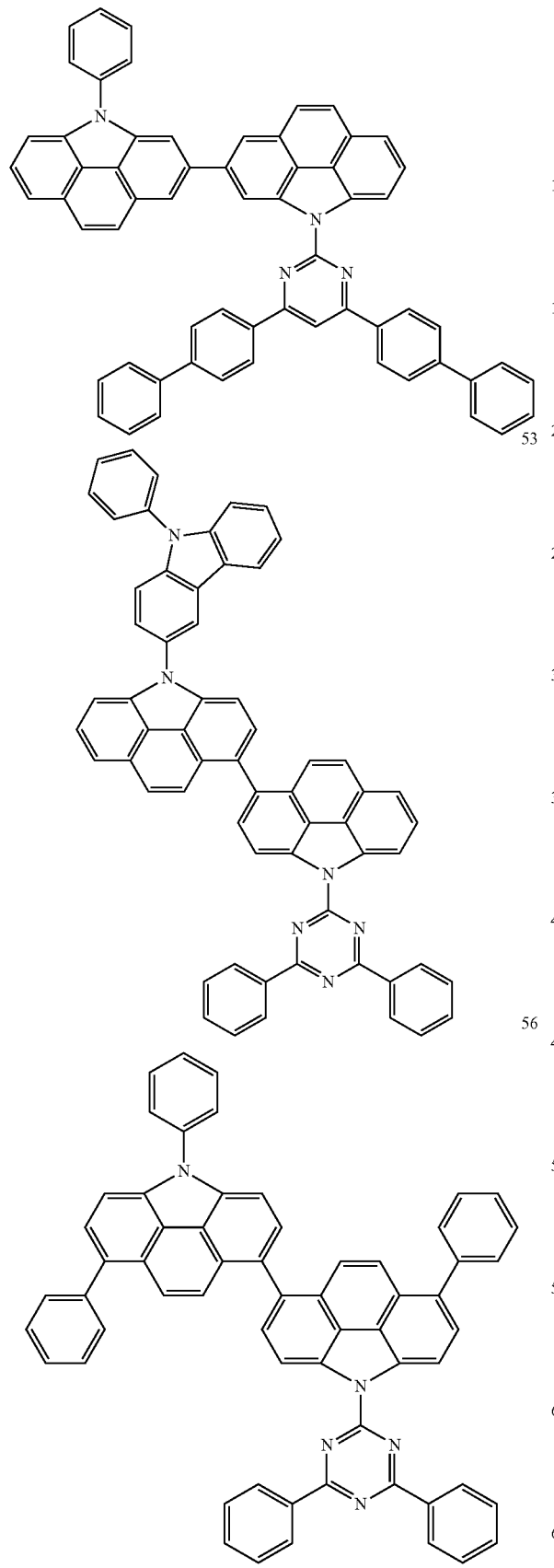

53

56

108

-continued

62

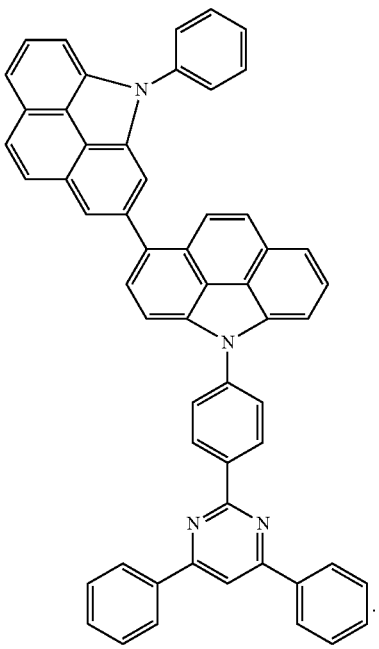

7. An organic light-emitting device, comprising:
a first electrode;
a second electrode; and
an organic layer between the first electrode and the second electrode,
wherein the organic layer includes the heterocyclic compound as claimed in claim 1.

8. The organic light-emitting device as claimed in claim 7, wherein the organic layer is an emission layer or an electron transport layer.

9. The organic light-emitting device as claimed in claim 7, wherein:
the organic layer includes an emission layer, and further includes at least one of an electron injection layer, an electron transport layer, a functional layer having both electron injection and transport capabilities, a hole injection layer, a hole transport layer, or a functional layer having both hole injection and transport capabilities, and
the emission layer includes an anthracene-based compound, an arylamine-based compound, or a styryl-based compound.

10. The organic light-emitting device as claimed in claim 7, wherein:
the organic layer includes an emission layer, and further includes at least one of an electron injection layer, an electron transport layer, a functional layer having both electron injection and transport capabilities, a hole injection layer, a hole transport layer, or a functional layer having both hole injection and transport capabilities, and
the emission layer includes red, green, blue, and white emission layers, one of which includes a phosphorescent compound.

11. The organic light-emitting device as claimed in claim 10, wherein:
the organic layer includes at least one of the hole injection layer, the hole transport layer, and the functional layer having both hole injection and hole transport capabilities, and the at least one of the hole injection layer, the hole transport layer, and the functional layer having both hole injection and hole transport capabilities includes a charge-generating material.

12. The organic light-emitting device as claimed in claim 11, wherein the charge-generating material is a p-type dopant.

13. The organic light-emitting device as claimed in claim 12, wherein the p-type dopant is a quinone derivative.

14. The organic light-emitting device as claimed in claim 12, wherein the p-type dopant is a metal oxide.

15. The organic light-emitting device as claimed in claim 12, wherein the p-type dopant is a cyano group-containing compound.

16. The organic light-emitting device as claimed in claim 7, wherein the organic layer includes an electron transport layer, the electron transport layer further including a metal-containing material.

17. The organic light-emitting device as claimed in claim 16, wherein the metal-containing material is a Li complex.

18. The organic light-emitting device as claimed in claim 16, wherein the metal-containing material includes one of lithium quinolate (LiQ) or Compound 203 below:

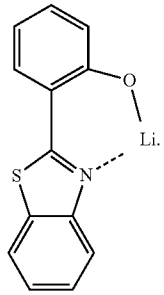

Compound 203

19. The organic light-emitting device as claimed in claim 7, wherein the organic layer is formed of the heterocyclic compound by a wet process.

20. A flat panel display device comprising the organic light-emitting device as claimed in claim 7, wherein the first electrode of the organic light-emitting device is electrically connected to a source electrode or a drain electrode of a thin-film transistor.

* * * * *